United States Patent
Nozaki

(10) Patent No.: US 12,473,403 B2
(45) Date of Patent: Nov. 18, 2025

(54) CURABLE RESIN COMPOSITION, CURED FILM, LAMINATE, METHOD FOR MANUFACTURING CURED FILM, SEMICONDUCTOR DEVICE, AND POLYMER PRECURSOR

(71) Applicant: FUJIFILM Corporation, Tokyo (JP)

(72) Inventor: Atsuyasu Nozaki, Shizuoka (JP)

(73) Assignee: FUJIFILM Corporation, Tokyo (JP)

( * ) Notice: Subject to any disclaimer, the term of this patent is extended or adjusted under 35 U.S.C. 154(b) by 781 days.

(21) Appl. No.: 17/472,706

(22) Filed: Sep. 13, 2021

(65) Prior Publication Data

US 2022/0002488 A1   Jan. 6, 2022

Related U.S. Application Data

(63) Continuation of application No. PCT/JP2020/009923, filed on Mar. 9, 2020.

(30) Foreign Application Priority Data

Mar. 15, 2019 (JP) .................. 2019-048627

(51) Int. Cl.
| | | |
|---|---|---|
| *C08G 73/10* | (2006.01) | |
| *C08G 73/22* | (2006.01) | |
| *G03F 7/028* | (2006.01) | |
| *G03F 7/20* | (2006.01) | |

(52) U.S. Cl.
CPC .............. *C08G 73/10* (2013.01); *C08G 73/22* (2013.01); *G03F 7/028* (2013.01); *G03F 7/20* (2013.01)

(58) Field of Classification Search
CPC ............ G03F 7/028; G03F 7/20; C08G 73/10
See application file for complete search history.

(56) References Cited

U.S. PATENT DOCUMENTS

| | | |
|---|---|---|
| 4,019,972 A | 4/1977 | Faust |
| 4,038,257 A | 7/1977 | Suzuki et al. |
| 4,250,248 A | 2/1981 | Faust |
| 4,322,491 A | 3/1982 | Sander et al. |
| 4,327,170 A | 4/1982 | Sander et al. |
| 4,387,139 A | 6/1983 | Herwig et al. |
| 4,399,239 A | 8/1983 | Herwig et al. |
| 4,458,007 A | 7/1984 | Geissler et al. |
| 4,977,066 A | 12/1990 | Gersdorf et al. |
| 4,983,498 A | 1/1991 | Rode et al. |
| 5,085,974 A | 2/1992 | Frass et al. |
| 5,085,975 A | 2/1992 | Mueller |
| 5,326,643 A | 7/1994 | Adamopoulos et al. |
| 5,569,739 A | 10/1996 | Adamopoulos et al. |
| 5,582,858 A | 12/1996 | Adamopoulos et al. |
| 5,599,582 A | 2/1997 | Adamopoulos et al. |
| 6,022,906 A | 2/2000 | Ohwa et al. |
| 6,287,893 B1 | 9/2001 | Elenius et al. |
| 6,310,135 B1 | 10/2001 | Tanaka et al. |
| 6,441,487 B2 | 8/2002 | Elenius et al. |
| 6,596,445 B1 | 7/2003 | Matsumoto et al. |
| 6,734,248 B2 | 5/2004 | Tanaka et al. |
| 6,750,135 B2 | 6/2004 | Elenius et al. |
| 6,949,678 B2 | 9/2005 | Kunimoto et al. |
| 7,148,382 B2 | 12/2006 | Wolf et al. |
| 7,189,489 B2 | 3/2007 | Kunimoto et al. |
| 7,381,842 B2 | 6/2008 | Kunimoto et al. |
| 8,197,994 B2 | 6/2012 | Mizukawa et al. |
| 8,698,133 B2 | 4/2014 | Tanaka |
| 8,779,159 B2 | 7/2014 | Mizukawa et al. |
| 8,883,391 B2 | 11/2014 | Miyabe et al. |
| 9,159,547 B2 | 10/2015 | Rogers et al. |
| 10,725,379 B2 | 7/2020 | Ono et al. |
| 2002/0035196 A1 | 3/2002 | Tanaka et al. |
| 2007/0126030 A1 | 6/2007 | Ito |
| 2007/0154820 A1 | 7/2007 | Kang et al. |
| 2012/0138877 A1 | 6/2012 | Mizukawa et al. |
| 2015/0329735 A1 | 11/2015 | Nakamura et al. |
| 2017/0010529 A1 | 1/2017 | Aoyagi |
| 2017/0101521 A1 | 4/2017 | Koyama |

FOREIGN PATENT DOCUMENTS

| | | |
|---|---|---|
| CN | 102893206 | 1/2013 |
| CN | 103797410 | 5/2014 |
| EP | 2625166 | 8/2013 |
| EP | 3392292 | 10/2018 |
| GB | 1256859 | 12/1971 |

(Continued)

OTHER PUBLICATIONS

English Translation of WO 2013/141376 A1; Amemiya Takuma; Published Sep. 26, 2013 (Year: 2013).*
English Translation of JPH10260531A; Sakamoto Kei; Published: Sep. 29, 1998 (Year: 1998).*
English translation of JP 2013-015701 A; Matsuya Noritaka; Published: Jan. 24, 2013 (Year: 2013).*
"International Search Report (Form PCT/ISA/210) of PCT/JP2020/009923," mailed on May 26, 2020, with English translation thereof, pp. 1-7.
"Written Opinion of the International Searching Authority (Form PCT/ISA/237)" of PCT/JP2020/009923, mailed on May 26, 2020, with English translation thereof, pp. 1-12.

(Continued)

*Primary Examiner* — Mark F. Huff
*Assistant Examiner* — Richard David Champion
(74) *Attorney, Agent, or Firm* — JCIPRNET

(57) ABSTRACT

There are provided a curable resin composition containing at least one polymer precursor selected from the group consisting of a polyimide precursor and a polybenzoxazole precursor, where the polymer precursor has a heterocyclic ring structure containing two or more nitrogen atoms and an acid value of the polymer precursor is 1 mmol/g or less, a cured film that is obtained by curing the curable resin composition, a laminate that includes the cured film, a method for manufacturing the cured film, and a semiconductor device including the cured film or the laminate, and a novel polymer precursor.

13 Claims, No Drawings

(56) References Cited

FOREIGN PATENT DOCUMENTS

| | | |
|---|---|---|
| GB | 1379228 | 1/1975 |
| JP | S4643946 | 12/1971 |
| JP | S4864183 | 9/1973 |
| JP | S4841708 | 12/1973 |
| JP | S4943191 | 11/1974 |
| JP | S506034 | 3/1975 |
| JP | S5137193 | 3/1976 |
| JP | S5230490 | 8/1977 |
| JP | S5617654 | 4/1981 |
| JP | S5849860 | 11/1983 |
| JP | S6122048 | 1/1986 |
| JP | S6239417 | 8/1987 |
| JP | S6239418 | 8/1987 |
| JP | S63260909 | 10/1988 |
| JP | S63277653 | 11/1988 |
| JP | H01105238 | 4/1989 |
| JP | H0140336 | 8/1989 |
| JP | H0140337 | 8/1989 |
| JP | H0225493 | 1/1990 |
| JP | H0216765 | 4/1990 |
| JP | H0232293 | 7/1990 |
| JP | H02186350 | 7/1990 |
| JP | H0485363 | 3/1992 |
| JP | H06106678 | 4/1994 |
| JP | H08286374 | 11/1996 |
| JP | H1062986 | 3/1998 |
| JP | H10260531 | 9/1998 |
| JP | H10260531 A * | 9/1998 | ............. G03F 7/038 |
| JP | H10291969 | 11/1998 |
| JP | H11130858 | 5/1999 |
| JP | 2000080068 | 3/2000 |
| JP | 2001233842 | 8/2001 |
| JP | 2001521288 | 11/2001 |
| JP | 2004101850 | 4/2004 |
| JP | 2004115813 | 4/2004 |
| JP | 2004214501 | 7/2004 |
| JP | 2005049503 | 2/2005 |
| JP | 2006023696 | 1/2006 |
| JP | 2006047592 | 2/2006 |
| JP | 2006342166 | 12/2006 |
| JP | 2007157879 | 6/2007 |
| JP | 2007269779 | 10/2007 |
| JP | 2008063554 | 3/2008 |
| JP | 2008292970 | 12/2008 |
| JP | 4225898 | 2/2009 |
| JP | 2009191061 | 8/2009 |
| JP | 2009191179 | 8/2009 |
| JP | 4364216 | 11/2009 |
| JP | 2009283711 | 12/2009 |
| JP | 2010129825 | 6/2010 |
| JP | 2010160418 | 7/2010 |
| JP | 2010262028 | 11/2010 |
| JP | 2011059656 | 3/2011 |
| JP | 2011128358 | 6/2011 |
| JP | 2012014052 | 1/2012 |
| JP | 2012194520 | 10/2012 |
| JP | 2013015701 | 1/2013 |
| JP | 2013015701 A * | 1/2013 |
| JP | 2013072935 | 4/2013 |
| JP | 2013164471 | 8/2013 |
| JP | 2014500852 | 1/2014 |
| JP | 2014041264 | 3/2014 |
| JP | 2014186186 | 10/2014 |
| JP | 2014191002 | 10/2014 |
| JP | 2014191252 | 10/2014 |
| JP | 2015034964 | 2/2015 |
| JP | 2015087611 | 5/2015 |
| JP | 2015123351 | 7/2015 |
| JP | 2015127817 | 7/2015 |
| JP | 2015187211 | 10/2015 |
| JP | 2016027357 | 2/2016 |
| WO | 2011080992 | 7/2011 |
| WO | 2011115077 | 9/2011 |
| WO | 2013015407 | 1/2013 |
| WO | WO-2013141376 A1 * | 9/2013 | ............. G03F 7/40 |
| WO | 2014097594 | 6/2014 |
| WO | 2015125469 | 8/2015 |
| WO | 2015199219 | 12/2015 |
| WO | 2017104672 | 6/2017 |
| WO | 2019112855 | 6/2019 |

OTHER PUBLICATIONS

M. Bruma et al., "Polyimides with oxadiazole rings and thin films based on them," Semiconductor Conference 2008 IEEE, Oct. 2008, pp. 263-266.

Pradip Kumar Tapaswi et al., "Synthesis and Characterization of Fully Aliphatic Polyimides from an Aliphatic Dianhydride with Piperazine Spacer for Enhanced Solubility, Transparency, and Low Dielectric Constant," Journal of Polymer Science Part A Polymer Chemistry, vol. 52, May 2014, pp. 2316-2328.

"Search Report of Europe Counterpart Application", issued on Apr. 21, 2022, p. 1-p. 7.

"Office Action of Japan Counterpart Application" with English translation thereof, issued on Jul. 12, 2022, p. 1-p. 12.

"Office Action of Philippines Counterpart Application", issued on Apr. 5, 2023, p. 1-p. 5.

Office Action of China Counterpart Application, with English translation thereof, issued on Aug. 5, 2023, pp. 1-6.

Office Action of Korea Counterpart Application, with English translation thereof, issued on Jul. 31, 2023, pp. 1-13.

"Office Action of Taiwan Counterpart Application", issued on Dec. 26, 2023, with partial English translation thereof, pp. 1-44.

"Office Action of China Counterpart Application", issued on Feb. 3, 2023, with English translation thereof, p. 1-p. 13.

"Rejection Decision of China Counterpart Application", issued on Jan. 27, 2024, with English translation thereof, p. 1-p. 12.

"Office Action of Europe Counterpart Application", issued on Jul. 2, 2024, p. 1-p. 6.

* cited by examiner

CURABLE RESIN COMPOSITION, CURED FILM, LAMINATE, METHOD FOR MANUFACTURING CURED FILM, SEMICONDUCTOR DEVICE, AND POLYMER PRECURSOR

CROSS-REFERENCE TO RELATED APPLICATIONS

This application is a Continuation of PCT International Application No. PCT/JP2020/009923 filed on Mar. 9, 2020, which claims priority under 35 U.S.C § 119(a) to Japanese Patent Application No. 2019-048627 filed on Mar. 15, 2019. Each of the above application(s) is hereby expressly incorporated by reference, in its entirety, into the present application.

BACKGROUND OF THE INVENTION

1. Field of the Invention

The present invention relates to a curable resin composition, a cured film, a laminate, a method for manufacturing a cured film, a semiconductor device, and a polymer precursor.

2. Description of the Related Art

A resin obtained by cyclizing and curing a precursor of a polymer such as a polyimide resin or a polybenzoxazole resin (hereinafter, the polyimide resin precursor and the polybenzoxazole resin precursor are also collectively referred to as a "heterocyclic ring-containing polymer precursor") is applied to various use applications since such a resin is excellent in heat resistance and insulation properties. The above use applications are not particularly limited, and examples thereof in a semiconductor device for mounting include the use as a material for an insulating film or a sealing material, or as a protective film. In addition, such a resin can also be used as a base film or a cover lay for a flexible substrate.

For example, in the use applications described above, the heterocyclic ring-containing polymer precursor is used in the form of a curable resin composition containing the heterocyclic ring-containing polymer precursor. Such a curable resin composition is applied onto a base material by coating or the like, and then the heterocyclic ring-containing polymer precursor is cyclized by heating or the like, whereby a cured resin can be formed on the base material. Since the curable resin composition can be applied by a known coating method or the like, it can be said that the curable resin composition is excellent in the manufacturing adaptability, for example, a high degree of freedom in designing the shape, size, application position of the curable resin composition to be applied. From the viewpoint of the excellent manufacturing adaptability described above in addition to the high performance of the polyimide resin and the like, the industrial application spreading of a curable resin composition containing a heterocyclic ring-containing polymer precursor is expected increasingly.

For example, JP2004-115813A discloses a polyimide precursor composition that contains a polyamic acid that has a repeating unit having a specific structure and a low-temperature curing accelerator that accelerates the curing of the polyamic acid at a low temperature (however, those containing an acid anhydride are included), in which the low-temperature curing accelerator is a substituted or unsubstituted nitrogen-containing heterocyclic ring compound (AC1) of which a proton complex in an aqueous solution has an acid dissociation constant pKa of 0 to 8, where the nitrogen-containing heterocyclic ring compound is at least one selected from the group consisting of a nitrogen-containing compound selected from the group consisting of imidazole, pyrazole, triazole, tetrazole, benzimidazole, naphthoimidazole, indazole, benzotriazole, purine, imidazoline, pyrazoline, pyridine, quinoline, isoquinoline, dipyridyl, diquinolyl, pyridazine, pyrimidine, pyrazine, phthalazine, quinoxaline, quinazoline, cinnoline, naphthyridine, acridine, phenanthridine, benzoquinoline, benzoisoquinoline, benzocinnoline, benzophthalazine, benzoquinoxaline, benzoquinazoline, phenanthroline, phenazine, carboline, perimidine, triazine, tetrazine, pteridine, oxazole, benzoxazole, isooxazole, benzoisoxazole, thiazole, benzothiazole, isothiazole, benzoisothiazole, oxadiazole, thiadiazole, pyrroldione, isoindoledione, pyrrolidinedione, benzoisoquinolinedione, triethylenediamine, and hexamethylenetetramine, which are substituted or unsubstituted, and an N-oxide compound thereof.

SUMMARY OF THE INVENTION

In a curable resin composition containing a heterocyclic ring-containing polymer precursor such as a polyimide precursor, it is desired to provide a curable resin composition with which a cured product excellent in metal adhesiveness can be obtained.

An aspect of the present invention aims to provide a curable resin composition with which a cured film excellent in metal adhesiveness can be obtained, a cured film that is obtained by curing the curable resin composition, a laminate that includes the cured film, a method for manufacturing the cured film, and a semiconductor device including the cured film or the laminate.

In addition, another aspect of the present invention aims to provide a novel polymer precursor.

Hereinafter, examples of the representative aspect of the present invention will be described.

<1> A curable resin composition comprising at least one polymer precursor selected from the group consisting of a polyimide precursor and a polybenzoxazole precursor,
in which the polymer precursor has a heterocyclic ring structure containing two or more nitrogen atoms, and
an acid value of the polymer precursor is 1 mmol/g or less.

<2> The curable resin composition according to <1>, in which a content of the heterocyclic ring structure containing two or more nitrogen atoms, which is contained in the polymer precursor, is 0.01 to 1 mmol/g with respect to a total solid content of the composition.

<3> The curable resin composition according to <1> or <2>, in which at least one ring structure selected from the group consisting of a triazole ring structure and a tetrazole ring structure is contained as the heterocyclic ring structure.

<4> The curable resin composition according to any one of <1> to <3>, in which at least one structure selected from the group consisting of a structure represented by Formula (A-1) and a structure represented by Formula (A-2) is contained as the heterocyclic ring structure;

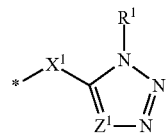

(A-1)

-continued

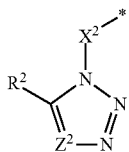

(A-2)

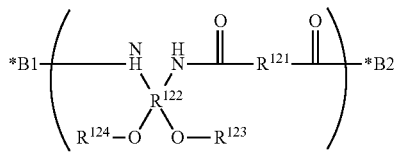

(PB-B1)

in Formula (A-1) and Formula (A-2), $X^1$ and $X^2$ represent a single bond or divalent linking group, $R^1$ represents a hydrogen atom, an amino group, or a hydrocarbon group, $R^2$ represents a hydrogen atom or a hydrocarbon group, $Z^1$ and $Z^2$ represent =$CR^3$— or a nitrogen atom, $R^3$ represents a hydrogen atom, an alkyl group, an aryl group, an amino group, a carboxy group, or a hydroxy group, and * represents a bonding site with another structure in the polymer precursor.

<5> The curable resin composition according to <4>, in which the structure represented by Formula (A-1) or the structure represented by Formula (A-2) is bonded to a repeating unit containing a terminal of the polymer precursor.

<6> The curable resin composition according to any one of <1> to <5>, further comprising a photopolymerization initiator and at least one compound selected from the group consisting of an onium salt and a thermal-base generator.

<7> The curable resin composition according to any one of <1> to <6>, in which the curable resin composition is used for forming an interlayer insulating film for a redistribution layer.

<8> A cured film obtained by curing the curable resin composition according to any one of <1> to <7>.

<9> A laminate comprising two or more layers of the cured films according to <8> and a metal layer between any cured films.

<10> A method for manufacturing a cured film, comprising a film forming step of applying the curable resin composition according to any one of <1> to <7> onto a base material to form a film.

<11> The method for manufacturing a cured film according to <10>, further comprising an exposure step of exposing the film and a development step of developing the film.

<12> The method for manufacturing a cured film according to <10> or <11>, further comprising a heating step of heating the film at 50° to 450° C.

<13> A semiconductor device comprising the cured film according to <8> or the laminate according to <9>.

<14> A polymer precursor that is at least one polymer precursor selected from the group consisting of a polyimide precursor and a polybenzoxazole precursor, the polymer precursor comprising:
a repeating unit represented by Formula (PI-B1) or a repeating unit represented by Formula (PB-B1),
in which an acid value of the polymer precursor is 1 mmol/g or less;

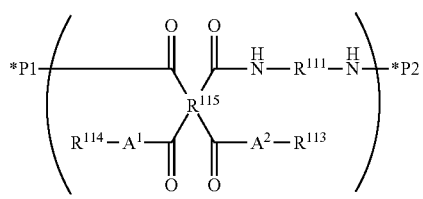

(PI-B1)

in Formulae (PI-B1) or (PB-B1), $A^1$ and $A^2$ each independently represent an oxygen atom or —NH—, $R^{111}$ represents a divalent organic group, $R^{115}$ represents a tetravalent organic group, $R^{113}$ and $R^{114}$ each independently represent a hydrogen atom or a monovalent organic group, and $*^{P1}$ and $*^{P2}$ each independently represent a bonding site to another structure, where at least one of $R^{113}$ or $R^{114}$ has a heterocyclic ring structure containing two or more nitrogen atoms, $*^{P1}$ is bonded to a structure containing a heterocyclic ring structure containing two or more nitrogen atoms, or at least one of $R^{113}$ or $R^{114}$ has a heterocyclic ring structure containing two or more nitrogen atoms and $*^{P1}$ is bonded to a structure containing a heterocyclic ring structure containing two or more nitrogen atoms, and $R^{121}$ represents a divalent organic group, $R^{122}$ represents a tetravalent organic group, $R^{123}$ and $R^{124}$ each independently represent a hydrogen atom or a monovalent organic group, and $*^{B1}$ and $*^{B2}$ each independently represent a bonding site to another structure, where at least one of $R^{124}$ or $R^{123}$ has a heterocyclic ring structure containing two or more nitrogen atoms, $*^{B2}$ is bonded to a structure containing a heterocyclic ring structure containing two or more nitrogen atoms, or at least one of $R^{124}$ or $R^{123}$ has a heterocyclic ring structure containing two or more nitrogen atoms and $*^{B2}$ is bonded to a structure containing a heterocyclic ring structure containing two or more nitrogen atoms.

<15> The curable resin composition according to <14>, in which the structure containing a heterocyclic ring structure containing two or more nitrogen atoms is bonded to a repeating unit containing a terminal of the polymer precursor.

According to an aspect of the present invention, there is provided a curable resin composition with which a cured film excellent in metal adhesiveness can be obtained, a cured film that is obtained by curing the curable resin composition, a laminate that includes the cured film, a method for manufacturing the cured film, and a semiconductor device including the cured film or the laminate.

In addition, according to another aspect of the present invention, there is provided a novel polymer precursor.

DESCRIPTION OF THE PREFERRED EMBODIMENTS

Hereinafter, the main embodiments of the present invention will be described. However, the present invention is not limited to the specified embodiments.

In the present specification, a numerical range described by using "to" means a range including numerical values described before and after the preposition "to" as a lower limit value and an upper limit value, respectively.

In the present specification, the term "step" means not only an independent step but also a step that cannot be clearly distinguished from other steps as long as the desired action of the step can be achieved.

In describing a group (an atomic group) in the present specification, in a case where a description about substitution and non-substitution is not provided, the description means the group includes a group (an atomic group) having a substituent as well as a group (an atomic group) having no substituent. For example, the description "alkyl group" includes not only an alkyl group that does not have a substituent (an unsubstituted alkyl group) but also an alkyl group that has a substituent (a substituted alkyl group).

In the present specification, "exposure" includes not only exposure using light but also exposure using particle beams such as an electron beam and an ion beam, unless otherwise specified. In addition, examples of the light that is used for exposure include an emission line spectrum of a mercury lamp, a far ultraviolet ray represented by an excimer laser, an extreme ultraviolet ray (EUV light), an X-ray, an electron beam, an active ray, and a radioactive ray.

In the present specification, "(meth)acrylate" means one or both of "acrylate" and "methacrylate", "(meth)acryl" means one or both of "acryl" and "methacryl", and "(meth)acryloyl" means one or both of "acryloyl" and "methacryloyl".

In the structural formulae of the present specification, Me represents a methyl group, Et represents an ethyl group, Bu represents a butyl group, and Ph represents a phenyl group.

In the present specification, the total solid content refers to the total mass of components excluding a solvent from the entire components of the composition. In addition, in the present specification, the solid content concentration is a mass percentage of other components excluding a solvent with respect to the total mass of the composition.

In the present specification, weight-average molecular weight (Mw) and number-average molecular weight (Mn) are defined as polystyrene equivalent values according to gel permeation chromatography (GPC) measurement unless otherwise specified. In the present specification, the weight-average molecular weight (Mw) and the number-average molecular weight (Mn) can be determined, for example, by using HLC-8220 GPC (manufactured by Tosoh Corporation) and using, as a column, GUARD COLUMN HZ-L, TSKgel Super HZM-M, TSK gel Super HZ4000, TSK gel Super HZ3000, and TSK gel Super HZ2000 (manufactured by Tosoh Corporation). The measurements of the above molecular weights are carried out using tetrahydrofuran (THF) as an eluent unless otherwise specified. In addition, the detection in GPC measurement is carried out using a detector with an ultraviolet ray (a UV ray) of a wavelength of 254 nm unless otherwise specified.

In the present specification, in a case where the positional relationship of respective layers constituting the laminate is described as "upper" or "lower", another layer may be on the upper side or the lower side of the reference layer among the plurality of layers of interest. That is, a third layer or element may be further interposed between the reference layer and the other layer, and the reference layer and the other layer need not be in contact with each other. In addition, unless otherwise specified, the direction in which the layers are laminated on the base material is referred to as "upward", or in a case where a photosensitive layer is present, the direction from the base material to the photosensitive layer is referred to as "upper". The opposite direction thereof is referred to as "downward". It is noted that such setting of the upward or downward direction is for convenience in the present specification, and in an actual aspect, the "upward" direction in the present specification may be different from the vertically upward direction.

In the present specification, a composition may contain, as each component contained in the composition, two or more compounds corresponding to the component unless otherwise particularly specified. The content of each component in the composition means the total content of all the compounds corresponding to the component unless otherwise particularly specified.

In the present specification, the physical property values are values under the conditions of a temperature of 23° C. and an atmospheric pressure of 101,325 Pa (1 atm), unless otherwise described.

In the present specification, a combination of preferred aspects is a more preferred aspect.

(Curable Resin Composition)

The curable resin composition according to the embodiment of the present invention (hereinafter, also simply referred to as a "composition according to the embodiment of the present invention") contains at least one polymer precursor selected from the group consisting of a polyimide precursor and a polybenzoxazole precursor, the polymer precursor has a heterocyclic ring structure containing two or more nitrogen atoms, and the acid value of the polymer precursor is 1 mmol/g or less.

Hereinafter, the polymer precursor having a heterocyclic ring structure containing two or more nitrogen atoms, where the polymer precursor has an acid value of 1 mmol/g or less, is also referred to as a "specific polymer precursor".

In addition, it is preferable that the curable resin composition according to the embodiment of the present invention further contains a photopolymerization initiator and at least one compound selected from the group consisting of an onium salt and a thermal-base generator.

A cured film that is obtained from the curable resin composition according to the embodiment of the present invention is excellent in metal adhesiveness.

The mechanism with which the above effect is obtained is not clear; however, it is presumed that the interaction between a metal such as copper and a heterocyclic ring structure containing two or more nitrogen atoms improves the adhesiveness between the metal such as copper and the cured film.

In addition, it is conceived that the introduction of a heterocyclic ring structure into the polymer precursor increases the interaction between the polymers and suppresses the permeation of a chemical into the cured film, whereby the chemical resistance of the cured film to be obtained is easily improved.

Further, it is conceived that since the acid value of the polymer precursor is 1 mmol/g or less, the cyclization of the polymer easily proceeds, and thus the chemical resistance is easily improved.

In addition, it is conceived that since the acid value is 1 mmol/g or less, the permeation of an alkali contained in the chemical is suppressed, and thus the chemical resistance is improved.

Further, it is conceived that since the acid value of the polymer precursor is 1 mmol/g or less and the polymer precursor contains a heterocyclic ring structure containing two or more nitrogen atoms, the interaction between polymers is improved, and the permeation of an alkali contained in the chemical is suppressed, whereby the chemical resistance is improved.

Furthermore, it is conceived that a salt is formed by the equilibrium with an acid in the polymer precursor, and the pH in the storage solution stabilized due to the buffer effect, whereby the storage stability of the curable resin composition itself is also easily improved.

However, JP2004-115813A does not describe or suggest a polymer precursor having a heterocyclic ring structure containing two or more nitrogen atoms. Further, a cured film obtained by curing the curable resin composition according to JP2004-115813A has a problem of low metal adhesiveness.

<Specific Polymer Precursor>

The curable resin composition according to the embodiment of the present invention contains a specific polymer precursor.

The specific polymer precursor has a heterocyclic ring structure containing two or more nitrogen atoms.

[Heterocyclic Ring Structure Containing Two or More Nitrogen Atoms]

The content of the heterocyclic ring structure containing two or more nitrogen atoms contained in the specific polymer precursor is preferably 0.01 to 1 mmol/g, more preferably 0.02 to 0.8 mmol/g, and still more preferably 0.03 to 0.5 mmol/g, with respect to the total solid content of the composition from the viewpoint of further improving the metal adhesiveness.

As the heterocyclic ring structure, the specific polymer precursor may have only one kind of heterocyclic ring structure or may have two or more kinds of heterocyclic ring structures having different structures. In a case where the specific polymer precursor has two or more kinds of heterocyclic ring structures, the content of the heterocyclic ring structure is the total content of all the heterocyclic ring structures in the specific polymer precursor.

The heterocyclic ring structure containing two or more nitrogen atoms is preferably a heterocyclic ring structure containing two or more nitrogen atoms as ring members and is more preferably a heterocyclic ring structure containing two or more nitrogen atoms as ring members of a monocyclic ring.

The heterocyclic ring structure containing two or more nitrogen atoms as ring members of a monocyclic ring refers to, for example, a ring structure (a triazole ring structure) represented by Formula (AA-1) and does not include a fused ring formed by fusing two or more monocyclic rings containing only one nitrogen atom as a ring member, such as a ring structure (a 1,8-naphthyridine ring structure) represented by Formula (AA-2).

However, the heterocyclic ring structure containing two or more nitrogen atoms as members of a monocyclic ring includes a ring structure containing two nitrogen atoms as ring members of a monocyclic ring and further having a fused ring, such as a ring structure (a quinazoline ring structure) represented by Formula (AA-3) or a ring structure (a purine ring structure) represented by Formula (AA-4).

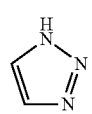

(AA-1)

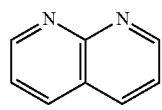

(AA-2)

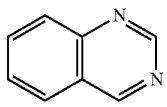

(AA-3)

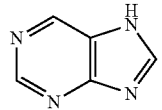

(AA-4)

The heterocyclic ring structure containing two or more nitrogen atoms is preferably an aromatic ring structure.

In addition, the heterocyclic ring structure containing two or more nitrogen atoms may be a fused ring structure, a crosslinked ring structure, or a spirocyclic ring structure, or the like; however, it is preferably a monocyclic ring structure.

The monocyclic ring containing two or more nitrogen atoms as the heterocyclic ring structure containing two or more nitrogen atoms preferably has 5 to 10 ring members, more preferably 5 to 6 ring members, and still more preferably 5 ring members.

As the number of ring members of the monocyclic ring containing two or more nitrogen atoms, for example, the ring structure represented by Formula (AA-1) has 5 ring members, the ring structure represented by Formula (AA-3) has 6 ring members, and the ring structure represented by Formula (AA-4) has 5 or 6 ring members.

Further, the heterocyclic ring structure containing two or more nitrogen atoms may have a heterocycle atom other than the nitrogen atom (a heteroatom); however, it preferably does not have a heteroatom other than the nitrogen atom.

As the heterocyclic ring structure containing two or more nitrogen atoms, at least one ring structure selected from the group consisting of an imidazole ring structure, a pyrazole ring structure, a triazole ring structure, a tetrazole ring structure, a pyrazine ring structure, a pyrimidine ring structure, a pyridazine ring structure, a 1,2,3-triazine ring structure, a 1,2,4-triazine ring structure, a 1,3,5-triazine ring structure, a 1,2,3,4-tetrazine ring structure, a 1,2,3,5-tetrazine ring structure, a 1,2,4,5-tetrazine ring structure, an imidazolidine ring structure, a pyrazolidine ring structure, a piperazine ring structure, a fused ring structure containing this monocyclic ring, a crosslinked ring structure containing this monocyclic ring, and a spirocyclic ring structure containing this monocyclic ring can be mentioned, at least one ring structure selected from the group consisting of a triazole ring structure and a tetrazole ring structure is more preferable, and from the viewpoint of the storage stability of the curable resin composition, a tetrazole ring structure is more preferable. In a case where tautomers are present in these ring structures, the tautomers may be included.

One of the preferred aspects of the specific polymer precursor is an aspect in which the structure containing a heterocyclic ring structure containing two or more nitrogen atoms is bonded to a repeating unit containing the terminal of the specific polymer precursor.

—Structure Represented by Formula (A-1) or Formula (A-2)—

The specific polymer precursor preferably contains at least one structure selected from the group consisting of a structure represented by Formula (A-1) and a structure represented by Formula (A-2) as a structure containing the heterocyclic ring structure.

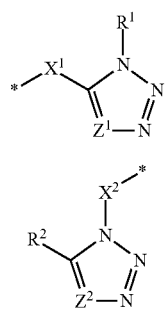

(A-1)

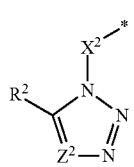

(A-2)

In Formula (A-1) and Formula (A-2), $X^1$ and $X^2$ represent a single bond or divalent linking group, $R^1$ represents a hydrogen atom, an amino group, or a hydrocarbon group, $R^2$ represents a hydrogen atom or a hydrocarbon group, $Z^1$ and $Z^2$ represent =$CR^3$— or a nitrogen atom, $R^3$ represents a hydrogen atom, an alkyl group, an aryl group, an amino group, a carboxy group, or a hydroxy group, and * represents a bonding site to another structure in the specific polymer precursor.

In addition, the structure represented by Formula (A-1) may be a tautomer represented by Formula (A-1') in a case where $Z^1$ is =$CR^3$—, and the structure represented by Formula (A-2) may be a tautomer represented by Formula (A-2') in a case where $Z^2$ is =$CR^3$—.

In the present specification, the description of the "structure represented by Formula (A-1)" refers to both of the structure represented by Formula (A-1) and the structure represented by (A-1') in a case where $Z^1$ is =$CR^3$—, and the description of the "structure represented by Formula (A-2)" refers to both of the structure represented by Formula (A-2) and the structure represented by (A-2') in a case where $Z^2$ is =$CR^3$—.

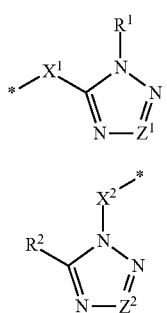

(A-1')

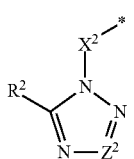

(A-2')

In Formula (A-1') and Formula (A-2'), $Z^1$ and $Z^2$ represent =$CR^3$—, $X^1$, $X^2$, $R^1$, $R^2$, $R^3$, and * are synonymous with $X^1$, $X^2$, $R^1$, $R^2$, $R^3$, and * in Formula (A-1) and Formula (A-2), respectively, and the same applies to the preferred aspect.

<<$X^1$>>

In Formula (A-1), $X^1$ is preferably a divalent linking group and preferably an alkylene group (preferably an alkylene group having 1 to 20 carbon atoms and more preferably an alkylene group having 1 to 4 carbon atoms), an arylene group (preferably aryl group having 6 to 20 carbon atoms and more preferably phenylene group), an amide group (—NH—C(=O)—), an ester group (—O—C(=O)—), an ether group (—O—), an amino group (—$NR^N$—, where $R^N$ is a hydrogen atom, an alkyl group, or an aryl group; preferably an alkyl group or a phenyl group having 1 to 20 carbon atoms), or a group obtained by combining of two or more of these groups. This divalent linking group may be selected in consideration of the synthesis method and the like.

Further, the linking chain length of $X^1$ (the smallest number of atoms that are present between the carbon atom to which $X^1$ is bonded and *) is preferably 0 to 20 and more preferably 0 to 8.

<<$R^1$>>

In Formula (A-1), $R^1$ represents a hydrogen atom, an amino group, or a hydrocarbon group, and from the viewpoint of adhesion of the curable resin composition, it is preferably a hydrogen atom or an alkyl group.

The hydrocarbon group is preferably an alkyl group or an aryl group and more preferably an alkyl group. The alkyl group is preferably an alkyl group having 1 to 20 carbon atoms and more preferably an alkyl group having 1 to 4 carbon atoms. The aryl group is preferably an aryl group having 6 to 20 carbon atoms and more preferably a phenyl group.

<<$Z^1$>>

In Formula (A-1), $Z^1$ is preferably a nitrogen atom from the viewpoint of the storage stability of the curable resin composition.

In a case where $Z^1$ is =$CR^3$—, $R^3$ is preferably a hydrogen atom, an alkyl group, or an aryl group and more preferably a hydrogen atom from the viewpoint of the storage stability and the curing properties of the curable resin composition.

<<$X^2$>>

In Formula (A-2), $X^2$ is preferably a divalent linking group and preferably an alkylene group (preferably an alkylene group having 1 to 20 carbon atoms and more preferably an alkylene group having 1 to 4 carbon atoms), an arylene group (preferably aryl group having 6 to 20 carbon atoms and more preferably phenylene group), an amide group (—NH—C(=O)—), an ester group (—O—C(=O)—), an ether group (—O—), a carbonyl group (—C(=O)—), an amino group (—$NR^N$—, where $R^N$ is a hydrogen atom, an alkyl group, or an aryl group; preferably an alkyl group or a phenyl group having 1 to 20 carbon atoms), or a group obtained by combining of two or more of these groups. This divalent linking group may be selected in consideration of the synthesis method and the like.

Further, the linking chain length of $X^2$ (the smallest number of atoms that are present between the nitrogen atom to which $X^2$ is bonded and *) is preferably 1 to 10 and more preferably 1 to 6.

<<$R^2$>>

In Formula (A-2), $R^2$ represents a hydrogen atom or a hydrocarbon group, and from the viewpoint of the metal adhesiveness, it is preferably a hydrogen atom or an alkyl group having 1 to 20 carbon atoms, more preferably a hydrogen atom or an alkyl group having 1 to 8 carbon atoms, and still more preferably a hydrogen atom.

<<$Z^2$>>

In Formula (A-2), $Z^2$ is preferably a nitrogen atom from the viewpoint of the storage stability of the curable resin composition.

In a case where $Z^2$ is =$CR^3$—, $R^3$ is preferably a hydrogen atom, an alkyl group, or an aryl group and more preferably a hydrogen atom from the viewpoint of the storage stability and the curing properties of the curable resin composition.

SPECIFIC EXAMPLE

Examples of the structure containing a heterocyclic ring structure containing two or more nitrogen atoms include a structure represented by the following formulae. In the formulae below, * represents a bonding site to another structure in the specific polymer precursor.

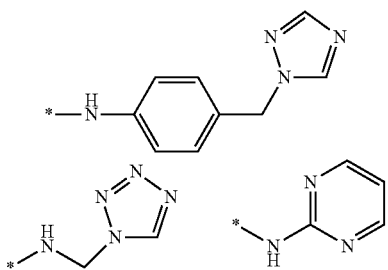

The structure represented by Formula (A-1) or the structure represented by Formula (A-2) is preferably bonded to a repeating unit containing a terminal of the specific polymer precursor.

The specific polymer precursor has at least two repeating units containing a terminal, and a structure represented by Formula (A-1) or a structure represented by Formula (A-2) is preferably bonded to at least one of the repeating units.

The preferred examples of the aspect in which the structure represented by Formula (A-1) or the structure represented by Formula (A-2) is bonded to the repeating unit containing a terminal of the specific polymer precursor include an aspect in which the specific polymer precursor contains a repeating unit represented by Formula (PI-A2) or Formula (PB-A2) which will be described later.

—A Repeating Unit Having a Heterocyclic Ring Structure Containing Two or More Nitrogen Atoms—

The specific polymer precursor preferably has a repeating unit represented by Formula (PI-A1) or a repeating unit represented by Formula (PB-A1) as a repeating unit having a heterocyclic ring structure containing two or more nitrogen atoms.

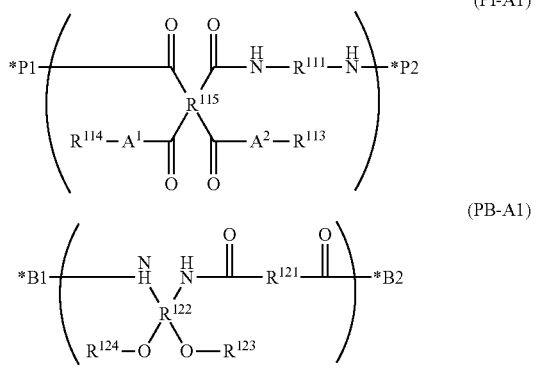

in Formulae (PI-A1) and (PB-A1), $A^1$ and $A^2$ each independently represent an oxygen atom or —NH—, $R^{111}$ represents a divalent organic group, $R^{115}$ represents a tetravalent organic group, $R^{113}$ and $R^{114}$ each independently represent a hydrogen atom or a monovalent organic group, and $*^{P1}$ and $*^{P2}$ each independently represent a bonding site to another structure, where at least one of $R^{113}$ or $R^{114}$ has a heterocyclic ring structure containing two or more nitrogen atoms, $*^{P1}$ is bonded to a structure containing a heterocyclic ring structure containing two or more nitrogen atoms, or at least one of $R^{113}$ or $R^{114}$ has a heterocyclic ring structure containing two or more nitrogen atoms and $*^{P1}$ is bonded to a structure containing a heterocyclic ring structure containing two or more nitrogen atoms, and $R^{121}$ represents a divalent organic group, R'22 represents a tetravalent organic group, $R^{123}$ and $R^{124}$ each independently represent a hydrogen atom or a monovalent organic group, and $*^{B1}$ and $*^{B2}$ each independently represent a bonding site to another structure, where at least one of $R^{124}$ or $R^{123}$ has a heterocyclic ring structure containing two or more nitrogen atoms, $*^{B2}$ is bonded to a structure containing a heterocyclic ring structure containing two or more nitrogen atoms, or at least one of $R^{124}$ or $R^{123}$ has a heterocyclic ring structure containing two or more nitrogen atoms and $*^{B2}$ is bonded to a structure containing a heterocyclic ring structure containing two or more nitrogen atoms.

<<$A^1$, $A^2$, $R^{111}$, and $R^{115}$>>

In Formula (PI-A1), $A^1$, $A^2$, $R^{111}$, and $R^{115}$ are respectively synonymous with $A^1$, $A^2$, $R^{111}$, and $R^{115}$ in Formula (1) described later, and the same applies to the preferred aspect.

<<$R^{113}$>>

In Formula (PI-A1), in a case where $R^{113}$ does not have a heterocyclic ring structure containing two or more nitrogen atoms, $R^{113}$ is synonymous with $R^{113}$ in Formula (1) described later, and the same applies to the preferred aspect.

In Formula (PI-A1), in a case where $R^{113}$ has a heterocyclic ring structure containing two or more nitrogen atoms, the structure represented by -$A^2$-$R^{113}$ in Formula (PI-A1) is preferably the above-described structure represented by Formula (A-1) or the above-described structure represented by Formula (A-2).

<<$R^{114}$>>

In Formula (PI-A1), in a case where $R^{114}$ does not have a heterocyclic ring structure containing two or more nitrogen atoms, $R^{114}$ is synonymous with $R^{114}$ in Formula (1) described later, and the same applies to the preferred aspect.

In Formula (PI-A1), in a case where $R^{114}$ has a heterocyclic ring structure containing two or more nitrogen atoms, the structure represented by -$A^1$-$R^{114}$ in Formula (PI-A1) is preferably the above-described structure represented by Formula (A-1) or the structure represented by Formula (A-2).

<<$*^{P1}$ and $*^{P2}$>>

In a case where $*^{P1}$ is bonded to a structure containing a heterocyclic ring structure containing two or more nitrogen atoms, $*^{P1}$ is preferably bonded directly to the above-described structure represented by Formula (A-1) or the above-described structure represented by Formula (A-2).

It is preferable that $*^{P2}$ is bonded to $*^1$ in Formula (1) described later.

In a case where $*^{P1}$ is bonded to a structure containing a heterocyclic ring structure containing two or more nitrogen atoms, the repeating unit represented by Formula (PI-A1) is preferably a repeating unit represented by Formula (PI-A2). The specific polymer precursor preferably has a repeating unit represented by Formula (PI-A2) at the terminal.

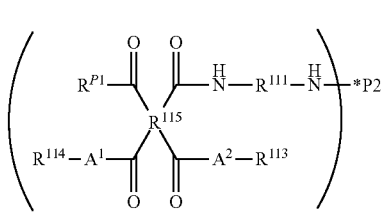

(PI-A2)

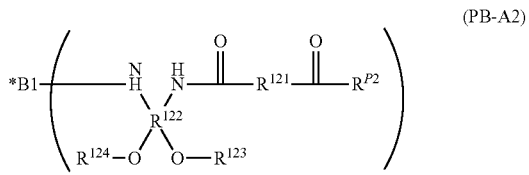

(PB-A2)

In Formula (PI-A2), $A^1$, $A^2$, $R^{111}$, $R^{113}$, $R^{114}$, $R^{115}$, and $*^{P2}$ are respectively synonymous with $A^1$, $A^2$, $R^{111}$, $R^{113}$, $R^{114}$, $R^{115}$, and $*^{P2}$ in Formula (1) described later, and the same applies to the preferred aspect.

In Formula (PI-A2), $R^{P1}$ is preferably the above-described structure represented by Formula (A-1) or the above-described structure represented by Formula (A-2). Specific examples of the aspect thereof include an aspect in which * in the structure represented by Formula (A-1) or the structure represented by Formula (A-2) is directly bonded to the carbon atom contained in —C(=O)—, to which $R^{P1}$ in Formula (PI-A2) is bonded.

<<$R^{121}$ and $R^{122}$>>

In Formula (PB-A2), $R^{121}$ and $R^{122}$ are respectively synonymous with $R^{121}$ and $R^{122}$ in Formula (2) be described later, and the same applies to the preferred aspect.

<<$R^{123}$>>

In Formula (PB-A2), in a case where $R^{123}$ does not have a heterocyclic ring structure containing two or more nitrogen atoms, $R^{123}$ is synonymous with $R^{123}$ in Formula (2) described later, and the same applies to the preferred aspect.

In Formula (PB-A2), in a case where $R^{123}$ has a heterocyclic ring structure containing two or more nitrogen atoms, the structure represented by —O—$R^{123}$ in Formula (PB-A2) is preferably the above-described structure represented by Formula (A-1) or the above-described structure represented by Formula (A-2).

<<$R^{124}$>>

In Formula (PB-A2), in a case where $R^{124}$ does not have a heterocyclic ring structure containing two or more nitrogen atoms, $R^{124}$ is synonymous with $R^{124}$ in Formula (2) described later, and the same applies to the preferred aspect.

In Formula (PB-A2), in a case where $R^{124}$ has a heterocyclic ring structure containing two or more nitrogen atoms, the structure represented by —O—$R^{124}$ in Formula (PB-A2) is preferably the above-described structure represented by Formula (A-1) or the above-described structure represented by Formula (A-2).

<<$*^{B1}$ and $*^{B2}$>>

In a case where $*^{B2}$ is bonded to a structure containing a heterocyclic ring structure containing two or more nitrogen atoms, $*^{B2}$ is preferably bonded directly to the above-described structure represented by Formula (A-1) or the above-described structure represented by Formula (A-2).

It is preferable that $*^{B1}$ is bonded to $*^2$ in Formula (2) described later.

In a case where $*^{P1}$ is bonded to a structure containing a heterocyclic ring structure containing two or more nitrogen atoms, the repeating unit represented by Formula (PB-A1) is preferably a repeating unit represented by Formula (PB-A2). The specific polymer precursor preferably has a repeating unit represented by Formula (PB-A2) at the terminal.

In Formula (PB-A2), $R^{122}$, $R^{121}$, and $R^{123}$ are respectively synonymous with $R^{122}$, $R^{121}$, and $R^{123}$ in Formula (2) be described later, and the same applies to the preferred aspect.

In Formula (PB-A2), $R^{P2}$ is preferably the above-described structure represented by Formula (A-1) or the above-described structure represented by Formula (A-2). Specific examples of the aspect thereof include an aspect in which * in the structure represented by Formula (A-1) or the structure represented by Formula (A-2) is directly bonded to the carbon atom contained in —C(=O)—, to which $R^{P2}$ in Formula (PB-A2) is bonded.

[Repeating Unit Represented by Formula (1)]

From the viewpoint of the film hardness of the cured film to be obtained, the specific polymer precursor preferably has a repeating unit represented by Formula (1) as another repeating unit.

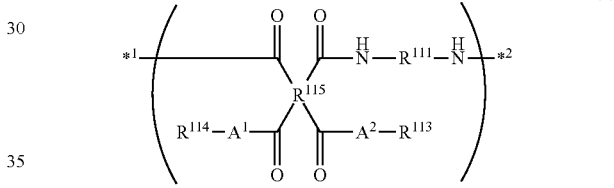

(1)

In Formula (1), $A^1$ and $A^2$ each independently represent an oxygen atom or —NH—, $R^{111}$ represents a divalent organic group, $R^{115}$ represents a tetravalent organic group, $R^{113}$ and $R^{114}$ each independently represent a hydrogen atom or a monovalent organic group, and $*^1$ and $*^2$ each independently represent a bonding site with another structure.

In Formula (1), $A^1$ and $A^2$ each independently represent an oxygen atom or —NH—, $R^{111}$ represents a divalent organic group, $R^{115}$ represents a tetravalent organic group, and $R^{113}$ and $R^{114}$ each independently represent a hydrogen atom or a monovalent organic group.

—$A^1$ and $A^2$—

$A^1$ and $A^2$ in Formula (1) each independently represent an oxygen atom or —NH—, and an oxygen atom is preferable.

—$R^{111}$—

$R^{111}$ in Formula (1) represents a divalent organic group. Examples of the divalent organic group include a group having a linear or branched aliphatic group, a cyclic aliphatic group, an aromatic group, and a heteroaromatic group, or a group obtained by combining two or more these groups. The divalent organic group is preferably a linear aliphatic group having 2 to 20 carbon atoms, a branched aliphatic group having 3 to 20 carbon atoms, a cyclic aliphatic group having 3 to 20 carbon atoms, an aromatic group having 6 to 20 carbon atoms, or a group obtained by combining two or more these groups, and more preferably an aromatic group having 6 to 20 carbon atoms.

$R^{111}$ in Formula (1) is preferably derived from a diamine. Examples of the diamine that is used for producing the specific polymer precursor include a linear aliphatic or branched aliphatic diamine, a cyclic aliphatic diamine, or an aromatic diamine. One kind of diamine may be used alone, or two or more kinds thereof may be used.

Specifically, the diamine is preferably a diamine containing a linear aliphatic group having 2 to 20 carbon atoms, a branched or cyclic aliphatic group having 3 to 20 carbon atoms, an aromatic group having 6 to 20 carbon atoms, or a group obtained by combining two or more these groups, and more preferably a diamine containing an aromatic group having 6 to 20 carbon atoms. Examples of the aromatic group include the followings.

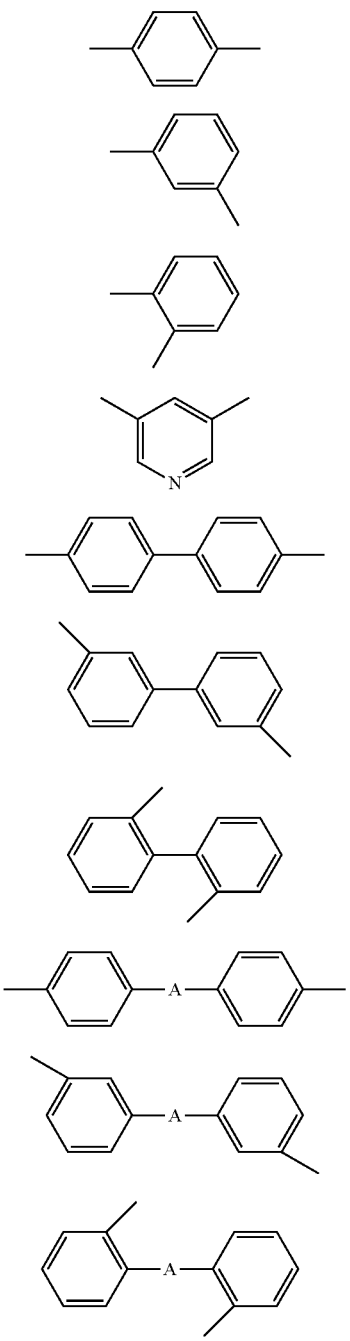

In the formulae, A is preferably a single bond, or an aliphatic hydrocarbon group having 1 to 10 carbon atoms, which may be substituted with a fluorine atom, —O—, —C(=O)—, —S—, —S(=O)$_2$—, —NHC(=O)—, or a group obtained by combining two or more thereof, more preferably a single bond, or a group selected from an alkylene group having 1 to 3 carbon atoms, which may be substituted with a fluorine atom, —O—, —C(=O)—, —S—, and —S(=O)$_2$—, and still more preferably a divalent group selected from the group consisting of —CH$_2$—, —O—, —S—, —S(=O)$_2$—, —C(CF$_3$)$_2$—, and —C(CH$_3$)$_2$—.

Specific examples of the diamine include at least one diamine selected from 1,2-diaminoethane, 1,2-diaminopropane, 1,3-diaminopropane, 1,4-diaminobutane, or 1,6-diaminohexane; 1,2- or 1,3-diaminocyclopentane, 1,2-, 1,3-, or 1,4-diaminocyclohexane, 1,2-, 1,3-, or 1,4-bis(aminomethyl)cyclohexane, bis-(4-aminocyclohexyl)methane, bis-(3-aminocyclohexyl)methane, 4,4'-diamino-3,3'-dimethylcyclohexymethane, or isophorone diamine; meta or praraphenylene diamine, diaminotoluene, 4,4'- or 3,3'-diaminobiphenyl, 4,4'-diaminodiphenyl ether, 3,3-diaminodiphenyl ether, 4,4'- or 3,3'-diaminodiphenylmethane, 4,4'- or 3,3'-diaminodiphenyl sulfone, 4,4'- or 3,3'-diaminodiphenyl sulfide, 4,4'- or 3,3'-diaminobenzophenone, 3,3'-dimethyl-4,4'-diaminobiphenyl, 2,2'-dimethyl-4,4'-diaminobiphenyl(4,4'-di amino-2,2'-dimethylbiphenyl), 3,3'-dimethoxy-4,4'-di aminobiphenyl, 2,2-bis(4-aminophenyl)propane, 2,2-bis(4-aminophenyl)hexafluoropropane, 2,2-bis(3-hydroxy-4-aminophenyl)propane, 2,2-bis(3-hydroxy-4-aminophenyl)hexafluoropropane, 2,2-bis(3-amino-4-hydroxyphenyl)propane, 2,2-bis(3-amino-4-hydroxyphenyl)hexafluoropropane, bis(3-amino-4-hydroxyphenyl)sulfone, bis(4-amino-3-hydroxyphenyl)sulfone, 4,4'-diaminoparaterphenyl, 4,4-bis(4-aminophenoxy)biphenyl, bis[4-(4-aminophenoxy)phenyl]sulfone, bis[4-(3-aminophenoxy)phenyl]sulfone, bis[4-(2-aminophenoxy)phenyl]sulfone, 1,4-bis(4-aminophenoxy)benzene, 9,10-bis(4-aminophenyl)anthracene, 3,3'-dimethyl-4,4'-diaminodiphenyl sulfone, 1,3-bis(4-aminophenoxy)benzene, 1,3-bis(3-aminophenoxy)benzene, 1,3-bis(4-aminophenyl)benzene, 3,3'-diethyl-4,4'-diaminodiphenylmethane, 3,3'-dimethyl-4,4'-diaminodiphenylmethane, 4,4'-diaminooctafluorobiphenyl, 2,2-bis[4-(4-aminophenoxy)phenyl]propane, 2,2-bis[4-(4-aminophenoxy)phenyl]hexafluoropropane, 9,9-bis(4-aminophenyl)-10-hydroanthracene, 3,3',4,4'-tetraaminobiphenyl, 3,3',4,4'-tetraaminodiphenyl ether, 1,4-diaminoanthraquinone, 1,5-diaminoanthraquinone, 3,3-dihydroxy-4,4'-diaminobiphenyl, 9,9'-bis(4-aminophenyl)fluorene, 4,4'-dimethyl-3,3'-diaminodiphenyl sulfone, 3,3',5,5'-tetramethyl-4,4'-diaminodiphenylmethane, 2-(3',5'-diaminobenzoyloxy)ethylmethacrylate, 2,4- or, 2,5-diaminocumene, 2,5-dimethyl-paraphenylene diamine, acetoguanamine, 2,3,5,6-tetramethyl-paraphenylene diamine, 2,4,6-trimethyl-metaphenylene diamine, bis(3-aminopropyl)tetramethyl disiloxane, 2,7-diaminofluorene, 2,5-diaminopyridine, 1,2-bis(4-aminophenyl)ethane, diaminobenzanilide, esters of diaminobenzoic acid, 1,5-diaminonaphthalene, diaminobenzotrifluoride, 1,3-bis(4-aminophenyl)hexafluoropropane, 1,4-bis(4-aminophenyl)octafluorobutane, 1,5-bis(4-aminophenyl)decafluoropentane, 1,7-bis(4-aminophenyl)tetradecafluoroheptane, 2,2-bis[4-(3-aminophenoxy)phenyl]hexafluoropropane, 2,2-bis[4-(2-aminophenoxy)phenyl]hexafluoropropane, 2,2-bis[4-(4-aminophenoxy)-3,5-dimethylphenyl]hexafluoropropane, 2,2-bis[4-(4-aminophenoxy)-3,5-bis(trifluoromethyl)phenyl]hexafluoropropane, parabis(4-amino-2-trifluoromethylphenoxy)benzene, 4,4'-bis(4-amino-2- trifluoromethylphenoxy)biphenyl, 4,4'-bis(4-amino-3-trifluoromethylphenoxy)biphenyl, 4,4'-bis(4-amino-2-trifluoromethylphenoxy)diphenyl sulfone, 4,4'-bis(3-amino-5-trifluoromethylphenoxy)diphenyl sulfone, 2,2-bis[4-(4-amino-3-trifluoromethylphenoxy)phenyl]hexafluoropropane, 3,3',5,5'-tetramethyl-4,4'-diaminobiphenyl, 4,4'-diamino-2,2'-bis(trifluoromethyl)biphenyl, 2,2',5,5',6,6'-hexafluorotolidine, or 4,4'-diaminoquaterphenyl.

In addition, diamines (DA-1) to (DA-18) shown below are also preferable.

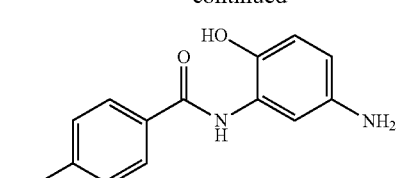
(DA-17)

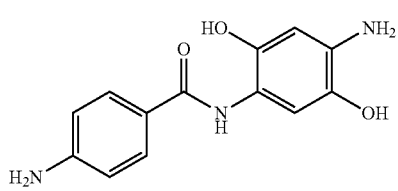
(DA-18)

In addition, preferred examples of the diamine also include a diamine having at least two alkylene glycol units in the main chain. A diamine containing, in total, two or more chains of any one or both of ethylene glycol chains and propylene glycol chains in one molecule is preferable, and a diamine containing no aromatic ring is more preferable. Specific examples thereof include JEFFAMINE (registered trade mark) KH-511, JEFFAMINE (registered trade mark) ED-600, JEFFAMINE (registered trade mark) ED-900, JEFFAMINE (registered trade mark) ED-2003, JEFFAMINE (registered trade mark) EDR-148, JEFFAMINE (registered trade mark) EDR-176, D-200, D-400, D-2000, D-4000 (all trade names, manufactured by HUNTSMAN Corporation), 1-(2-(2-(2-aminopropoxy)ethoxy)propoxy)propane-2-amine, and 1-(1-(1-(2-aminopropoxy)propan-2-yl)oxy)propane-2-amine, which are not limited thereto.

Structures of JEFFAMINE (registered trade mark) KH-511, JEFFAMINE (registered trade mark) ED-600, JEFFAMINE (registered trade mark) ED-900, JEFFAMINE (registered trade mark) ED-2003, JEFFAMINE (registered trade mark) EDR-148, and JEFFAMINE (registered trade mark) EDR-176 are shown below.

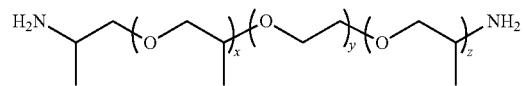

KH-511 (y = 2.0, x + z = 1.2)
ED-600 (y = 9.0, x + z = 3.6)
ED-900 (y = 12.5, x + z = 6.0)
ED-2003 (y = 39.0, x + z = 6.0)

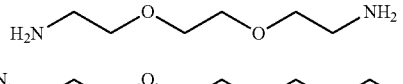
EDR-148

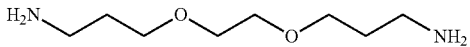
EDR-176

In the above, x, y, and z are arithmetic average values.

$R^{111}$ in Formula (1) is preferably represented by —$Ar^0$-$L^0$-$Ar^0$— from the viewpoint of the flexibility of the cured film to be obtained. $Ar^0$'s are each independently an aromatic hydrocarbon group (preferably having 6 to 22 carbon atoms, more preferably 6 to 18 carbon atoms, and particularly preferably 6 to 10 carbon atoms) and are preferably a phenylene group. $L^0$ represents a single bond, or an aliphatic hydrocarbon group having 1 to 10 carbon atoms which may be substituted with a fluorine atom, —O—, —C(=O)—, —S—, —S(=O)$_2$—, —NHCO—, or a group obtained by combining two or more thereof. The preferred range of $L^0$ is the same as that of A described above.

From the viewpoint of the i-ray transmittance, $R^{111}$ in Formula (1) is preferably a divalent organic group represented by Formula (51) or Formula (61) below. In particular, from the viewpoint of the i-ray transmittance and ease of availability, a divalent organic group represented by Formula (61) is more preferable.

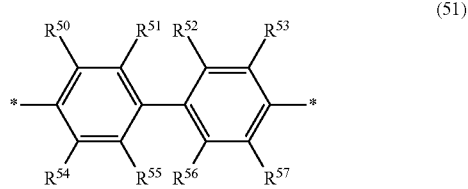
(51)

In Formula (51), $R^{50}$ to $R^{57}$ each independently represent a hydrogen atom, a fluorine atom, or a monovalent organic group, and at least one of $R^{50}$, . . . , or $R^{57}$ represents a fluorine atom, a methyl group, a fluoromethyl group, a difluoromethyl group, or a trifluoromethyl group, and *'s each independently represent a bonding site to another structure.

Examples of the monovalent organic group as $R^{50}$ to $R^{57}$ include an unsubstituted alkyl group having 1 to 10 (preferably 1 to 6) carbon atoms and a fluorinated alkyl group having 1 to 10 (preferably 1 to 6) carbon atoms.

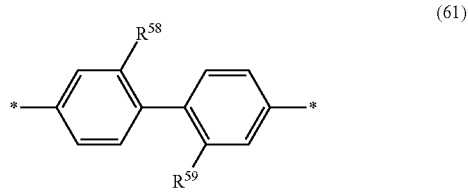
(61)

In Formula (61), $R^{58}$ and $R^{59}$ each independently represent a fluorine atom, a fluoromethyl group, a difluoromethyl group, or a trifluoromethyl group.

Examples of the diamine compound that provides a structure of Formula (51) or (61), dimethyl-4,4'-diaminobiphenyl, 2,2'-bis(trifluoromethyl)-4,4'-diaminobiphenyl, and 2,2'-bis(fluoro)-4,4'-diaminobiphenyl, 4,4'-diaminooctafluorobiphenyl. One kind among them may be used, or two or more kinds among them may be used in combination.

—$R^{115}$—

$R^{115}$ in Formula (1) represents a tetravalent organic group. The tetravalent organic group is preferably a tetravalent organic group containing an aromatic ring and more preferably a group represented by Formula (5) or Formula (6).

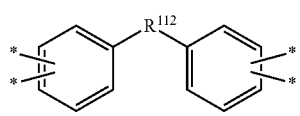
(5)

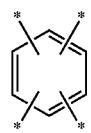
(6)

$R^{112}$ is synonymous with A, and the same applies to the preferred range. *'s each independently represent a bonding site to another structure.

Specific examples of the tetravalent organic group represented by $R^{115}$ in Formula (1) include a tetracarboxylic acid residue that remains after removing an acid dianhydride group from tetracarboxylic acid dianhydride. One kind of tetracarboxylic acid dianhydride may be used alone, or two or more kinds thereof may be used. The tetracarboxylic acid dianhydride is preferably a compound represented by Formula (7).

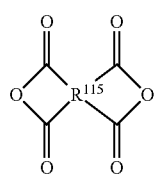

(7)

$R^{115}$ represents a tetravalent organic group. $R^{115}$ is synonymous with $R^{115}$ in Formula (1).

Specific examples of the tetracarboxylic acid dianhydride include at least one selected from pyromellitic acid, pyromellitic acid dianhydride (PMDA), 3,3',4,4'-biphenyltetracarboxylic acid dianhydride, 3,3',4,4'-diphenylsulfide tetracarboxylic acid dianhydride, 3,3',4,4'-diphenylsulfone tetracarboxylic acid dianhydride, 3,3',4,4'-benzophenone tetracarboxylic acid dianhydride, 3,3',4,4'-diphenylmethane tetracarboxylic acid dianhydride, 2,2',3,3'-diphenylmethane tetracarboxylic acid dianhydride, 2,3,3',4'-biphenyltetracarboxylic acid dianhydride, 2,3,3',4'-benzophenone tetracarboxylic acid dianhydride, 4,4'-oxydiphthalic acid dianhydride, 2,3,6,7-naphthalene tetracarboxylic acid dianhydride, 1,4,5,7-naphthalene tetracarboxylic acid dianhydride, 2,2-bis(3,4-dicarboxyphenyl)propane dianhydride, 2,2-bis(2,3-dicarboxy phenyl)propane dianhydride, 2,2-bis(3,4-dicarboxyphenyl) hexafluoropropane dianhydride, 1,3-diphenylhexafluoropropane-3,3,4,4-tetracarboxylic acid dianhydride, 1,4,5,6-naphthalene tetracarboxylic acid dianhydride, 2,2',3,3'-diphenyl tetracarboxylic acid dianhydride, 3,4,9,10-perylene tetracarboxylic acid dianhydride, 1,2,4,5-naphthalene tetracarboxylic acid dianhydride, 1,4,5,8-naphthalene tetracarboxylic acid dianhydride, 1,8,9,10-phenanthrene tetracarboxylic acid dianhydride, 1,1-bis(2,3-dicarboxyphenyl)ethane dianhydride, 1,1-bis(3,4-dicarboxyphenyl)ethane dianhydride, 1,2,3,4-benzene tetracarboxylic acid dianhydride, and alkyl derivatives having 1 to 6 carbon atoms and alkoxy derivatives having 1 to 6 carbon atoms thereof.

In addition, preferred examples thereof include tetracarboxylic acid dianhydrides (DAA-1) to (DAA-5) shown below.

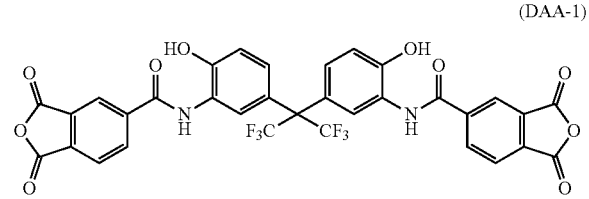

(DAA-1)

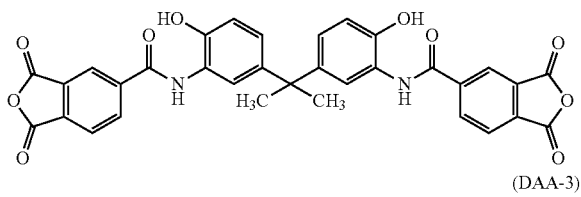

(DAA-2)

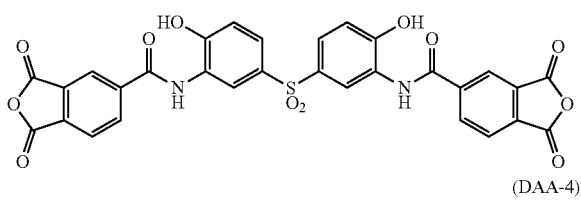

(DAA-3)

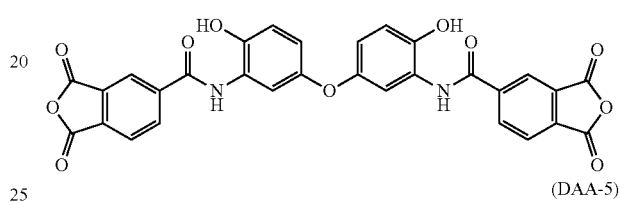

(DAA-4)

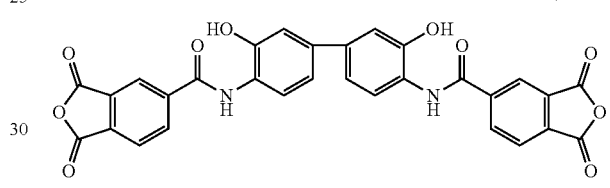

(DAA-5)

—$R^{113}$ and $R^{114}$—

$R^{113}$ and $R^{114}$ in Formula (1) each independently represent a hydrogen atom or a monovalent organic group. At least one of $R^{113}$ or $R^{114}$ preferably contains a radically polymerizable group, and more preferably both contain a radically polymerizable group. The radically polymerizable group is a group capable of undergoing a crosslinking reaction by an action of a radical, and preferred examples thereof include a group having an ethylenically unsaturated bond.

Examples of the group having an ethylenically unsaturated bond include a vinyl group, an allyl group, a (meth)acryloyl group, and a group represented by Formula (III).

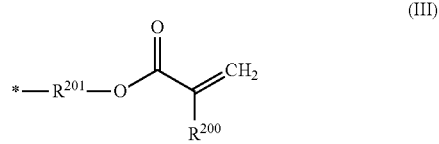

(III)

In Formula (III), $R^{200}$ represents a hydrogen atom or a methyl group and is preferably a methyl group.

In Formula (III), $R^{201}$ represents an alkylene group having 2 to 12 carbon atoms, —$CH_2CH(OH)CH_2$—, or a (poly)oxyalkylene group having 4 to 30 carbon atoms (the alkylene group preferably has 1 to 12 carbon atoms, more preferably 1 to 6 carbon atoms, and particularly preferably 1 to 3 carbon atoms; the number of repetitions thereof is preferably 1 to 12, more preferably 1 to 6, and particularly preferably 1 to 3). The (poly)oxyalkylene group means an oxyalkylene group or a polyoxyalkylene group.

Suitable examples of $R^{201}$ include an ethylene group, a propylene group, a trimethylene group, a tetramethylene group, a 1,2-butanediyl group, a 1,3-butanediyl group, a pentamethylene group, a hexamethylene group, an octamethylene group, a dodecamethylene group, and —CH$_2$CH(OH)CH$_2$—, and preferred examples thereof include an ethylene group, a propylene group, a trimethylene group, and —CH$_2$CH(OH)CH$_2$—.

Particularly preferably, $R^{200}$ is a methyl group, and $R^{201}$ is an ethylene group.

In Formula (III), * represents a bonding site with another structure.

As the preferred embodiment of the specific polymer precursor in the present invention, examples of the monovalent organic group as $R^{113}$ or $R^{114}$ include an aliphatic group, an aromatic group, and an arylalkyl group, which have one, two, or three, and preferably one acid group. Specific examples thereof include an aromatic group having 6 to 20 carbon atoms, which has an acid group, and an arylalkyl group having 7 to 25 carbon atoms, which has an acid group. More specific examples thereof include a phenyl group having an acid group and a benzyl group having an acid group. The acid group is preferably a hydroxy group. That is, $R^{113}$ or $R^{114}$ is preferably a group having a hydroxy group.

As the monovalent organic group represented by $R^{113}$ or $R^{114}$, a substituent that improves the solubility of a developer is preferably used.

$R^{113}$ or $R^{114}$ is more preferably a hydrogen atom, 2-hydroxybenzyl, 3-hydroxybenzyl, or 4-hydroxybenzyl, from the viewpoint of solubility in an aqueous developer.

From the viewpoint of solubility in an organic solvent, $R^{113}$ or $R^{114}$ is preferably a monovalent organic group. The monovalent organic group is preferably a linear or branched alkyl group, a cyclic alkyl group, or an aromatic group, and more preferably an alkyl group substituted with an aromatic group.

The alkyl group preferably has 1 to 30 carbon atoms (3 or more carbon atoms in the case of the cyclic group). The alkyl group may be linear, branched, or cyclic. Examples of the linear or branched alkyl group include a methyl group, an ethyl group, a propyl group, a butyl group, a pentyl group, a hexyl group, a heptyl group, an octyl group, a nonyl group, a decyl group, a dodecyl group, a tetradecyl group, an octadecyl group, an isopropyl group, an isobutyl group, a sec-butyl group, a t-butyl group, a 1-ethylpentyl group, and a 2-ethylhexyl group. The cyclic alkyl group may be a monocyclic cyclic alkyl group or a polycyclic cyclic alkyl group. Examples of the monocyclic cyclic alkyl group include a cyclopropyl group, a cyclobutyl group, a cyclopentyl group, a cyclohexyl group, a cycloheptyl group, and a cyclooctyl group. Examples of the polycyclic cyclic alkyl group include an adamantyl group, a norbornyl group, a bornyl group, a camphenyl group, a decahydronaphthyl group, a tricyclodecanyl group, a tetracyclodecanyl group, a camphoroyl group, a dicyclohexyl group, and a pinenyl group. In addition, the alkyl group substituted with an aromatic group is preferably a linear alkyl group substituted with an aromatic group as described next.

Specifically, the aromatic group is a substituted or unsubstituted aromatic hydrocarbon group (examples of the cyclic ring structure constituting the group include a benzene ring, a naphthalene ring, a biphenyl ring, a fluorene ring, a pentalene ring, an indene ring, an azulene ring, a heptalene ring, an indacene ring, a perylene ring, a pentacene ring, an acenaphthene ring, a phenanthrene ring, an anthracene ring, a naphthacene ring, a chrysene ring, and a triphenylene ring) or a substituted or unsubstituted aromatic heterocyclic ring group (examples of the cyclic ring structure constituting the group include fluorene ring, a pyrrole ring, a furan ring, a thiophene ring, an imidazole ring, an oxazole ring, a thiazole ring, a pyridine ring, a pyrazine ring, a pyrimidine ring, a pyridazine ring, an indolizine ring, an indole ring, a benzofuran ring, a benzothiophene ring, an isobenzofuran ring, a quinolizine ring, a quinoline ring, a phthalazine ring, a naphthyridine ring, a quinoxaline ring, a quinoxazoline ring, an isoquinoline ring, a carbazole ring, a phenanthridine ring, an acridine ring, a phenanthroline ring, a thianthrene ring, a chromene ring, a xanthene ring, a phenoxathiin ring, a phenothiazine ring, and a phenazine ring).

The specific polymer precursor preferably has a fluorine atom in the repeating unit as well. The content of fluorine atoms in the polyimide precursor is preferably 10% by mass or more and more preferably 20% by mass or more. The upper limit is not particularly limited, but it is practically 50% by mass or less.

In addition, for the intended purpose of improving adhesiveness to a base material, an aliphatic group having a siloxane structure may be copolymerized to a repeating unit represented by Formula (1). Specific examples of the diamine component include bis(3-aminopropyl)tetramethyldisiloxane and bis(paraaminophenyl)octamethyl pentasiloxane.

The repeating unit represented by Formula (1) is preferably a repeating unit represented by Formula (1-A) or a repeating unit represented by Formula (1-B).

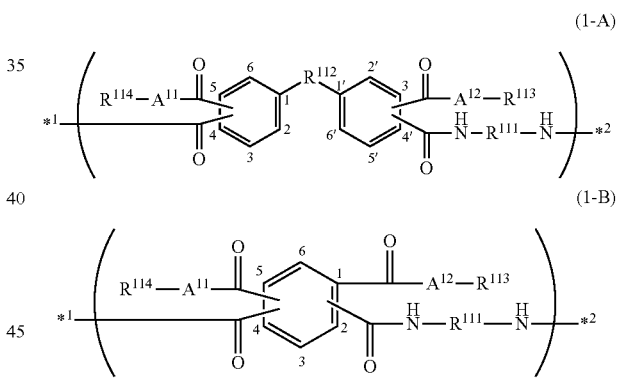

$A^{11}$ and $A^{12}$ represent an oxygen atom or —NH—, $R^{111}$, and $R^{112}$ each independently represent a divalent organic group, and $R^{113}$ and $R^{114}$ each independently represent a hydrogen atom or a monovalent organic group. At least one of $R^{113}$ or $R^{114}$ is preferably a group containing a radically polymerizable group and more preferably a radically polymerizable group. *$^1$ and *$^2$ each independently represent a bonding site with another structure.

The preferred ranges of $A^{11}$, $A^{12}$, $R^{111}$, $R^{113}$, $R^{114}$, *$^1$, and *$^2$ are respectively synonymous with $A^1$, $A^2$, $R^{111}$, $R^{113}$, $R^{114}$, *$^1$, and *$^2$ in Formula (1), and the same applies to the preferred ranges.

The preferred range of $R^{112}$ is the same as that of $R^{112}$ in Formula (5) and is more preferably an oxygen atom among the above.

The bonding site of the carbonyl group to the benzene ring in the formula is preferably 4, 5, 3', or 4' in Formula (1-A). In Formula (1-B), the bonding site is preferably 1, 2, 4, or 5.

In the specific polymer precursor containing a repeating unit represented by Formula (1), the repeating unit represented by Formula (1) may be one kind or two or more kinds. In addition, the polyimide precursor may contain structural isomers of the repeating unit represented by Formula (1). Further, the specific polymer precursor containing a repeating unit represented by Formula (1) may contain another kind of repeating unit in addition to the repeating unit of Formula (1).

As one embodiment of the specific polymer precursor represented by Formula (1) in the present invention, a specific polymer precursor in which the repeating unit represented by Formula (1) accounts for 50% by mole or more, further 70% by mole or more, and particularly 90% by mole or more in the entirety of the repeating units is exemplified. The upper limit is practically 100% by mole or less.

The weight-average molecular weight (Mw) of the specific polymer precursor containing a repeating unit represented by Formula (1) is preferably 2,000 to 500,000, more preferably 5,000 to 100,000, and still more preferably 10,000 to 50,000. In addition, the number-average molecular weight (Mn) thereof is preferably 800 to 250,000, more preferably 2,000 to 50,000, and still more preferably 4,000 to 25,000.

The degree of variance of molecular weight of the specific polymer precursor containing a repeating unit represented by Formula (1) is preferably 1.5 to 3.5 and more preferably 2 to 3.

In the present specification, the degree of variance of molecular weight refers to a value (the weight-average molecular weight/the number-average molecular weight) obtained by dividing the weight-average molecular weight by the number-average molecular weight.

The specific polymer precursor containing a repeating unit represented by Formula (1) is obtained by reacting a dicarboxylic acid or a dicarboxylic acid derivative with a diamine. Preferably, the polyimide precursor is obtained by halogenating a dicarboxylic acid or a dicarboxylic acid derivative with a halogenating agent and then causing the resultant to be reacted with a diamine.

In the method for producing the specific polymer precursor containing a repeating unit represented by Formula (1), it is preferable to use an organic solvent in the reaction. One kind of organic solvent may be used, or two or more kinds thereof may be used.

The organic solvent can be appropriately determined according to raw materials, and examples thereof include pyridine, diethylene glycol dimethyl ether (diglyme), N-methylpyrrolidone, and N-ethylpyrrolidone.

In the production of the specific polymer precursor containing a repeating unit represented by Formula (1), it is preferable to include a step of depositing a solid. Specifically, the specific polymer precursor in the reaction solution is precipitated in water and dissolved in a solvent such as a tetrahydrofuran, in which a polymer precursor can be solubilized, whereby the specific polymer precursor can be deposited as a solid.

[Repeating Unit Represented by Formula (2)]

From the viewpoint of the film hardness of the cured film to be obtained, the specific polymer precursor preferably contains a repeating unit represented by Formula (2) as well, as another repeating unit.

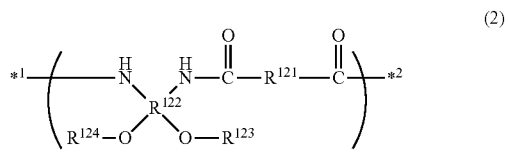

In Formula (2), $R^{121}$ represents a divalent organic group, $R^{122}$ represents a tetravalent organic group, $R^{123}$ and $R^{124}$ each independently represent a hydrogen atom or a monovalent organic group, and $*^1$ and $*^2$ each independently represent a bonding site with another structure.

<<$R^{121}$>>

In Formula (2), $R^{121}$ represents a divalent organic group. The divalent organic group is preferably a group including at least one of an aliphatic group (having preferably 1 to 24 carbon atoms, more preferably 1 to 12 carbon atoms, and particularly preferably 1 to 6 carbon atoms) or an aromatic group (having preferably 6 to 22 carbon atoms, more preferably 6 to 14 carbon atoms, and particularly preferably having 6 to 12 carbon atoms). Examples of the aromatic group constituting $R^{111}$ include the examples of $R^{111}$ of Formula (1). The above aliphatic group is preferably a linear aliphatic group. $R^{111}$ is preferably derived from 4,4'-oxydibenzoyl chloride.

<<$R^{122}$>>

In Formula (2), $R^{122}$ represents a tetravalent organic group. The tetravalent organic group is synonymous with $R^{115}$ in Formula (1) described above, and the same applies to the preferred range. $R^{122}$ is preferably derived from 2,2'-bis (3-amino-4-hydroxyphenyl) hexafluoropropane.

<<$R^{123}$ and $R^{124}$>>

$R^{123}$ and $R^{124}$ each independently represent a hydrogen atom or a monovalent organic group, are respectively synonymous with $R^{113}$ and $R^{114}$ in Formula (1) described above, and the same applies to the preferred range.

The specific polymer precursor containing a repeating unit represented by Formula (2) may contain another kind of repeating unit in addition to the repeating unit of Formula (2).

From the viewpoint that occurrence of warping of a cured film due to ring closure can be suppressed, the specific polymer precursor containing a repeating unit represented by Formula (2) still more preferably contains a diamine residue represented by Formula (SL) as another kind of repeating unit.

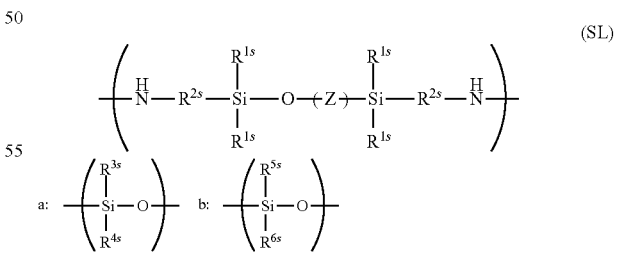

Z has an a structure and a b structure; $R^{1s}$ is a hydrogen atom or a hydrocarbon group having 1 to 10 carbon atoms (preferably 1 to 6 carbon atoms and more preferably 1 to 3 carbon atoms); $R^{2S}$ is a hydrocarbon group having 1 to 10 carbon atoms (preferably 1 to 6 carbon atoms and more preferably 1 to 3 carbon atoms); and at least one of $R^{3s}$, $R^{4s}$, $R^{5s}$, or $R^{6s}$ is an aromatic group (preferably having 6 to 22 carbon atoms, more preferably 6 to 18 carbon atoms, and particularly preferably 6 to 10 carbon atoms), and the rest are hydrogen atoms or organic groups having 1 to 30 carbon atoms (preferably 1 to 18 carbon atoms, more preferably 1 to 12 carbon atoms, and particularly preferably 1 to 6 carbon atoms), where the organic groups may be the same or different from each other. The polymerization of the a structure and the b structure may be block polymerization or random polymerization. In the Z portion, it is preferable that the a structure is 5% to 95% by mole, the b structure is 95% to 5% by mole, where a+b is 100% by mole.

In Formula (SL), examples of the preferred Z include one in which $R^{5S}$ and $R^{6s}$ in the b structure are a phenyl group. In addition, the molecular weight of the a structure represented by Formula (SL) is preferably 400 to 4,000 and more preferably 500 to 3,000. The molecular weight can be determined by gel permeation chromatography, which is generally used. In a case where the molecular weight is within the above-described range, it is possible to decrease an elastic modulus of the specific polymer precursor containing a repeating unit represented by Formula (2) after the dehydration ring closure and to achieve both effects of suppressing warping and improving solubility.

In a case where the specific polymer precursor containing a repeating unit represented by Formula (2) contains a diamine residue represented by Formula (SL) as another kind of repeating unit, it is preferable that a tetracarboxylic acid residue that remains after removing an acid dianhydride group from the tetracarboxylic acid dianhydride is further contained as a repeating unit from the viewpoint of improving the alkaline solubility of the curable resin composition. Examples of such a tetracarboxylic acid residue include the examples of $R^{115}$ in Formula (1).

The weight-average molecular weight (Mw) of the specific polymer precursor containing a repeating unit represented by Formula (2) is preferably 2,000 to 500,000, more preferably 5,000 to 100,000, and still more preferably 10,000 to 50,000. In addition, the number-average molecular weight (Mn) thereof is preferably 800 to 250,000, more preferably 2,000 to 50,000, and still more preferably 4,000 to 25,000.

The degree of variance of molecular weight of the specific polymer precursor containing a repeating unit represented by Formula (2) is preferably 1.5 to 3.5 and more preferably 2 to 3.

[Acid Value]

The acid value of the specific polymer precursor is 1 mmol/g or less, preferably 0.5 mmol/g or less, and more preferably 0.3 mmol/g or less.

The lower limit of the acid value is not particularly limited and may be 0 mmol/g or more.

In the present invention, the acid value refers to a quantity (mmol) of an acid group contained in 1 g of a specific polymer precursor.

The acid group refers to a group that is neutralized by an alkali (for example, sodium hydroxide) having a pH of 12 or more. In addition, the acid group is preferably a group having a pKa of 10 or less.

The acid value is measured by a known method, for example, by the method described in JIS K0070: 1992.

[Preferred Aspect of Specific Polymer Precursor]

The specific polymer precursor is a polyimide precursor or a polybenzoxazole precursor.

In a case where the specific polymer precursor is a polyimide precursor, the specific polymer precursor is preferably a polyimide precursor containing a repeating unit represented by Formula (1), more preferably a polyimide precursor containing a repeating unit represented by Formula (1) and a repeating unit represented by Formula (PI-A1), and still more preferably a polyimide precursor containing a repeating unit represented by Formula (1) and a repeating unit represented by Formula (PI-A2).

In a case where the specific polymer precursor is a polybenzoxazole precursor, the specific polymer precursor is preferably a polybenzoxazole precursor containing a repeating unit represented by Formula (2), more preferably a polybenzoxazole precursor containing a repeating unit represented by Formula (2) and a repeating unit represented by Formula (PB-A1), and still more preferably a polybenzoxazole precursor containing a repeating unit represented by Formula (2) and a repeating unit represented by Formula (PB-A2).

SPECIFIC EXAMPLE

Specific examples of the specific polymer precursor include PI-1 to PI-6 which are used in Examples described later.

Synthesis Method

The specific polymer precursor is synthesized, for example, by the synthetic method described in Synthesis Examples in Examples described later.

Specifically, for example, the specific polymer precursor is obtained by reacting a dicarboxylic acid or a dicarboxylic acid derivative with a diamine and then, during or after the reaction, reacting with a compound having a heterocyclic ring structure having two or more nitrogen atoms, an amino group, and the like.

Preferably, the specific polymer precursor is obtained by halogenating the above dicarboxylic acid or dicarboxylic acid derivative with a halogenating agent and then causing the resultant to be reacted with a diamine and a compound having a heterocyclic ring structure having two or more nitrogen atoms and an amino group.

The compound having a heterocyclic ring structure having two or more nitrogen atoms and an amino group is not particularly limited; however, examples thereof include, 1-(4-aminobenzyl)-1,2,4-triazole, (1H-tetrazol-5-ylmethyl) amine, and 2-aminopyrimidine.

In addition, for example, a tetracarboxylic acid or a tetracarboxylic acid derivative may be reacted with a compound that has a heterocyclic ring structure having two or more nitrogen atoms and has an amino group, and then the reactant may be reacted the diamine. As necessary, the tetracarboxylic acid or the tetracarboxylic acid derivative may be further reacted with a compound having a hydroxy group and a radically polymerizable group, and then the reactant may be reacted with the diamine. The reaction between the tetracarboxylic acid or the tetracarboxylic acid derivative and the compound having a hydroxy group and a radically polymerizable group may be carried out at any stage before, during, or after the reaction between the tetracarboxylic acid or the tetracarboxylic acid derivative and the compound having an amino group and a heterocyclic ring structure having two or more nitrogen atoms.

[Content]

From the viewpoint of improving the metal adhesiveness of the cured film to be obtained, the content of the specific polymer precursor in the curable resin composition according to the embodiment of the present invention is preferably 20% by mass or more, more preferably 30% by mass or more, and still more preferably 40% by mass or more, with respect to the total solid content of the curable resin composition.

From the viewpoint of improving the resolution of the curable resin composition, the upper limit of the above content is preferably 99.5% by mass or less, more preferably 99% by mass or less, still more preferably 98% by mass or less, even more preferably 97% by mass or less, and even still more preferably 95% by mass or less.

The curable resin composition according to the embodiment of the present invention may contain only one kind of specific polymer precursor or may contain two or more kinds thereof. In a case where two or more kinds thereof are contained, the total amount thereof is preferably within the above-described range.

<Another Heterocyclic Ring-Containing Polymer Precursor>

The curable resin composition according to the embodiment of the present invention may contain another heterocyclic ring-containing polymer precursor (hereinafter, also simply referred to as the "other polymer precursor") which is different from the above-described specific polymer precursor and does not have a heterocyclic ring containing two or more nitrogen atoms.

The curable resin composition according to the embodiment of the present invention more preferably contains, as the other polymer precursor, at least one precursor selected from the group consisting of a polyimide precursor and a polybenzoxazole precursor, and preferably contains a polyimide precursor.

[Polyimide Precursor]

From the viewpoint of the film hardness of the cured film to be obtained, the polyimide precursor preferably has the repeating unit represented by Formula (1) in the above-described specific polymer precursor.

In the polyimide precursor, the repeating unit represented by Formula (1) may be one kind or two or more kinds. In addition, the polyimide precursor may contain structural isomers of the repeating unit represented by Formula (1). In addition, the polyimide precursor may also contain another kind of repeating unit in addition to the above repeating unit represented by Formula (1).

As one embodiment of the polyimide precursor in the present invention, a polyimide precursor in which the repeating unit represented by Formula (1) accounts for 50% by mole or more, further 70% by mole or more, and particularly 90% by mole or more in the entirety of the repeating units is exemplified. The upper limit is practically 100% by mole or less.

The weight-average molecular weight (Mw) of the polyimide precursor is preferably 2,000 to 500,000, more preferably 5,000 to 100,000, and still more preferably 10,000 to 50,000. In addition, the number-average molecular weight (Mn) thereof is preferably 800 to 250,000, more preferably 2,000 to 50,000, and still more preferably 4,000 to 25,000.

The degree of variance of molecular weight of the polyimide precursor is preferably 1.5 to 3.5 and more preferably 2 to 3.

The polyimide precursor is obtained by reacting a dicarboxylic acid or a dicarboxylic acid derivative with a diamine. Preferably, the polyimide precursor is obtained by halogenating a dicarboxylic acid or a dicarboxylic acid derivative with a halogenating agent and then causing the resultant to be reacted with a diamine.

In the method for manufacturing the polyimide precursor, it is preferable to use an organic solvent at the time of reaction. One kind of organic solvent may be used, or two or more kinds thereof may be used.

The organic solvent can be appropriately determined according to raw materials, and examples thereof include pyridine, diethylene glycol dimethyl ether (diglyme), N-methylpyrrolidone, and N-ethylpyrrolidone.

In a case of producing the polyimide precursor, it is preferable to include a step of depositing a solid. Specifically, the polyimide precursor in the reaction solution is deposited as a solid in water and dissolved in a solvent in which the polyimide precursor such as tetrahydrofuran or the like can be solubilized, and then the solid can be deposited.

[Polybenzoxazole Precursor]

The polybenzoxazole precursor preferably contains the above-described repeating unit represented by Formula (2).

In addition, the polybenzoxazole precursor may contain another kind of repeating unit in addition to the repeating unit of Formula (2).

From the viewpoint that occurrence of warping of a cured film due to ring closure can be suppressed, the polybenzoxazole precursor preferably further contains the above-described diamine residue represented by Formula (SL) as another kind of repeating unit.

In a case where the polybenzoxazole precursor contains a diamine residue represented by Formula (SL) as another kind of repeating unit, it is preferable that a tetracarboxylic acid residue that remains after removing an acid dianhydride group from the tetracarboxylic acid dianhydride is further contained as a repeating unit from the viewpoint of improving the alkaline solubility of the curable resin composition. Examples of such a tetracarboxylic acid residue include the examples of $R^{115}$ in Formula (1).

The weight-average molecular weight (Mw) of the polybenzoxazole precursor is preferably 2,000 to 500,000, more preferably 5,000 to 100,000, and still more preferably 10,000 to 50,000. In addition, the number-average molecular weight (Mn) thereof is preferably 800 to 250,000, more preferably 2,000 to 50,000, and still more preferably 4,000 to 25,000.

The degree of variance of molecular weight of the polybenzoxazole precursor is preferably 1.5 to 3.5 and more preferably 2 to 3.

In a case where the curable resin composition according to the embodiment of the present invention contains the other polymer precursor, the content of the other polymer precursor is preferably 0.01% by mass or more, more preferably 0.1% by mass or more, still more preferably 1% by mass or more, even still more preferably 2% by mass or more, even still more preferably 5% by mass or more, and even further still more preferably 10% by mass or more, with respect to the total solid content of the curable resin composition. In addition, the content of the other polymer precursor in the curable resin composition according to the embodiment of the present invention is preferably 99.5% by mass or less, more preferably 99% by mass or less, still more preferably 98% by mass or less, even more preferably 97% by mass or less, and even still more preferably 95% by mass or less, with respect to the total solid content of the curable resin composition.

The curable resin composition according to the embodiment of the present invention may contain only one kind of other polymer precursor or may contain two or more kinds thereof. In a case where two or more kinds thereof are contained, the total amount thereof is preferably within the above-described range.

<Onium Salt>

The curable resin composition according to the embodiment of the present invention preferably contains an onium salt.

The kind of onium salt is not particularly specified; however, preferred examples thereof include an ammonium salt, an iminium salt, a sulfonium salt, an iodonium salt, and a phosphonium salt.

Among these, an ammonium salt or an iminium salt is preferable from the viewpoint that heat stability is high, and a sulfonium salt, an iodonium salt, or a phosphonium salt is preferable from the viewpoint of compatibility with a polymer.

Further, the onium salt is a salt of a cation having an onium structure and an anion, and the cation and the anion may be or may not be bonded through a covalent bond.

That is, the onium salt may be an intramolecular salt having a cation moiety and an anion moiety in the same molecular structure, or may be an intermolecular salt in which a cation molecule and an anion molecule, which are separate molecules, are ionically bonded; however, an intermolecular salt is preferred. Further, in the curable resin composition according to the embodiment of the present invention, the cation moiety or the cation molecule and the anion moiety or the anion molecule may be bonded by the ionic bonding or be dissociated from each other.

The cation in the onium salt is preferably an ammonium cation, a pyridinium cation, a sulfonium cation, an iodonium cation, or a phosphonium cation, and more preferably at least one cation selected from the group consisting of a tetraalkylammonium cation, a sulfonium cation, and an iodonium cation.

The onium salt that is used in the present invention may be a thermal-base generator.

The thermal-base generator refers to a compound that generates a base by heating, and examples thereof include an acidic compound that generates a base in a case of being heated to 40° C. or higher.

[Ammonium Salt]

In the present invention, the ammonium salt means a salt of an ammonium cation and an anion.

—Ammonium Cation—

The ammonium cation is preferably a quaternary ammonium cation.

In addition, the ammonium cation is preferably a cation represented by Formula (101).

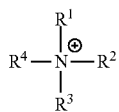

(101)

In Formula (101), $R^1$ to $R^4$ each independently represent a hydrogen atom or a hydrocarbon group, and at least two of $R^1$ to $R^4$ may be each bonded to form a ring.

In Formula (101), $R^1$ to $R^4$ are each independently preferably a hydrocarbon group, more preferably an alkyl group or an aryl group, and still more preferably an alkyl group having 1 to 10 carbon atoms or an aryl group having 6 to 12 carbon atoms. $R^1$ to $R^4$ may have a substituent, and examples of the substituent include a hydroxy group, an aryl group, an alkoxy group, an aryloxy group, an arylcarbonyl group, an alkylcarbonyl group, an alkoxycarbonyl group, an aryloxycarbonyl group, and an acyloxy group.

In a case where at least two of $R^1$ to $R^4$ are each bonded to form a ring, the ring may contain a heteroatom. Examples of the heteroatom include a nitrogen atom.

The ammonium cation is preferably represented by any one of Formula (Y1-1) and Formula (Y1-2).

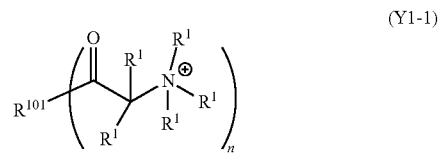

(Y1-1)

(Y1-2)

In Formulae (Y1-1) and (Y1-2), $R^{101}$ represents an n-valent organic group, $R^1$ is synonymous with $R^1$ in Formula (101), $Ar^{101}$ and $Ar^{102}$ each independently represent an aryl group, and n represents an integer of 1 or more.

In Formula (Y1-1), $R^{101}$ is preferably a group obtained by removing n pieces of hydrogen atoms from an aliphatic hydrocarbon or an aromatic hydrocarbon, or from a structure in which the aliphatic hydrocarbon is bonded to the aromatic hydrocarbon, and more preferably a group obtained by removing n pieces of hydrogen atoms from a saturated aliphatic hydrocarbon having 2 to 30 carbon atoms, benzene, or naphthalene.

In Formula (Y1-1), n is preferably 1 to 4, more preferably 1 or 2, and still more preferably 1.

In Formula (Y1-2), $Ar^{101}$ and $Ar^{102}$ are each independently preferably a phenyl group or a naphthyl group and more preferably a phenyl group.

—Anion—

The anion in the ammonium salt is preferably an anion selected from a carboxylate anion, a phenol anion, a phosphate anion, or a sulfate anion, and more preferably a carboxylate anion since both the stability and thermal decomposability of the salt can be achieved. That is, the ammonium salt is more preferably a salt of an ammonium cation and a carboxylate anion.

The carboxylate anion is preferably a divalent or more high-valent carboxylate anion having two or more carboxy groups and more preferably a divalent carboxylate anion. According to this aspect, it is possible to improve the stability, the curing properties, and the developability of the curable resin composition. In particular, in a case where a divalent carboxylate anion is used, the stability, curability, and developability of the curable resin composition can be further improved.

The carboxylate anion is preferably represented by Formula (X1).

(X1)

In Formula (X1), EWG represents an electron-withdrawing group.

In the present embodiment, the electron-withdrawing group means a group of which the Hammett's substituent constant σm is a positive value. The σm is described in detail in a review article by TSUNO Yuho, in Journal of Synthetic Organic Chemistry, Japan, Vol. 23, No. 8, p. 631 to 642 (1965). The electron-withdrawing group in the present embodiment is not limited to the substituents described in the above document.

Examples of the substituent of which the σm is a positive value include a $CF_3$ group (σm=0.43), a $CF_3C(=O)$ group (σm=0.63), a HC≡C group (σm=0.21), a $CH_2=CH$ group (σm=0.06), a Ac group (σm=0.38), a $MeOC(=O)$ group (σm=0.37), a $MeC(=O)CH=CH$ group (σm=0.21), a $PhC(=O)$ group (σm=0.34), and a $H_2NC(=O)CH_2$ group (σm=0.06). Here, Me represents a methyl group, Ac represents an acetyl group, and Ph represents a phenyl group (hereinafter, the same applies).

The EWG is preferably a group represented by Formulae (EWG-1) to (EWG-6).

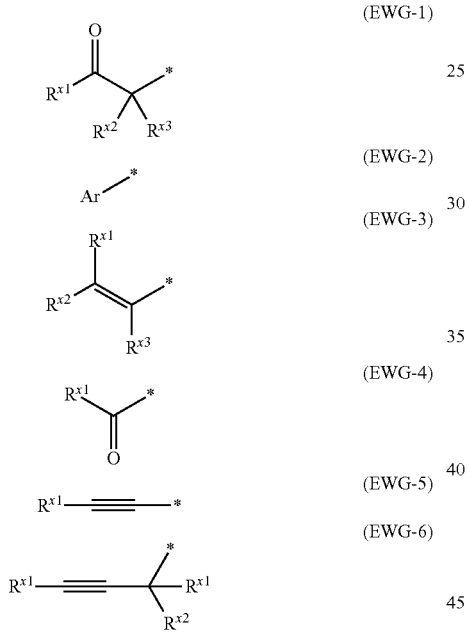

In Formulae (EWG-1) to (EWG-6), $R^{x1}$ to $R^{x3}$ each independently represent a hydrogen atom, an alkyl group, an alkenyl group, an aryl group, a hydroxy group, or a carboxy group, and Ar represents an aromatic group.

In the present invention, the carboxylate anion is preferably represented by Formula (XA).

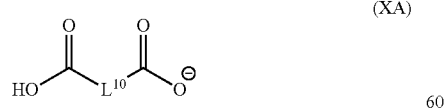

In Formula (XA), $L^{10}$ represents a single bond or a divalent linking group selected from the group consisting of an alkylene group, an alkenylene group, an aromatic group, $-NR^X-$, and a combination thereof, and $R^X$ represents a hydrogen atom, an alkyl group, an alkenyl group, or an aryl group.

Specific examples of the carboxylate anion include a maleate anion, a phthalate anion, an N-phenyliminodiacetate anion, and an oxalate anion.

From the viewpoint that the cyclization of the specific precursor is easily carried out at a low temperature and the storage stability of the curable resin composition is easily improved, in the present invention, the onium salt contains an ammonium cation as a cation, and the onium salt preferably contains an anion of which the conjugate acid has a pKa (a pKaH) of 2.5 or less and more preferably has a pKa of 1.8 or less, as an anion.

The lower limit of the pKa is not particularly limited; however, it is preferably −3 or more and more preferably −2 or more, from the viewpoint that the generated base is not easily neutralized and the cyclization efficiency of the specific precursor or the like is improved.

Regarding the pKa, values described in Determination of Organic Structures by Physical Methods (authors: Brown, H. C., McDaniel, D. H., Hafliger, O., Nachod, F. C.; editors: Braude, E. A., Nachod, F. C.; Academic Press, New York, 1955) or Data for Biochemical Research (authors: Dawson, R. M. C. et al; Oxford, Clarendon Press, 1959) can be referred to. Regarding compounds not described in these documents, values calculated from the structural formulae by using software of ACD/pKa (manufactured by ACD/Labs) are used.

Specific examples of the ammonium salt include compounds shown below; however, the present invention is not limited thereto.

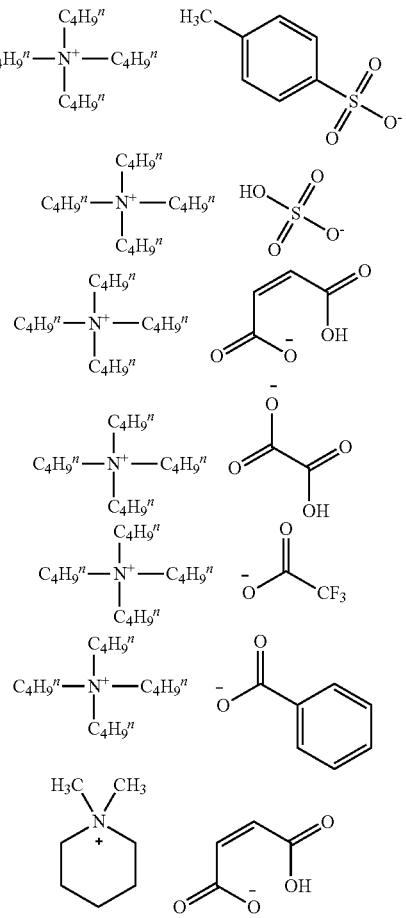

-continued

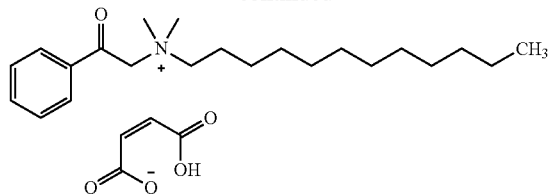

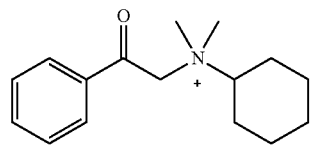

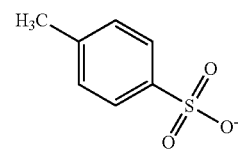

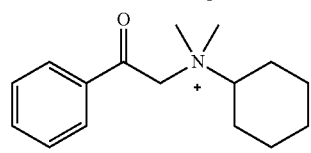

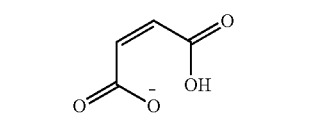

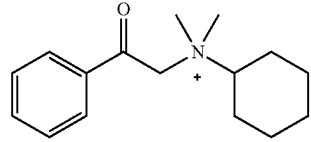

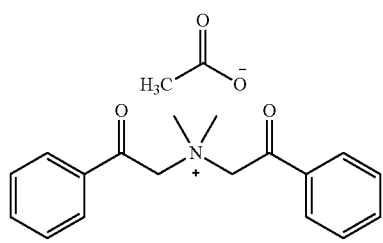

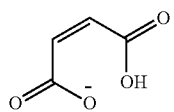

[Iminium Salt]

In the present invention, the iminium salt means a salt of an iminium cation and an anion. Examples of the anion include the same anions as those in the ammonium salt described above, and the same applies to the preferred aspect.

—Iminium Cation—

The iminium cation is preferably a pyridinium cation.

In addition, the iminium cation is also preferably a cation represented by Formula (102).

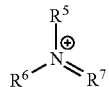

(102)

In Formula (102), $R^5$ and $R^6$ each independently represent a hydrogen atom or a hydrocarbon group, $R^7$ represents a hydrocarbon group, and at least two of $R^5$ to $R^7$ may be each bonded to form a ring.

In Formula (102), $R^5$ and $R^6$ are synonymous with $R^1$ to $R^4$ in Formula (101) described above, and the same applies to the preferred aspect.

In Formula (102), $R^7$ is preferably bonded to at least one of $R^5$ or $R^6$ to form a ring. The ring may contain a heteroatom. Examples of the heteroatom include a nitrogen atom. In addition, the ring is preferably a pyridine ring.

The iminium cation is preferably an iminium cation represented by any one of Formulae (Y1-3) to (Y1-5).

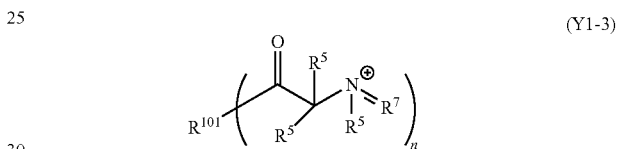

(Y1-3)

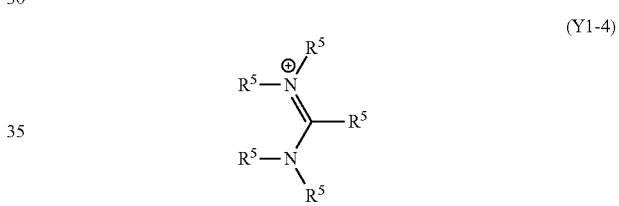

(Y1-4)

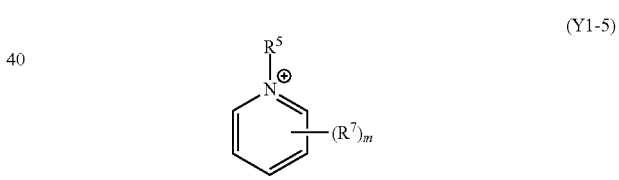

(Y1-5)

In Formulae (Y1-3) to (Y1-5), $R^{101}$ represents an n-valent organic group, $R^5$ is synonymous with $R^5$ in Formula (102), $R^7$ is synonymous with $R^7$ in Formula (102), and n and m represent integers of 1 or more.

In Formula (Y1-3), $R^{101}$ is preferably a group obtained by removing n pieces of hydrogen atoms from an aliphatic hydrocarbon or an aromatic hydrocarbon, or from a structure in which the aliphatic hydrocarbon is bonded to the aromatic hydrocarbon, and more preferably a group obtained by removing n pieces of hydrogen atoms from a saturated aliphatic hydrocarbon having 2 to 30 carbon atoms, benzene, or naphthalene.

In Formula (Y1-3), n is preferably 1 to 4, more preferably 1 or 2, and still more preferably 1.

In Formula (Y1-5), m is preferably 1 to 4, more preferably 1 or 2, and still more preferably 1.

Specific examples of the iminium salt include compounds shown below; however, the present invention is not limited thereto.

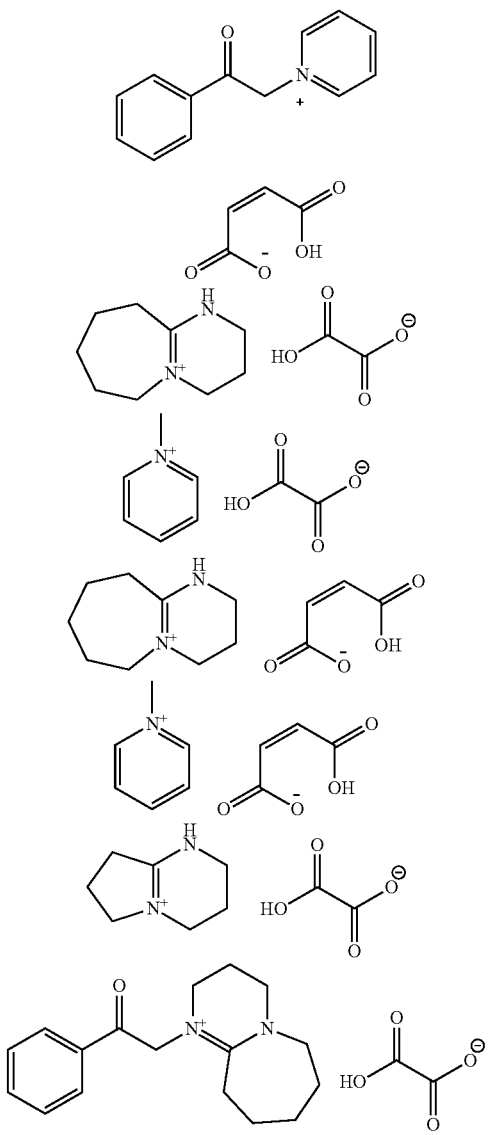

[Sulfonium Salt]

In the present invention, the sulfonium salt means a salt of a sulfonium cation and an anion. Examples of the anion include the same anions as those in the ammonium salt described above, and the same applies to the preferred aspect.

—Sulfonium Cation—

The sulfonium cation is preferably a tertiary sulfonium cation and more preferably a triaryl sulfonium cation.

In addition, the sulfonium cation is preferably a cation represented by Formula (103).

In Formula (103), $R^8$ to $R^{10}$ each independently represent a hydrocarbon group.

$R^8$ to $R^{10}$ are each independently preferably an alkyl group or an aryl group, more preferably an alkyl group having 1 to 10 carbon atoms or an aryl group having 6 to 12 carbon atoms, still more preferably an aryl group having 6 to 12 carbon atoms, and even still more preferably a phenyl group.

$R^8$ to $R^{10}$ may have a substituent, and examples of the substituent include a hydroxy group, an aryl group, an alkoxy group, an aryloxy group, an arylcarbonyl group, an alkylcarbonyl group, an alkoxycarbonyl group, an aryloxycarbonyl group, and an acyloxy group. Among these, $R^8$ to $R^{10}$ preferably have an alkyl group or an alkoxy group as the substituent, more preferably has a branched alkyl group or an alkoxy group, and still more preferably has a branched alkyl group having 3 to 10 carbon atoms or an alkoxy group having 1 to 10 carbon atoms.

$R^8$ to $R^{10}$ may be the same group or different groups; however, from the viewpoint of synthesis compatibility, $R^8$ to $R^{10}$ are preferably the same group.

[Iodonium Salt]

In the present invention, the iodonium salt means a salt of an iodonium cation and an anion. Examples of the anion include the same anions as those in the ammonium salt described above, and the same applies to the preferred aspect.

—Iodonium Cation—

The iodonium cation is preferably a diaryl iodonium cation.

In addition, the iodonium cation is preferably a cation represented by Formula (104).

In Formula (104), $R^{11}$ and $R^{12}$ each independently represent a hydrocarbon group.

$R^{11}$ and $R^{12}$ are each independently preferably an alkyl group or an aryl group, more preferably an alkyl group having 1 to 10 carbon atoms or an aryl group having 6 to 12 carbon atoms, still more preferably an aryl group having 6 to 12 carbon atoms, and even still more preferably a phenyl group.

$R^{11}$ and $R^{12}$ may have a substituent, and examples of the substituent include a hydroxy group, an aryl group, an alkoxy group, an aryloxy group, an arylcarbonyl group, an alkylcarbonyl group, an alkoxycarbonyl group, an aryloxycarbonyl group, and an acyloxy group. Among these, $R^{11}$ and $R^{12}$ preferably have an alkyl group or an alkoxy group as the substituent, more preferably has a branched alkyl group or an alkoxy group, and still more preferably has a branched alkyl group having 3 to 10 carbon atoms or an alkoxy group having 1 to 10 carbon atoms.

$R^{11}$ and $R^{12}$ may be the same group or different groups; however, from the viewpoint of synthesis compatibility, $R^{11}$ and $R^{12}$ are preferably the same group.

[Phosphonium Salt]

In the present invention, the phosphonium salt means a salt of a phosphonium cation and an anion. Examples of the anion include the same anions as those in the ammonium salt described above, and the same applies to the preferred aspect.

—Phosphonium Cation—

The phosphonium cation is preferably a quaternary phosphonium cation, and examples thereof include a tetraalkylphosphonium cation and a triarylmonoalkylphosphonium cation.

In addition, the phosphonium cation is preferably a cation represented by Formula (105).

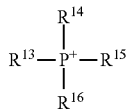

(105)

In Formula (105), $R^{13}$ to $R^{16}$ each independently represent a hydrogen atom or a hydrocarbon group.

$R^{13}$ to $R^{16}$ are each independently preferably an alkyl group or an aryl group, more preferably an alkyl group having 1 to 10 carbon atoms or an aryl group having 6 to 12 carbon atoms, still more preferably an aryl group having 6 to 12 carbon atoms, and even still more preferably a phenyl group.

$R^{13}$ to $R^{16}$ may have a substituent, and examples of the substituent include a hydroxy group, an aryl group, an alkoxy group, an aryloxy group, an arylcarbonyl group, an alkylcarbonyl group, an alkoxycarbonyl group, an aryloxycarbonyl group, and an acyloxy group. Among these, $R^{13}$ to $R^{16}$ preferably have an alkyl group or an alkoxy group as the substituent, more preferably has a branched alkyl group or an alkoxy group, and still more preferably has a branched alkyl group having 3 to 10 carbon atoms or an alkoxy group having 1 to 10 carbon atoms.

$R^{13}$ to $R^{16}$ may be the same group or different groups; however, from the viewpoint of synthesis compatibility, $R^{13}$ to $R^{16}$ are preferably the same group.

In a case where the curable resin composition according to the embodiment of the present invention contains an onium salt, the content of the onium salt is preferably 0.1% to 50% by mass with respect to the total solid content of the curable resin composition according to the embodiment of the present invention. The lower limit thereof is more preferably 0.5% by mass or more, still more preferably 0.85% by mass or more, and even still more preferably 1% by mass or more. The upper limit thereof is more preferably 30% by mass or less, still more preferably 20% by mass or less, and even still more preferably 10% by mass or less, and may be 5% by mass or less or may be 4% by mass or less.

One kind or two or more kinds of onium salts can be used. In a case where two or more kinds thereof are used, the total amount is preferably within the above-described range.

<Base Generator>

The curable resin composition according to the embodiment of the present invention may contain a thermal-base generator.

The thermal-base generator may be a compound corresponding to the above-described onium salt or may be a thermal-base generator other than the above-described onium salt.

Examples of the other thermal-base generator include a nonionic thermal-base generator.

Examples of the nonionic thermal-base generator include a compound represented by Formula (B1) or Formula (B2).

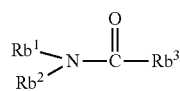

(B1)

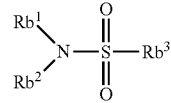

(B2)

In Formulae (B1) and (B2), $Rb^1$, $Rb^2$, and $Rb^3$ are each independently an organic group that does not have a tertiary amine structure, a halogen atom, or a hydrogen atom. However, $Rb^1$ and $Rb^2$ are not hydrogen atoms at the same time. Further, none of $Rb^1$, $Rb^2$, and $Rb^3$ have a carboxy group. In the present specification, the tertiary amine structure refers to a structure in which all three bonding sites of a trivalent nitrogen atom are covalently bonded to hydrocarbon-based carbon atoms. For this reason, this is not applied in a case where the carbon atom to which the bonding site bonded is a carbon atom forming a carbonyl group, that is, in a case where an amide group is formed by bonding together with a nitrogen atom.

In Formulae (B1) and (B2), a cyclic ring structure is preferably contained in at least one of $Rb^1$, $Rb^2$, or $Rb^3$ and is more preferably contained in at least two thereof. The cyclic ring structure may be any one of a monocyclic ring or a fused ring and is preferably a monocyclic ring or a fused ring in which two monocyclic rings are fused. The monocyclic ring is preferably a 5-membered ring or a 6-membered ring, and more preferably a 6-membered ring. The monocyclic ring is preferably a cyclohexane ring or a benzene ring, and more preferably a cyclohexane ring.

More specifically, $Rb^1$ and $Rb^2$ are preferably a hydrogen atom, an alkyl group (preferably having 1 to 24 carbon atoms, more preferably having 2 to 18 carbon atoms, and still more preferably having 3 to 12 carbon atoms), an alkenyl group (preferably having 2 to 24 carbon atoms, more preferably having 2 to 18 carbon atoms, and still more preferably having 3 to 12 carbon atoms), an aryl group (preferably having 6 to 22 carbon atoms, more preferably having 6 to 18 carbon atoms, and still more preferably having 6 to 10 carbon atoms), or an arylalkyl group (preferably having 7 to 25 carbon atoms, more preferably having 7 to 19 carbon atoms, and still more preferably having 7 to 12 carbon atoms). These groups may have substituents as long as the effects of the present invention are exhibited. $Rb^1$ and $Rb^2$ may be bonded to each other to form a ring. The ring to be formed is preferably a 4- to 7-membered nitrogen-containing heterocyclic ring. Particularly, $Rb^1$ and $Rb^2$ are preferably a linear, branched, or cyclic alkyl groups (preferably having 1 to 24 carbon atoms, more preferably 2 to 18 carbon atoms, and still more preferably having 3 to 12 carbon atoms) which may have a substituent, more preferably a cycloalkyl group (preferably having 3 to 24 carbon atoms, more preferably having 3 to 18 carbon atoms, and still more preferably having 3 to 12 carbon atoms) which may have a substituent, and still more preferably a cyclohexyl group which may have a substituent.

Examples of $Rb^3$ include an alkyl group (preferably having 1 to 24 carbon atoms, more preferably having 2 to 18 carbon atoms, and still more preferably having 3 to 12 carbon atoms), an aryl group (preferably having 6 to 22 carbon atoms, more preferably having 6 to 18 carbon atoms, and still more preferably having 6 to 10 carbon atoms), an alkenyl group (preferably having 2 to 24 carbon atoms, more preferably having 2 to 12 carbon atoms, and still more preferably having 2 to 6 carbon atoms), an arylalkyl group (preferably having 7 to 23 carbon atoms, more preferably having 7 to 19 carbon atoms, and still more preferably having 7 to 12 carbon atoms), an arylalkenyl group (preferably having 8 to 24 carbon atoms, more preferably having 8 to 20 carbon atoms, and still more preferably having 8 to 16 carbon atoms), an alkoxy group (preferably having 1 to 24 carbon atoms, more preferably having 2 to 18 carbon atoms, and still more preferably having 3 to 12 carbon atoms), an aryloxy group (preferably having 6 to 22 carbon atoms, more preferably having 6 to 18 carbon atoms, and still more preferably having 6 to 12 carbon atoms), and an arylalkyloxy group (preferably having 7 to 23 carbon atoms, more preferably having 7 to 19 carbon atoms, and still more preferably having 7 to 12 carbon atoms). Among the above, a cycloalkyl group (preferably having 3 to 24 carbon atoms, more preferably 3 to 18 carbon atoms, and still more preferably 3 to 12 carbon atoms), an arylalkenyl group, or an arylalkyloxy group is preferable. $Rb^3$ may further have a substituent as long as the effects of the present invention are exhibited.

The compound represented by Formula (B1) is preferably a compound represented by Formula (B1-1) or Formula (B1-2).

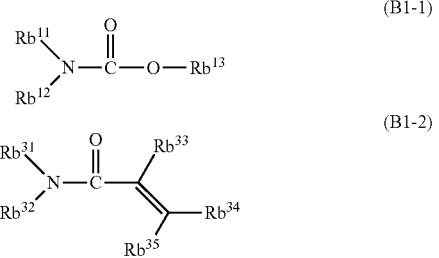

In the formula, $Rb^{11}$ and $Rb^{12}$, and $Rb^{31}$ and $Rb^{32}$ are each the same as $Rb^1$ and $Rb^2$ in Formula (B1).

$Rb^{13}$ is an alkyl group (preferably having 1 to 24 carbon atoms, more preferably having 2 to 18 carbon atoms, and still more preferably having 3 to 12 carbon atoms), an alkenyl group (preferably having 2 to 24 carbon atoms, more preferably having 2 to 18 carbon atoms, and still more preferably having 3 to 12 carbon atoms), an aryl group (preferably having 6 to 22 carbon atoms, more preferably having 6 to 18 carbon atoms, and still more preferably having 6 to 12 carbon atoms), or an arylalkyl group (preferably having 7 to 23 carbon atoms, more preferably having 7 to 19 carbon atoms, and still more preferably having 7 to 12 carbon atoms), and may have a substituent as long as the effects of the present invention are exhibited. Among the above, $Rb^{13}$ is preferably an arylalkyl group.

$Rb^{33}$ and $Rb^{34}$ are each independently a hydrogen atom, an alkyl group (preferably having 1 to 12 carbon atoms, more preferably having 1 to 8 carbon atoms, and still more preferably having 1 to 3 carbon atoms), an alkenyl group (preferably having 2 to 12 carbon atoms, more preferably having 2 to 8 carbon atoms, and still more preferably having 2 or 3 carbon atoms), an aryl group (preferably having 6 to 22 carbon atoms, more preferably having 6 to 18 carbon atoms, and still more preferably having 6 to 10 carbon atoms), or an arylalkyl group (preferably having 7 to 23 carbon atoms, more preferably having 7 to 19 carbon atoms, and still more preferably having 7 to 11 carbon atoms), and preferably a hydrogen atom.

$Rb^{35}$ is an alkyl group (preferably having 1 to 24 carbon atoms, more preferably having 1 to 12 carbon atoms, and still more preferably having 3 to 8 carbon atoms), an alkenyl group (preferably having 2 to 12 carbon atoms, more preferably having 2 to 10 carbon atoms, and still more preferably having 3 to 8 carbon atoms), an aryl group (preferably having 6 to 22 carbon atoms, more preferably having 6 to 18 carbon atoms, and still more preferably having 6 to 12 carbon atoms), or an arylalkyl group (preferably having 7 to 23 carbon atoms, more preferably having 7 to 19 carbon atoms, and still more preferably having 7 to 12 carbon atoms), and is preferably an aryl group.

The compound represented by Formula (B1-1) is preferably a compound represented by Formula (B1-1a) as well.

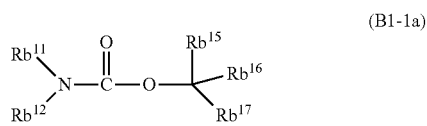

$Rb^{11}$ and $Rb^{12}$ are respectively synonymous with $Rb^{11}$ and $Rb^{12}$ in Formula (B1-1).

$Rb^{15}$ and $Rb^{16}$ are a hydrogen atom, an alkyl group (preferably having 1 to 12 carbon atoms, more preferably having 1 to 6 carbon atoms, and still more preferably having 1 to 3 carbon atoms), an alkenyl group (preferably having 2 to 12 carbon atoms, more preferably having 2 to 6 carbon atoms, and still more preferably having 2 or 3 carbon atoms), an aryl group (preferably having 6 to 22 carbon atoms, more preferably having 6 to 18 carbon atoms, and still more preferably having 6 to 10 carbon atoms), or an arylalkyl group (preferably having 7 to 23 carbon atoms, more preferably having 7 to 19 carbon atoms, and still more preferably having 7 to 11 carbon atoms), and preferably a hydrogen atom or a methyl group.

$Rb^{17}$ is an alkyl group (preferably having 1 to 24 carbon atoms, more preferably having 1 to 12 carbon atoms, and still more preferably having 3 to 8 carbon atoms), an alkenyl group (preferably having 2 to 12 carbon atoms, more preferably having 2 to 10 carbon atoms, and still more preferably having 3 to 8 carbon atoms), an aryl group (preferably having 6 to 22 carbon atoms, more preferably having 6 to 18 carbon atoms, and still more preferably having 6 to 12 carbon atoms), or an arylalkyl group (preferably having 7 to 23 carbon atoms, more preferably having 7 to 19 carbon atoms, and still more preferably having 7 to 12 carbon atoms), and among the above, is preferably an aryl group.

The molecular weight of the nonionic thermal-base generator is preferably 800 or less, more preferably 600 or less, and still more preferably 500 or less. The lower limit thereof is preferably 100 or more, more preferably 200 or more, and still more preferably 300 or more.

Among the above-described onium salts, specific examples of the compound which is a thermal-base generator or specific examples of the other thermal-base generators include the following compounds.

(A-1)
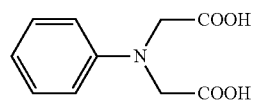
(A-2)
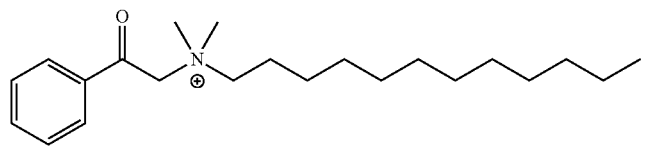 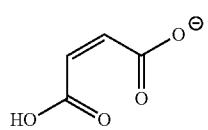
(A-3)
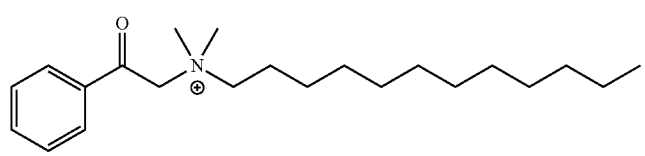 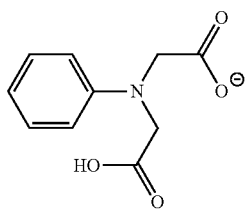
(A-4)
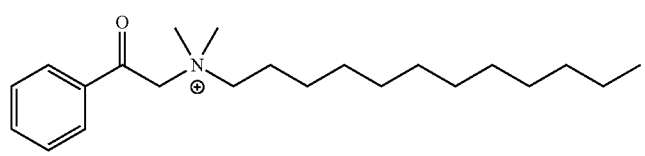 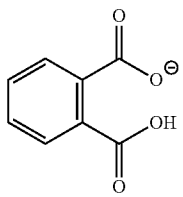
(A-5)
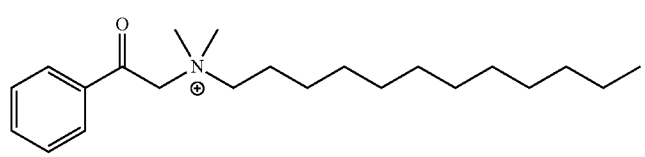 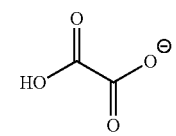
(A-6)
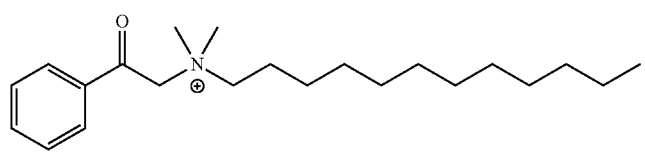 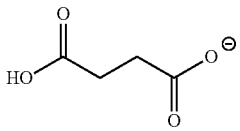
(A-7)
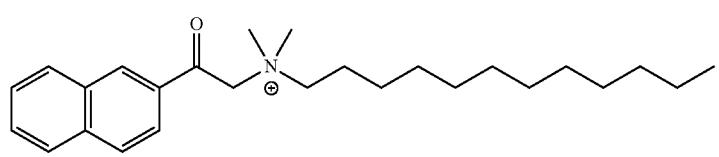 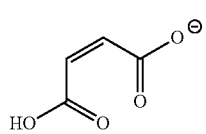
(A-8)
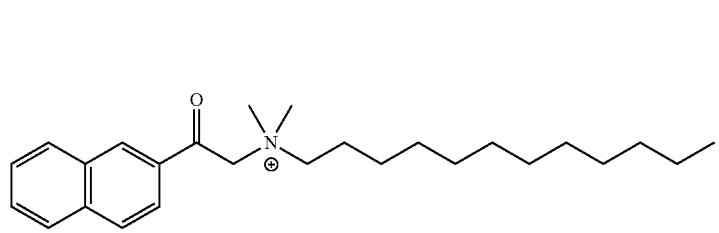 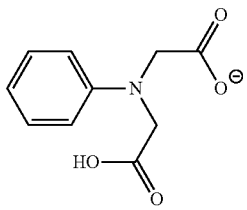
(A-9)
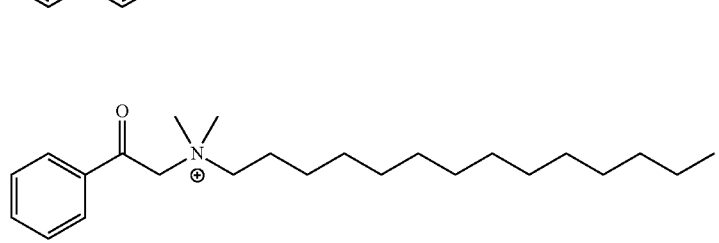 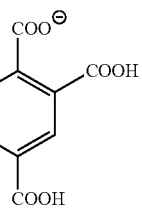

-continued
(A-10)
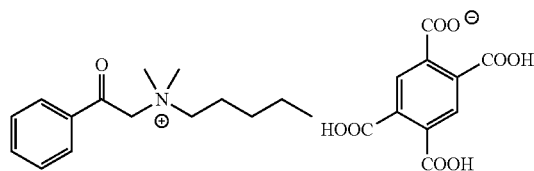
(A-11)
(A-12)
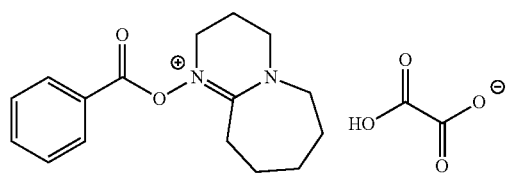
(A-13)
(A-14)
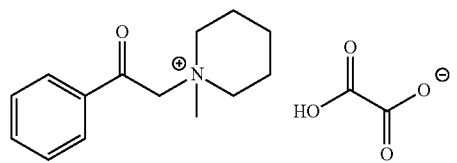
(A-15)
(A-16)
(A-17)
(A-18)
(A-19)
(A-20)
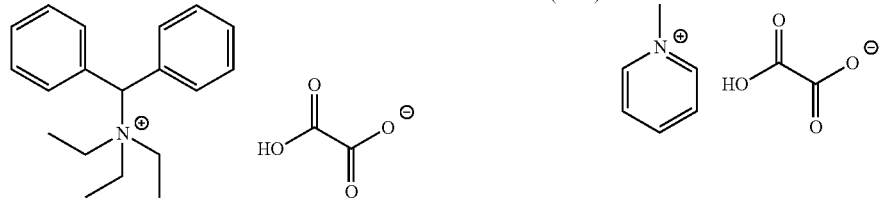
(A-21)
(A-22)
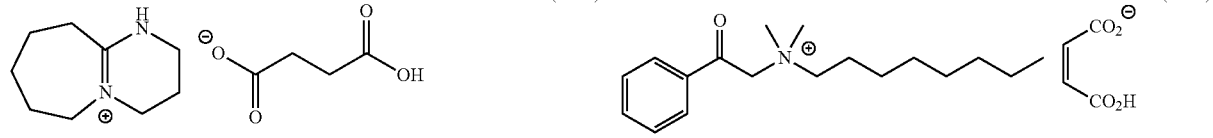
(A-23)
(A-24)
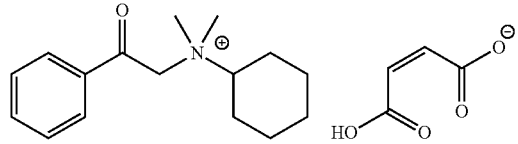
(A-25)
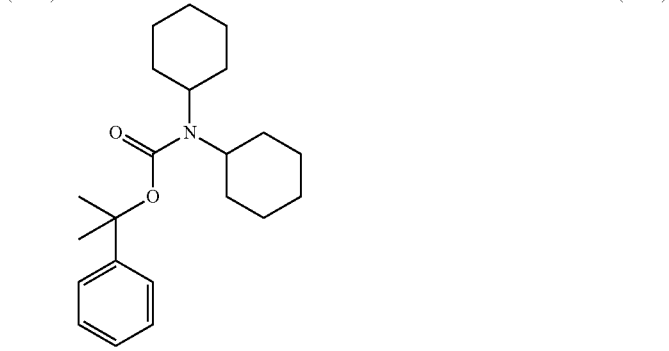

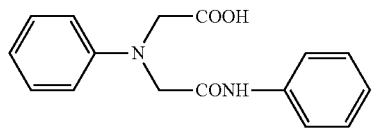
(A-26)

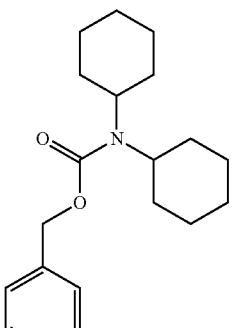
(A-27)

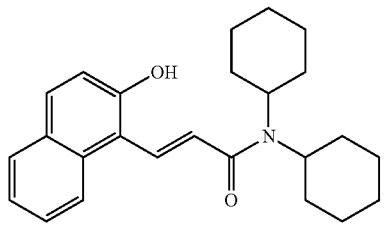
(A-28)

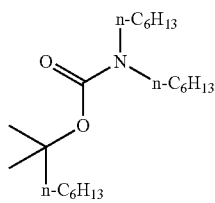

(A-29)

(A-30)

The content of thermal-base generator is preferably 0.1% to 50% by mass with respect to the total solid content of the curable resin composition according to the embodiment of the present invention. The lower limit thereof is more preferably 0.5% by mass or more and still more preferably 1% by mass or more. The upper limit thereof is more preferably 30% by mass or less and still more preferably 20% by mass or less. One kind or two or more kinds of thermal-base generators can be used. In a case where two or more kinds thereof are used, the total amount is preferably within the above-described range.

<Photopolymerization Initiator>

The curable resin composition according to the embodiment of the present invention preferably contains a photopolymerization initiator.

The photopolymerization initiator is preferably a photoradical polymerization initiator. The photoradical polymerization initiator is not particularly limited and can be appropriately selected from known photoradical polymerization initiators. For example, a photoradical polymerization initiator having photosensitivity to rays ranging from an ultraviolet light range to a visible light range is preferable. In addition, the photoradical polymerization initiator may be an activator that produces an active radical by any action with a photo-excited sensitizer.

The photoradical polymerization initiator preferably contains at least one compound having a molar absorption coefficient of at least about 50 L·mol$^{-1}$·cm$^{-1}$) within a range of about 300 to 800 nm (preferably 330 to 500 nm). The molar absorption coefficient of a compound can be measured using a conventionally known method. For example, it is preferable to carry out a measurement at a concentration of 0.01 g/L using an ethyl acetate solvent with an ultraviolet-visible spectrophotometer (Cary-5 spectrophotometer manufactured by Varian Medical Systems, Inc.).

As the photoradical polymerization initiator, any known compound can be used. Examples thereof include a halogenated hydrocarbon derivative (for example, a compound having a triazine skeleton, a compound having an oxadiazole skeleton, or a compound having a trihalomethyl group), an acylphosphine compound such as an acylphosphine oxide, hexaarylbiimidazole, an oxime compound such as an oxime derivative, an organic peroxide, a thio compound, a ketone compound, an aromatic onium salt, a keto oxime ether, an aminoacetophenone compound, hydroxyacetophenone, an azo-based compound, an azide compound, a metallocene compound, an organic boron compound, and an iron arene complex. With regard to details thereof, reference can be made to the description of paragraphs 0165 to 0182 of JP2016-027357A and paragraphs 0138 to 0151 of WO2015/199219A, the contents of which are incorporated in the present specification.

Examples of the ketone compound include compounds described in paragraph 0087 of JP2015-087611A, the content of which is incorporated in the present specification. As a commercially available product thereof, KAYACURE DETX (manufactured by Nippon Kayaku Co., Ltd.) is also suitably used.

As the photoradical polymerization initiator, a hydroxyacetophenone compound, an aminoacetophenone compound, and an acylphosphine compound can also be suitably used. More specifically, for example, the aminoacetophenone-based initiator described in JP1998-291969A (JP-H10-

291969A) and the acylphosphine oxide-based initiator described in JP4225898B can also be used.

As the hydroxyacetophenone-based initiator, IRGACURE 184 (IRGACURE is a registered trade mark), DAROCUR1173, IRGACURE 500, IRGACURE 2959, and IRGACURE 127 (trade names: all manufactured by BASF SE) can be used.

As the aminoacetophenone-based initiator, IRGACURE 907, IRGACURE 369, and IRGACURE 379 (trade names: all manufactured by BASF SE) which are commercially available products can be used.

As the aminoacetophenone-based initiator, the compound described in JP2009-191179A, an absorption maximum wavelength of which is matched to a light source having a wavelength such as 365 nm or 405 nm, can also be used.

Examples of the acylphosphine-based initiator include 2,4,6-trimethylbenzoyl-diphenyl-phosphine oxide. In addition, IRGACURE 819 or IRGACURE TPO (trade names: all manufactured by BASF SE) which are commercially available products can be used.

Examples of the metallocene compound include IRGACURE 784 (manufactured by BASF SE).

Examples of the more preferred photoradical polymerization initiator include an oxime compound. In a case where an oxime compound is used, exposure latitude can be more effectively improved. The oxime compound is particularly preferable since the oxime compound has a wide exposure latitude (a wide exposure margin) and also works as a photocuring accelerator.

As specific examples of the oxime compound, the compound described in JP2001-233842A, the compound described in JP2000-080068A, and the compound described in JP2006-342166A can be used.

Examples of the preferred oxime compound include compounds having the following structures, 3-benzoyloxyiminobutan-2-one, 3-acetoxyiminobutan-2-one, 3-propionyloxyiminobutan-2-one, 2-acetoxyiminopentan-3-one, 2-acetoxyimino-1-phenylpropan-1-one, 2-benzoyloxyimino-1-phenylpropan-1-one, 3-(4-toluenesulfonyloxy)iminobutan-2-one, and 2-ethoxycarbonyloxyimino-1-phenylpropan-1-one. In the curable resin composition according to the embodiment of the present invention, it is particularly preferable to use an oxime compound (an oxime-based photopolymerization initiator) as the photoradical polymerization initiator. The oxime-based photopolymerization initiator has a linking group of >C=N—O—C(=O)— in the molecule.

OXE 01

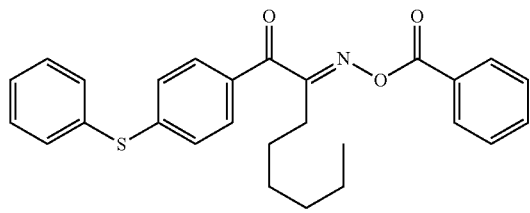

OXE 02

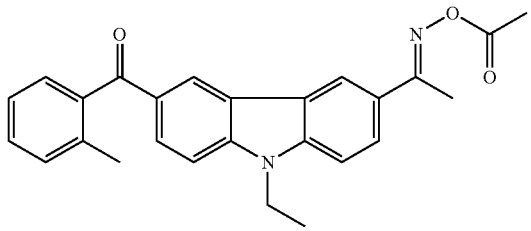

OXE 03

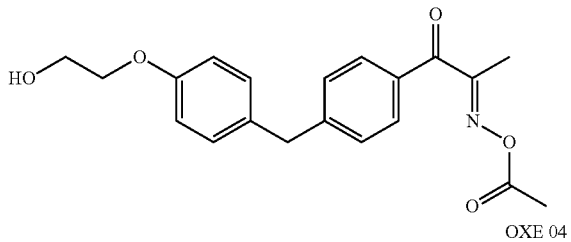

OXE 04

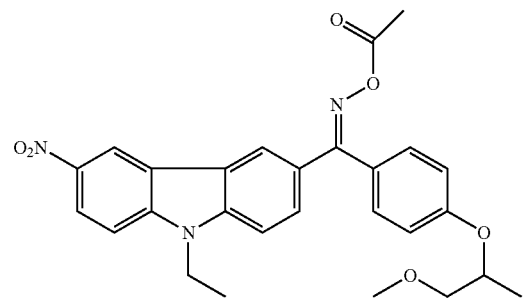

As commercially available products, IRGACURE OXE 01, IRGACURE OXE 02, IRGACURE OXE 03, IRGACURE OXE 04 (all manufactured by BASF SE), ADEKA OPTOMERN-1919 (manufactured by ADEKA Corporation, the photoradical polymerization initiator 2 described in JP2012-014052A) are also suitably used. In addition, TR-PBG-304 (manufactured by Changzhou Tronly New Electronic Materials Co., Ltd.), ADEKA ARKLS NCI-831, and ADEKA ARKLS NCI-930 (manufactured by ADEKA Corporation) can also be used. In addition, DFI-091 (manufactured by DAITO CHEMIX Co., Ltd.) can be used.

It is also possible to use an oxime compound having a fluorine atom. Specific examples of such oxime compounds include compounds described in JP2010-262028A, compounds 24, and 36 to 40 described in paragraph 0345 of JP2014-500852A, and a compound (C-3) described in paragraph 0101 of JP2013-164471A.

As the most preferable oxime compound, oxime compounds having a specific substituent described in JP2007-269779A or oxime compounds having a thioaryl group shown in JP2009-191061A, and the like are mentioned.

From the viewpoint of exposure sensitivity, the photoradical polymerization initiator is preferably a compound selected from the group consisting of a trihalomethyltriazine compound, a benzyl dimethyl ketal compound, an α-hydroxy ketone compound, an α-aminoketone compound, an acylphosphine compound, a phosphine oxide compound, a metallocene compound, an oxime compound, a triaryl imidazole dimer, an onium salt compound, a benzothiazole compound, a benzophenone compound, an acetophenone compound and a derivative thereof, a cyclopentadienebenzene-iron complex and a salt thereof, a halomethyl oxadiazole compound, and a 3-aryl substituted coumarin compound.

The photoradical polymerization initiator is more preferably a trihalomethyltriazine compound, an α-aminoketone compound, an acylphosphine compound, a phosphine oxide compound, a metallocene compound, an oxime compound, a triaryl imidazole dimer, an onium salt compound, a benzophenone compound, or an acetophenone compound, still more preferably at least one compound selected from the group consisting of a trihalomethyltriazine compound, an α-aminoketone compound, an oxime compound, a triaryl imidazole dimer, and a benzophenone compound. A metallocene compound or an oxime compound is even more preferably used, and an oxime compound is even still more preferable.

In addition, as the photoradical polymerization initiator, it is possible to use benzophenone, an N,N'-tetraalkyl-4,4'-diaminobenzophenone such as N,N'-tetramethyl-4,4'-diaminobenzophenone (Michler's ketone), an aromatic ketone such as 2-benzyl-2-dimethylamino-1-(4-morpholinophenyl)-butanone-1,2-methyl-1-[4-(methylthio)phenyl]-2-morpholino-propanone-1, quinones fused with an aromatic ring such as an alkylanthraquinone, a benzoin ether compound such as a benzoin alkyl ether, a benzoin compound such as benzoin or an alkyl benzoin, a benzyl derivative such as benzyl dimethyl ketal, or the like. In addition, a compound represented by Formula (I) may also be used.

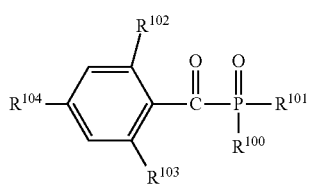

(I)

In Formula (I), $R^{I00}$ represents an alkyl group having 1 to 20 carbon atoms, an alkyl group having 2 to 20 carbon atoms, which is interrupted by one or more oxygen atoms, an alkoxy group having 1 to 12 carbon atoms, a phenyl group, an alkyl group having 1 to 20 carbon atoms, an alkoxy group having 1 to 12 carbon atoms, a halogen atom, a cyclopentyl group, a cyclohexyl group, an alkenyl group having 2 to 12 carbon atoms, a phenyl group substituted with at least one of an alkyl group having 2 to 18 carbon atoms, which is interrupted by one or more oxygen atoms or an alkyl group having 1 to 4 carbon atoms, or a biphenyl group, $R^{I01}$ is a group represented by Formula (II) or a group which is the same as $R^{I00}$, and $R^{I02}$ to $R^{I04}$ each independently represent an alkyl group having 1 to 12 carbon atoms, an alkoxy group having 1 to 12 carbon atoms, or a halogen atom.

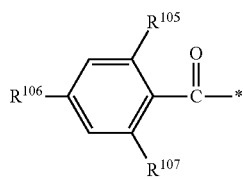

(II)

In the formula, $R^{I05}$ to $R^{I07}$ are respectively the same as $R^{I02}$ to $R^{I04}$ in Formula (I).

Further, as the photoradical polymerization initiator, the compounds described in paragraphs 0048 to 0055 of WO2015/125469A can also be used.

In a case where the photopolymerization initiator is contained, the content thereof is preferably 0.1% to 30% by mass, more preferably 0.1% to 20% by mass, still more preferably 0.5% to 15% by mass, and still more preferably 1.0% to 10% by mass, with respect to the total solid content of the curable resin composition according to the embodiment of the present invention. Only one kind of the photopolymerization initiator may be contained, or two or more kinds thereof may be contained. In a case where two or more kinds of photopolymerization initiators are contained, the total thereof is preferably within the above-described range.

<Thermal Polymerization Initiator>

The curable resin composition according to the embodiment of the present invention may contain a thermal polymerization initiator as the polymerization initiator and particularly, may contain a thermal radical polymerization initiator. The thermal radical polymerization initiator is a compound that generates radicals by heat energy and initiates or promotes a polymerization reaction of a compound having polymerization properties. In a case where a thermal radical polymerization initiator is added, a polymerization reaction of a heterocyclic ring-containing polymer precursor can be allowed to proceed together with the cyclization of the heterocyclic ring-containing polymer precursor, whereby a higher degree of heat resistance can be achieved.

Specific examples of the thermal radical polymerization initiator include the compounds described in paragraphs 0074 to 0118 of JP2008-063554A.

In a case where thermal radical polymerization initiator is contained, the content thereof is preferably 0.1% to 30% by mass, with respect to the total solid content of the curable resin composition according to the embodiment of the present invention, more preferably 0.1% to 20% by mass, and still more preferably 5% to 15% by mass. One kind of thermal radical polymerization initiator may be contained alone, or two or more kinds thereof may be contained. In a case where two or more kinds of thermal radical polymerization initiators are contained, the total thereof is preferably within the above-described range.

<Polymerizable Compound>
<<Radically Polymerizable Compound>>

The curable resin composition according to the embodiment of the present invention preferably contains a polymerizable compound.

As the polymerizable compound, a radically polymerizable compound can be used. The radically polymerizable compound is a compound having a radically polymerizable group. Examples of the radically polymerizable group include groups having an ethylenically unsaturated bond such as a vinyl group, an allyl group, a vinylphenyl group, or a (meth)acryloyl group. The radically polymerizable group is preferably a (meth)acryloyl group, and more preferably a (meth)acryloxy group from the viewpoint of reactivity.

The number of radically polymerizable groups contained in the radically polymerizable compound may be one or two or more, but the radically polymerizable compound preferably has two or more radically polymerizable groups and more preferably has three or more radically polymerizable groups. The upper limit thereof is preferably 15 or lower, more preferably 10 or lower, and still more preferably 8 or lower.

The molecular weight of the radically polymerizable compound is preferably 2,000 or lower, more preferably 1,500 or lower, and still more preferably 900 or lower. The lower limit of the molecular weight of the radically polymerizable compound is preferably 100 or more.

From the viewpoint of developability, the curable resin composition according to the embodiment of the present invention preferably contains at least one di- or higher-functional radically polymerizable compound containing two or more radically polymerizable groups and more preferably contains at least one tri- or higher-functional radically polymerizable compound. In addition, the curable resin composition may contain a mixture of a difunctional radically polymerizable compound and a trifunctional or higher-functional radically polymerizable compound. Regarding the number of functional groups, in a case where a polymerizable monomer is difunctional or higher-functional, the number of radically polymerizable groups in one molecule is two or more.

Specific examples of the radically polymerizable compound include unsaturated carboxylic acids (for example, acrylic acid, methacrylic acid, itaconic acid, crotonic acid, isocrotonic acid, and maleic acid), and esters and amides thereof, and esters formed from unsaturated carboxylic acids and polyhydric alcohol compounds or amides formed from unsaturated carboxylic acids and polyvalent amine compounds are preferable. In addition, addition reaction products produced by reacting unsaturated carboxylic acid esters or amides, having a nucleophilic substituent such as a hydroxy group, an amino group, or a sulfanyl group, with monofunctional or polyfunctional isocyanates or epoxies, dehydration condensation reaction products produced by reacting the above esters or amides with a monofunctional or polyfunctional carboxylic acid, or the like are also suitably used. In addition, addition reaction products produced by reacting unsaturated carboxylic acid esters or amides, having an electrophilic substituent such as an isocyanate group or an epoxy group, with monofunctional or polyfunctional alcohols, amines, or thiols, and further, substitution reaction products produced by reacting unsaturated carboxylic acid esters or amides, having an eliminable substituent such as a halogen atom or a tosyloxy group, with monofunctional or polyfunctional alcohols, amines, or thiols are also suitable. In addition, as other examples, it is also possible to use a group of compounds in which the unsaturated carboxylic acid described above is replaced with an unsaturated phosphonic acid, a vinylbenzene derivative such as styrene, a vinyl ether, an allyl ether, or the like. Regarding the specific examples thereof, reference can be made to the description of paragraphs 0113 to 0122 of JP2016-027357A, the content of which is incorporated in the present specification.

In addition, the radically polymerizable compound is also preferably a compound having a boiling point of 100° C. or higher under atmospheric pressure. Examples thereof include a compound obtained by adding ethylene oxide or propylene oxide to a polyfunctional alcohol such as polyethylene glycol di(meth)acrylate, trimethylolethane tri(meth)acrylate, neopentyl glycol di(meth)acrylate, pentaerythritol tri(meth)acrylate, pentaerythritol tetra(meth)acrylate, dipentaerythritol penta(meth)acrylate, dipentaerythritol hexa(meth)acrylate, hexanediol (meth)acrylate, trimethylolpropane tri(acryloyloxypropyl)ether, tri(acryloyloxyethyl)isocyanurate, glycerin, and trimethyloleothane, and then being subjected to (meth)acrylation, urethane (meth)acrylates respectively described in JP1973-041708B (JP-S48-041708B), JP1975-006034B (JP-S50-006034B), and JP1976-037193A (JP-S51-037193A), polyester acrylates respectively described in JP1973-064183A (JP-S48-064183A), JP1974-043191B (JP-S49-043191B), and JP1977-030490B (JP-S52-030490B), polyfunctional acrylates or methacrylates such as epoxy acrylates which are reaction products of epoxy resins and (meth)acrylic acid, and mixtures thereof. In addition, the compounds described in paragraphs 0254 to 0257 of JP2008-292970A are also suitable. Further, the polyfunctional (meth)acrylate or the like obtained by reacting a compound having a cyclic ether group with an ethylenically unsaturated bond, such as glycidyl (meth)acrylate, with polyfunctional carboxylic acid can also be mentioned.

In addition, as a preferred radically polymerizable compound other than those described above, a compound having two or more groups containing a fluorene ring and an ethylenically unsaturated bond and a cardo resin, which are described in JP2010-160418A, JP2010-129825A, and JP4364216B, can also be used.

Further, other examples thereof include the specific unsaturated compounds described in JP1971-043946B (JP-S46-043946B), JP1989-040337B (JP-H01-040337B), and JP1989-040336B (JP-1401-040336B), and the vinylphosphonic acid-based compound described in JP1990-025493A (JP-H02-025493A). In addition, the compounds containing a perfluoroalkyl group described in JP1986-022048A (JP-S61-022048A) can also be used. Furthermore, photopolymerizable monomers and oligomers which are described in Journal of the Adhesion Society of Japan, Vol. 20, No. 7, pages 300 to 308 (1984) can also be used.

In addition to the above, the compounds described in paragraphs 0048 to 0051 of JP2015-034964A and the compounds described in paragraphs 0087 to 0131 of WO2015/199219A can also be preferably used, the contents of which are incorporated in the present specification.

In addition, the compounds which are represented as Formula (1) and Formula (2) in JP1998-062986A (JP-H10-062986A), described together with the specific examples thereof, which are obtained by adding ethylene oxide or propylene oxide to a polyfunctional alcohol and then being subjected to (meth)acrylation can be used as a radically polymerizable compound.

Further, the compounds described in paragraphs 0104 to 0131 of JP2015-187211A can also be used as the other radically polymerizable compounds, the content of which is incorporated in the present specification.

As the radically polymerizable compound, dipentaerythritol triacrylate (as a commercially available product, KAYARAD D-330; manufactured by Nippon Kayaku Co., Ltd.), dipentaerythritol tetraacrylate (as a commercially available product, KAYARAD D-320; Nippon Kayaku Co., Ltd., A-TMMT: manufactured by Shin-Nakamura Chemical Co., Ltd.), dipentaerythritol penta(meth)acrylate (as a commercially available product, KAYARAD D-310; manufactured by Nippon Kayaku Co., Ltd.), dipentaerythritol hexa (meth)acrylate (as a commercially available product, KAYARAD DPHA; by Nippon Kayaku Co., Ltd., A-DPH; manufactured by Shin-Nakamura Chemical Co., Ltd.), or a structure in which a (meth)acryloyl group thereof is bonded through an ethylene glycol residue or a propylene glycol residue is preferable. Oligomer types thereof can also be used.

Examples of the commercially available product of the radically polymerizable compound include SR-494 which is a tetrafunctional acrylate having four ethyleneoxy chains, manufactured by Sartomer Company Inc., SR-209, 231, and 239 which are a difunctional methacrylate having four ethyleneoxy chains, manufactured by Sartomer Company Inc., DPCA-60 which is a hexafunctional acrylate having six pentyleneoxy chains, manufactured by Nippon Kayaku Co., Ltd., TPA-330 which is a trifunctional acrylate having three isobutylene oxy chains, a urethane oligomer UAS-10, UAB-140 (manufactured by Nippon Paper Industries Co., Ltd.), NK Ester M-40G, NK Ester 4G, NK Ester M-9300, NK Ester A-9300, UA-7200 (manufactured by Shin-Nakamura Chemical Co., Ltd.), DPHA-40H (manufactured by Nippon Kayaku Co., Ltd.), UA-306H, UA-306T, UA-3061, AH-600, T-600, AI-600 (manufactured by Kyoeisha Chemical Co., Ltd.), and Brenmer PME400 (manufactured by NOF Corporation).

As the radically polymerizable compound, the urethane acrylates as described in JP1973-041708B (JP-S48-041708B), JP1976-037193A (JP-S51-037193A), JP1990-032293B (JP-H02-032293B), and JP1990-016765B (JP-H02-016765B), and the urethane compounds having an ethylene oxide-based skeleton described in JP1983-049860B (JP-S58-049860B), JP1981-017654B (JP-S56-017654B), JP1987-039417B (JP-S62-039417B), and JP1987-039418B (JP-S62-039418B) are also suitable. Further, as the radically polymerizable compound, the compounds having an amino structure or a sulfide structure in a molecule as described in JP1988-277653A (JP-S63-277653A), JP1988-260909A (JP-S63-260909A), and JP1989-105238A (JP-H01-105238A) can also be used.

The radically polymerizable compound may be a radically polymerizable compound having an acid group such as a carboxy group or a phosphoric acid group. The radically polymerizable compound having an acid group is preferably an ester of an aliphatic polyhydroxy compound and an unsaturated carboxylic acid and more preferably a radically polymerizable compound obtained by reacting an unreacted hydroxy group of an aliphatic polyhydroxy compound with a non-aromatic carboxylic acid anhydride to have an acid group. The radically polymerizable compound is particularly preferably a compound in which an aliphatic polyhydroxy compound is pentaerythritol or dipentaerythritol in a radically polymerizable compound having an acid group obtained by reacting an unreacted hydroxy group of the aliphatic polyhydroxy compound with a non-aromatic carboxylic acid anhydride. Examples of the commercially available product thereof include M-510 and M-520 as polybasic acid-modified acrylic oligomers which are manufactured by Toagosei Co., Ltd.

The acid value of the radically polymerizable compound having an acid group is preferably 0.1 to 40 mg KOH/g, and particularly preferably 5 to 30 mg KOH/g. In a case where the acid value of the radically polymerizable compound is within the above-described range, excellent production handling properties are exhibited, and furthermore, excellent developability is exhibited. In addition, good polymerization properties are exhibited. The acid value is measured according to the description of JIS K 0070: 1992.

In the curable resin composition according to the embodiment of the present invention, a monofunctional radically polymerizable compound can be preferably used as the radically polymerizable compound from the viewpoint of suppressing warping associated with controlling the elastic modulus of the cured film. As the monofunctional radically polymerizable compound, (meth)acrylic acid derivatives such as n-butyl (meth)acrylate, 2-ethylhexyl (meth)acrylate, 2-hydroxyethyl (meth)acrylate, butoxyethyl (meth)acrylate, carbitol (meth)acrylate, cyclohexyl (meth)acrylate, benzyl (meth)acrylate, phenoxyethyl (meth)acrylate, N-methylol (meth)acrylamide, glycidyl (meth)acrylate, polyethylene glycol mono(meth)acrylate, and polypropylene glycol mono (meth)acrylate, N-vinyl compounds such as N-vinylpyrrolidone and N-vinylcaprolactam, allyl compounds such as allyl glycidyl ether, diallyl phthalate, and triallyl trimellitate, and the like are preferably used. As the monofunctional radically polymerizable compound, a compound having a boiling point of 100° C. or higher under atmospheric pressure is also preferable in order to suppress volatilization before exposure.

<<Polymerizable Compound Other than Radically Polymerizable Compound Described Above>>

The curable resin composition according to the embodiment of the present invention may further contain other polymerizable compounds, in addition to the radically polymerizable compound described above. Examples of the radically polymerizable compound other than the polymerizable compound described above include a compound having a hydroxymethyl group, an alkoxymethyl group, or an acyloxymethyl group; an epoxy compound; an oxetane compound; and a benzoxazine compound.

—Compound Having Hydroxymethyl Group, Alkoxymethyl Group, or Acyloxymethyl Group—

The compound having a hydroxymethyl group, an alkoxymethyl group, or an acyloxymethyl group is preferably a compound represented by Formula (AM1), (AM4), or (AM5).

(AM1)

(In the formula, t represents an integer of 1 to 20, $R^{104}$ represents a t-valent organic group having 1 to 200 carbon atoms, and $R^{105}$ represents a group represented by —$OR^{106}$ or —OCO—$R^{107}$, where $R^{106}$ represents a hydrogen atom or an organic group having 1 to 10 carbon atoms, and $R^{107}$ represents an organic group having 1 to 10 carbon atoms.)

(AM4)

(In the formula, $R^{404}$ represents a divalent organic group having 1 to 200 carbon atoms, and $R^{405}$ represents a group represented by —$OR^{406}$ or —OCO—$R^{407}$, where $R^{406}$ represents a hydrogen atom or an organic group having 1 to 10 carbon atoms, and $R^{407}$ represents an organic group having 1 to 10 carbon atoms.)

(AM5)

(In the formula, u represents an integer of 3 to 8, $R^{504}$ represents a u-valent organic group having 1 to 200 carbon atoms, and $R^{505}$ represents a group represented by —$OR^{506}$ or —OCO—$R^{507}$, where $R^{506}$ represents a hydrogen atom or an organic group having 1 to 10 carbon atoms, and $R^{507}$ represents an organic group having 1 to 10 carbon atoms.)

Specific examples of the compound represented by Formula (AM4) include 46DMOC, 46DMOEP (all trade names, manufactured by ASAHI YUKIZAI Corporation), DML-MBPC, DML-MBOC, DML-OCHP, DML-PCHP, DML-PC, DML-PTBP, DML-34X, DML-EP, DML-POP, dimethylol BisOC-P, DML-PFP, DML-PSBP, DML-MTris PC (all trade names, manufactured by Honshu Chemical Industry Co., Ltd.), NIKALAC MX-290 (trade name, manufactured by Sanwa Chemical Co., Ltd.), 2,6-dimethoxymethyl-4-t-butylphenol, 2,6-dimethoxymethyl-p-cresol, and 2,6-diacetoxymethyl-p-cresol.

In addition, specific examples of the compound represented by Formula (AM5) include TriML-P, TriML-35XL, TML-HQ, TML-BP, TML-pp-BPF, TML-BPA, TMOM-BP, HML-TPPHBA, HML-TPHAP, HMOM-TPPHBA, HMOM-TPHAP (all trade names, manufactured by Honshu Chemical Industry Co., Ltd.), TM-BIP-A (trade name, manufactured by ASAHI YUKIZAI Corporation), NIKALAC MX-280, NIKALAC MX-270, and NIKALAC MW-100LM (all trade names, manufactured by Sanwa Chemical Co., Ltd.).

—Epoxy Compound (Compound Having Epoxy Group)—

The epoxy compound is preferably a compound having two or more epoxy groups in one molecule. Since the epoxy group undergoes a crosslinking reaction at 200° C. or lower and a dehydration reaction derived from crosslinking does not occur, film shrinkage hardly occurs. Therefore, containing an epoxy compound is effective for the low-temperature curing of the curable resin composition and the suppression of warping.

The epoxy compound preferably contains a polyethylene oxide group. As a result, it is possible to further decrease an elastic modulus and suppress warping. The polyethylene oxide group means a group in which the number of repeating units of ethylene oxide is 2 or higher, and the number of repeating units is preferably 2 to 15.

Examples of the epoxy compound include a bisphenol A type epoxy resin; a bisphenol F type epoxy resin; an alkylene glycol type epoxy resin such as propylene glycol diglycidyl ether; a polyalkylene glycol type epoxy resin such as polypropylene glycol diglycidyl ether; and an epoxy group-containing silicone such as polymethyl(glycidyloxypropyl)siloxane. However, the examples thereof are not limited thereto. Specifically, EPICLON (registered trade mark) 850-S, EPICLON (registered trade mark) HP-4032, EPICLON (registered trade mark) HP-7200, EPICLON (registered trade mark) HP-820, EPICLON (registered trade mark) HP-4700, EPICLON (registered trade mark) EXA-4710, EPICLON (registered trade mark) HP-4770, EPICLON (registered trade mark) EXA-859CRP, EPICLON (registered trade mark) EXA-1514, EPICLON (registered trade mark) EXA-4880, EPICLON (registered trade mark) EXA-4850-150, EPICLON (registered trade mark) EXA-4850-1000, EPICLON (registered trade mark) EXA-4816, EPICLON (registered trade mark) EXA-4822 (all trade names, manufactured by DIC Corporation), RIKARESIN (registered trade mark) BEO-60E (trade name, manufactured by New Japan Chemical Co., Ltd.), EP-40035, EP-40005 (all trade names, manufactured by ADEKA Corporation), and the like are mentioned. Among these, an epoxy resin containing a polyethylene oxide group is preferable from the viewpoint of suppression of warping and excellent heat resistance. For example, EPICLON (registered trade mark) EXA-4880, EPICLON (registered trade mark) EXA-4822, and RIKARESIN (registered trade mark) BEO-60E are preferable due to containing a polyethylene oxide group.

—Oxetane Compound (Compound Having Oxetanyl Group)—

Examples of the oxetane compound include a compound having two or more oxetane rings in one molecule, 3-ethyl-3-hydroxymethyloxetane, 1,4-bis{[(3-ethyl-3-oxetanyl)methoxy]methyl}benzene, 3-ethyl-3-(2-ethylhexylmethyl)oxetane, and 1,4-benzenedicarboxylic acid-bis[(3-ethyl-3-oxetanyl)methyl]ester. As specific examples thereof, ARON OXETANE series (for example, OXT-121, OXT-221, OXT-191, OXT-223) manufactured by Toagosei Co., Ltd., can be suitably used, and these can be used alone or two or more thereof may be mixed and used.

—Benzoxazine Compound (Compound Having Benzoxazolyl Group)—

Due to a crosslinking reaction derived from a ring-opening addition reaction, the benzoxazine compound does not result in degassing during curing and results in decreased thermal contraction, and thus the occurrence of warping is suppressed, which is preferable.

Preferred examples of the benzoxazine compound include B-a type benzoxazine, B-m type benzoxazine (all trade names, manufactured by Shikoku Chemicals Corporation), a benzoxazine adduct of polyhydroxystyrene resin, and a phenol novolak type dihydrobenzoxazine compound. These may be used alone, or two or more thereof may be mixed and used.

In a case where the polymerizable compound is contained, the content thereof is preferably more than 0% by mass and 60% by mass or less with respect to the total solid content of the curable resin composition according to the embodiment of the present invention. The lower limit thereof is more preferably 5% by mass or higher. An upper limit is more preferably 50% by mass or less and still more preferably 30% by mass or less.

One kind of the polymerizable compound may be used alone, or two or more kinds thereof may be mixed and used. In a case where two or more kinds thereof are used in combination, the total amount thereof is preferably in the above range.

<Solvent>

The curable resin composition according to the embodiment of the present invention preferably contains a solvent. As the solvent, any conventionally known solvent can be used. The solvent is preferably an organic solvent. Examples of the organic solvent include compounds such as esters, ethers, ketones, aromatic hydrocarbons, sulfoxides, and amides.

Suitable examples of the esters include ethyl acetate, n-butyl acetate, isobutyl acetate, amyl formate, isoamyl acetate, butyl propionate, isopropyl butyrate, ethyl butyrate, butyl butyrate, methyl lactate, ethyl lactate, γ-butyrolactone, ε-caprolactone, δ-valerolactone, alkyl alkyloxyacetate (for example, methyl alkyloxyacetate, ethyl alkyloxyacetate, and butyl alkyloxyacetate (for example, methyl methoxyacetate, ethyl methoxyacetate, butyl methoxyacetate, methyl ethoxyacetate, and ethyl ethoxyacetate)), 3-alkyloxypropionic acid alkyl esters (for example, methyl 3-alkyloxypropionate, and ethyl 3-alkyloxypropionate (for example, methyl 3-methoxypropionate, ethyl 3-methoxypropionate, methyl 3-ethoxypropionate, and ethyl 3-ethoxypropionate)), 2-alkyloxypropionic acid alkyl esters (for example, methyl 2-alkyloxypropionate, ethyl 2-alkyloxypropionate, and propyl 2-alkyloxypropionate (for example, methyl 2-methoxypropionate, ethyl 2-methoxypropionate, propyl 2-methoxypropionate, methyl 2-ethoxypropionate, and ethyl 2-ethoxypropionate)), methyl 2-alkyloxy-2-methylpropionate and ethyl 2-alkyloxy-2-methylpropionate (for example, methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate.

Suitable examples of the ethers include diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate.

Suitable examples of the ketones include methyl ethyl ketone, cyclohexanone, cyclopentanone, 2-heptanone, and 3-heptanone.

Suitable examples of the aromatic hydrocarbons include toluene, xylene, anisole, and limonene.

Suitable examples of the sulfoxides include dimethyl sulfoxide.

Suitable examples of the amides include N-methyl-2-pyrrolidone, N-ethyl-2-pyrrolidone, N,N-dimethylacetamide, and N,N-dimethylformamide.

From the viewpoint of improving the properties of a coated surface or the like, it is also preferable to mix two or more kinds of solvents.

In the present invention, the solvent is preferably one solvent selected from methyl 3-ethoxypropionate, ethyl 3-ethoxypropionate, ethyl cellosolve acetate, ethyl lactate, diethylene glycol dimethyl ether, butyl acetate, methyl 3-methoxypropionate, 2-heptanone, cyclohexanone, cyclopentanone, γ-butyrolactone, dimethyl sulfoxide, ethyl carbitol acetate, butyl carbitol acetate, N-methyl-2-pyrrolidone, propylene glycol methyl ether, and propylene glycol methyl ether acetate, or a mixed solvent composed of two or more solvents selected therefrom. A combination of dimethyl sulfoxide and γ-butyrolactone is particularly preferable.

From the viewpoint of coating property, the content of the solvent is such that the total solid content concentration of the curable resin composition according to the embodiment of the present invention is preferably 5% to 80% by mass, more preferably 5% to 75% by mass, still more preferably 10% to 70% by mass, and even still more preferably 40% to 70% by mass. The content of the solvent may be adjusted depending on the desired thickness and a coating method.

One kind of solvent may be contained, or two or more kinds thereof may be contained. In a case where two or more kinds of solvents are contained, the total thereof is preferably within the above-described range.

<Migration Suppressing Agent>

The curable resin composition according to the embodiment of the present invention preferably further contains a migration suppressing agent. By containing the migration suppressing agent, it is possible to effectively suppress metal ions derived from a metal layer (a metal wire) from being migrated into a curable resin composition layer.

The migration suppressing agent is no particularly limited; however, examples thereof include a compound having a heterocyclic ring (a pyrrole ring, a furan ring, a thiophene ring, an imidazole ring, an oxazole ring, a thiazole ring, a pyrazole ring, an isoxazole ring, an isothiazole ring, a tetrazole ring, a pyridine ring, a pyridazine ring, a pyrimidine ring, a pyrazine ring, a piperidine ring, a piperazine ring, a morpholine ring, a 2H-pyran ring and a 6H-pyran ring, or a triazine ring), a compound having thioureas and a sulfanyl group, a hindered phenol-based compound, a salicylic acid derivative-based compound, and a hydrazide derivative-based compound. In particular, triazole-based compounds such as 1,2,4-triazole and benzotriazole, and tetrazole-based compounds such as 1H-tetrazole and 5-phenyltetrazole can be preferably used.

Alternatively, an ion trapping agent that captures an anion such as a halogen ion can also be used.

As other migration suppressing agents, the rust inhibitors described in paragraph 0094 of JP2013-015701A, the compounds described in paragraphs 0073 to 0076 of JP2009-283711A, the compounds described in paragraph 0052 of JP2011-059656A, the compounds described in paragraphs 0114, 0116, and 0118 of JP2012-194520A, the compounds described in paragraph 0166 of WO2015/199219A, or the like can be used.

The following compounds can be mentioned as specific examples of the migration suppressing agent.

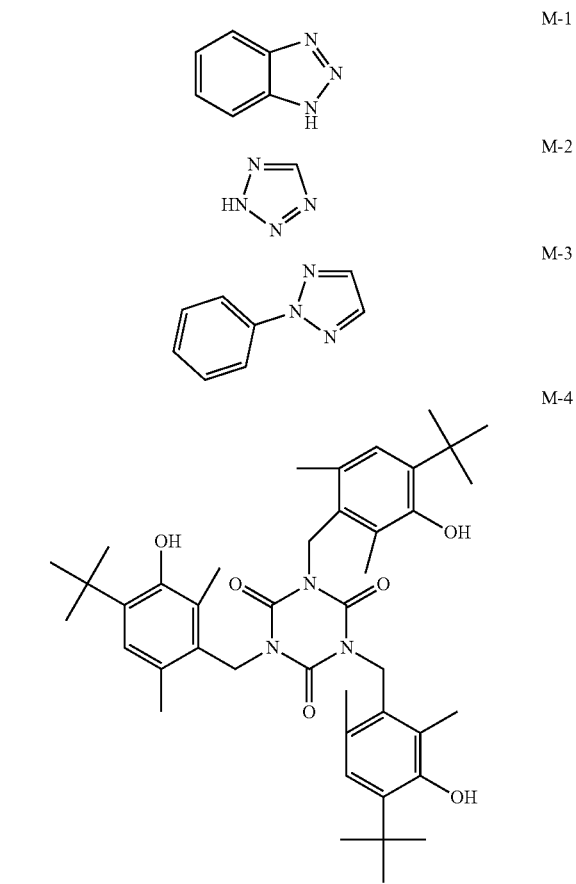

In a case where the curable resin composition contains the migration suppressing agent, the content of the migration suppressing agent is preferably 0.01% to 5.0% by mass, more preferably 0.05% to 2.0% by mass, and still more preferably 0.1% to 1.0% by mass, with respect to the total solid content of the curable resin composition.

One kind of migration suppressing agent may be used alone, or two or more kinds thereof may be used. In a case where two or more kinds of migration suppressing agents are used, the total thereof is preferably within the above-described range.

<Polymerization Inhibitor>

The curable resin composition according to the embodiment of the present invention preferably contains a polymerization inhibitor.

As the polymerization inhibitor, for example, hydroquinone, p-methoxyphenol, di-tert-butyl-p-cresol, pyrogallol, p-tert-butylcatechol, 1,4-benzoquinone, diphenyl-p-benzoquinone, 4,4'-thiobis(3-methyl-6-tert-butylphenol), 2,2'-methylenebis(4-methyl-6-tert-butylphenol), N-nitroso-N- phenylhydroxyamine aluminum salt, phenothiazine, N-nitrosodiphenylamine, N-phenyl naphthylamine, ethylenediamine tetraacetic acid, 1,2-cyclohexanediamine tetraacetic acid, glycol ether diamine tetraacetic acid, 2,6-di-tert-butyl-4-methyl phenol, 5-nitroso-8-hydroxyquinoline, 1-nitroso-2-napthoyl, 2-nitroso-1-napthoyl, 2-nitroso-5-(N-ethyl-N-sulfopropylamino)phenol, N-nitroso-N-(1-naphthyl)hydroxyamine ammonium salt, bis(4-hydroxy-3,5-tert-butyl)phenylmethane, and the like are suitably used. In addition, the polymerization inhibitors described in paragraph 0060 of JP2015-127817A and the compounds described in paragraphs 0031 to 0046 of WO2015/125469A can also be used.

In addition, the following compounds can be used (Me is a methyl group).

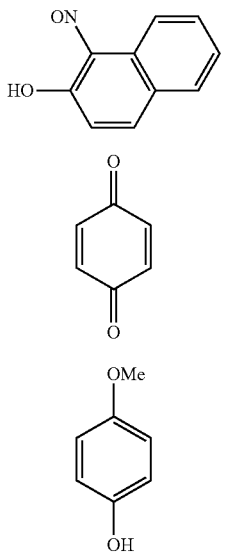

F-1

F-2

F-3

In a case where the curable resin composition according to the embodiment of the present invention has a polymerization inhibitor, the content of the polymerization inhibitor is preferably 0.01% to 5% by mass, more preferably 0.02% to 3% by mass, and still more preferably 0.05% to 2.5% by mass, with respect to the total solid content of the curable resin composition according to the embodiment of the present invention.

One kind of polymerization inhibitor may be used, or two or more kinds thereof may be used. In a case where two or more kinds of polymerization inhibitors are used, the total thereof is preferably within the above-described range.

<Metal Adhesiveness Improving Agent>

The curable resin composition according to the embodiment of the present invention preferably contains a metal adhesiveness improving agent for improving adhesiveness to a metal material used for electrodes, wiring lines, and the like. Examples of the metal adhesiveness improving agent include a silane coupling agent.

Examples of the silane coupling agent include the compounds described in paragraph 0167 of WO2015/199219A, the compounds described in paragraphs 0062 to 0073 of JP2014-191002A, the compounds described in paragraphs 0063 to 0071 of WO2011/080992A, the compounds described in paragraphs 0060 and 0061 of JP2014-191252A, the compounds described in paragraphs 0045 to 0052 of JP2014-041264A, and the compounds described in paragraph 0055 of WO2014/097594A. In addition, it is also preferable to use two or more kinds of different silane coupling agents as described in paragraphs 0050 to 0058 of JP2011-128358A. In addition, as the silane coupling agent, the following compounds are also preferably used. In the following formulae, Et represents an ethyl group.

SC-1

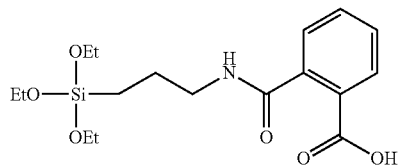

SC-2

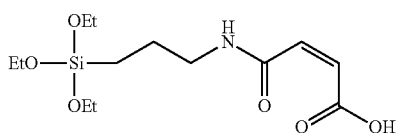

SC-3

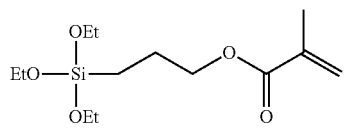

SC-4

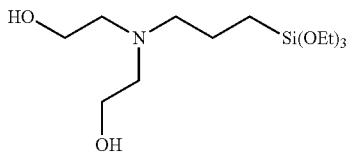

SC-5

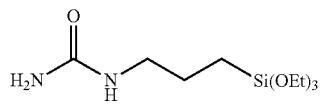

SC-6

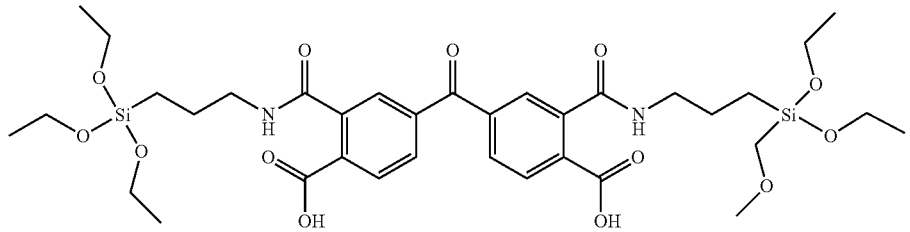

In addition, as the metal adhesiveness improving agent, the compounds described in paragraphs 0046 to 0049 of JP2014-186186A, and the sulfide-based compounds described in paragraphs 0032 to 0043 of JP2013-072935A can also be used.

The content of the metal adhesiveness improving agent is preferably 0.1 to 30 parts by mass, more preferably in a range of 0.5 to 15 parts by mass, and still more preferably in a range of 0.5 to 5 parts by mass, with respect to 100 parts by mass of the heterocyclic ring-containing polymer precursor. In a case where the content is set to be equal to or higher than the above lower limit value, good adhesiveness between a cured film and a metal layer after a curing step is exhibited, and in a case where the content is set to be equal to or lower than the above upper limit value, good heat resistance of the cured film after the curing step and good mechanical properties are exhibited. One kind of metal adhesiveness improving agent may be used, or two or more kinds thereof may be used. In a case where two or more kinds thereof are used, the total content thereof is preferably within the above-described range.

<Other Additives>

Various additives, for example, a thermal acid generator, a sensitizer such as N-phenyldiethanolamine, a chain transfer agent, a surfactant, a higher fatty acid derivative, an inorganic particle, a curing agent, a curing catalyst, a filler, an antioxidant, an ultraviolet absorbent, and an aggregation inhibitor can be blended, as necessary, with the curable resin composition according to the embodiment of the present invention to the extent that an effect of the present invention is not impaired. In a case where these additives are blended, the total blending amount thereof is preferably 3% by mass or lower of the solid content of the curable resin composition.

[Sensitizer]

The curable resin composition according to the embodiment of the present invention may contain a sensitizer. The sensitizer absorbs a specific radioactive ray to be in an electronically excited state. The sensitizer in the electronically excited state is brought into contact with a thermal curing accelerator, a thermal radical polymerization initiator, a photoradical polymerization initiator, or the like, to cause actions such as electron transfer, energy transfer, and heat generation. As a result, the thermal curing accelerator, thermal radical polymerization initiator, or the photoradical polymerization initiator undergoes a chemical change and decomposes, so that radicals, acids, or bases are generated.

Examples of the sensitizer include a sensitizer such as N-phenyldiethanolamine.

In addition, a sensitizing dye may be used as the sensitizer.

For details of the sensitizing dye, reference can be made to the description in paragraphs 0161 to 0163 of JP2016-027357A, the content of which is incorporated in the present specification.

In a case where the curable resin composition according to the embodiment of the present invention contains a sensitizer, the content of the sensitizer is preferably 0.01% to 20% by mass, more preferably 0.1% to 15% by mass, and still more preferably 0.5% to 10% by mass, with respect to the total solid content of the curable resin composition according to the embodiment of the present invention. One kind of sensitizer may be used alone, or two or more kinds thereof may be used in combination.

[Chain Transfer Agent]

The curable resin composition according to the embodiment of the present invention may contain a chain transfer agent. The chain transfer agent is defined, for example, in Polymer Dictionary, 3rd Edition, pp. 683 to 684 (edited by The Society of Polymer Science, 2005). As the chain transfer agent, for example, a group of compounds having SH, PH, SiH, and GeH in the molecule is used. These can donate hydrogen to a low active radical to generate a radical or can be oxidized and then deprotonated to generate a radical. In particular, a thiol compound can be preferably used.

In addition, as the chain transfer agent, the compounds described in paragraphs 0152 and 0153 of WO2015/199219A can also be used.

In a case where the curable resin composition according to the embodiment of the present invention has a chain transfer agent, the content of the chain transfer agent is preferably 0.01 to 20 parts by mass, more preferably 1 to 10 parts by mass, and still more preferably 1 to 5 parts by mass, with respect to 100 parts by mass of the total solid content of the curable resin composition according to the embodiment of the present invention. One kind of chain transfer agent may be used, or two or more kinds thereof may be used. In a case where two or more kinds of chain transfer agents are used, the total thereof is preferably within the above-described range.

[Surfactant]

From the viewpoint of further improving the coating property, each kind of surfactants may be added to the curable resin composition according to the embodiment of the present invention. As the surfactant, each kind of surfactant such as a fluorine-based surfactant, a nonionic surfactant, a cationic surfactant, an anionic surfactant, or a silicone-based surfactant can be used. In addition, the following surfactants are preferably used. In the following formula, the number indicated together with the parenthesis in the main chain means the content (% by mole) of each of the constitutional units of the main chain, and the number indicated together with the parenthesis in the side chain means the number of repetitions of each of the constitutional units of the side chain.

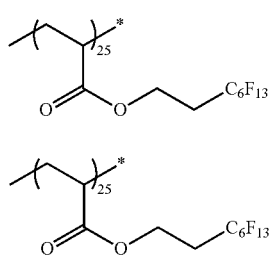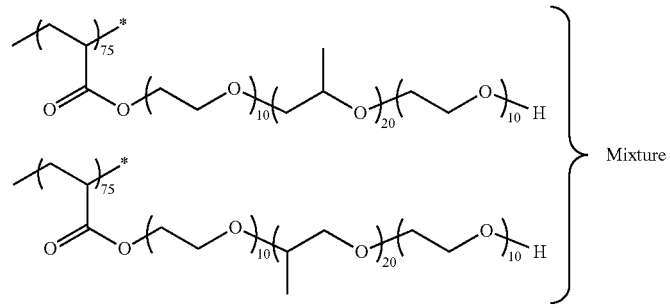

In addition, as the surfactant, the compounds described in paragraphs 0159 to 0165 of WO2015/199219A can also be used.

In a case where the curable resin composition according to the embodiment of the present invention has a surfactant, the content of the surfactant is preferably 0.001% to 2.0% by mass, with respect to the total solid content of the curable resin composition according to the embodiment of the present invention, and more preferably 0.005% to 1.0% by mass. One kind of surfactant may be used, or two or more kinds thereof may be used. In a case where two or more kinds of surfactants are used, the total thereof is preferably within the above-described range.

[Higher Fatty Acid Derivative]

In the curable resin composition according to the embodiment of the present invention, in order to prevent polymerization inhibition due to oxygen, a higher fatty acid derivative such as behenic acid or behenic acid amide may be added and be caused to be localized on a surface of the curable resin composition in the process of drying after coating.

In addition, as the higher fatty acid derivative, the compounds described in paragraph 0155 of WO2015/199219A can also be used.

In a case where the curable resin composition according to the embodiment of the present invention has a higher fatty acid derivative, the content of the higher fatty acid derivative is preferably 0.1% to 10% by mass with respect to the total solid content of the curable resin composition according to the embodiment of the present invention. One kind of higher fatty acid derivative may be used, or two or more kinds thereof may be used. In a case where two or more higher fatty acid derivatives are used, the total thereof is preferably within the above-described range.

<Restriction on Other Substances to be Contained>

The water content of the curable resin composition according to the embodiment of the present invention is preferably less than 5% by mass, more preferably less than 1% by mass, and still more preferably less than 0.6% by mass, from the viewpoint of properties of a coated surface.

From the viewpoint of insulation properties, the metal content of the curable resin composition according to the embodiment of the present invention is preferably less than 5 parts per million (ppm) by mass, more preferably less than 1 ppm by mass, and still more preferably less than 0.5 ppm by mass. Examples of the metal include sodium, potassium, magnesium, calcium, iron, chromium, nickel, and the like. In a case where a plurality of metals are contained, the total of these metals is preferably within the above-described range.

In addition, as a method of reducing metal impurities which are unintentionally contained in the curable resin composition according to the embodiment of the present invention, a method of selecting a raw material which contains a low metal content as the raw material constituting the curable resin composition according to the embodiment of the present invention, a method of filtering the raw material constituting the curable resin composition according to the embodiment of the present invention, a method of distilling under the condition in which the inside of the device is lined with polytetrafluoroethylene or the like to suppress the contamination as little as possible, and the like can be mentioned.

In the curable resin composition according to the embodiment of the present invention, in a case of considering the use application as a semiconductor material, the content of halogen atoms is preferably less than 500 ppm by mass, more preferably less than 300 ppm by mass, and still more preferably less than 200 ppm by mass, from the viewpoint of the wiring line corrosiveness. Among these, in a case of being present in a halogen ion state, the content is preferably less than 5 ppm by mass, more preferably less than 1 ppm by mass, and still more preferably less than 0.5 ppm by mass. Examples of the halogen atom include a chlorine atom and a bromine atom. It is preferable that the total content of the chlorine atom and the bromine atom, or the total content of the chlorine ion and the bromine ion is within the above-described range.

As a storage container of the curable resin composition according to the embodiment of the present invention, a known storage container in the related art can be used. In addition, as the storage container, for the intended purpose of suppressing incorporation of impurities into the raw materials and the curable resin composition, a multilayer bottle in which an inner wall of a container is composed of six kinds of six layers of resin, and a bottle with six kinds of resin being made as a seven-layer structure are preferably used. Examples of such a container include the container described in JP2015-123351A.

<Preparation of Curable Resin Composition>

The curable resin composition according to the embodiment of the present invention can be prepared by mixing the above-described components. The mixing method is not particularly limited, and mixing can be carried out by methods conventionally known in the related art.

In addition, for the intended purpose of removing foreign substances such as dust and fine particles in the curable resin composition, it is preferable to carry out filtration using a filter. A filter pore size is preferably 1 μm or lower, more preferably 0.5 μm or lower, and still more preferably 0.1 μm or lower. A material of the filter is preferably polytetrafluoroethylene, polyethylene, or nylon. As the filter, a filter which has been previously washed with an organic solvent may be used. In the filtration step using the filter, a plurality of kinds of filters may be connected in series or in parallel and used. In a case where a plurality of kinds of filters are used, filters having different pore sizes or different materials may be used in combination. In addition, various materials may be filtered a plurality of times. In a case of being filtered a plurality of times, circulation filtration may be used. In addition, filtration may be carried out under pressure. In a case where filtration is carried out under pressure, the pressure is preferably 0.05 MPa or more and 0.3 MPa or less.

In addition to filtration using a filter, impurity removal treatment using an adsorption material may be carried out. The filtration using a filter and the impurity removal treatment using an adsorption material may be combined. As the adsorption material, a conventionally known adsorption material can be used. Examples thereof include an inorganic adsorption material such as silica gel and zeolite and an organic adsorption material such as activated carbon.

<Use Application of Curable Resin Composition>

The curable resin composition of the present invention is preferably used for forming an interlayer insulating film for a re-distribution layer.

In addition, it can also be used for forming an insulating film of a semiconductor device, forming a stress buffer film, and the like.

(Cured Film, Laminate, Semiconductor Device, and Manufacturing Method Therefor)

Next, a cured film, a laminate, a semiconductor device, and a manufacturing method therefor are described.

The cured film according to the embodiment of the present invention is formed by curing the curable resin composition according to the embodiment of the present invention. The film thickness of the cured film according to the embodiment of the present invention can be, for example, 0.5 µm or higher, and 1 µm or higher. In addition, the upper limit value thereof can be set to 100 µm or lower or can be set to 30 µm or lower.

Two or more layers, further 3 to 7 layers of the cured film according to the embodiment of the present invention may be laminated to form a laminate. In the laminate according to the embodiment of the present invention, an aspect in which two or more layers of the cured films are included and a metal layer is provided between any cured films is preferable. For example, a laminate including at least a layer structure in which three layers of a first cured film, a metal layer, and a second cured film are laminated in order is preferably mentioned. The first cured film and the second cured film are both cured films according to the embodiment of the present invention. For example, an aspect in which both the first cured film and the second cured film are films that are obtained by curing the curable resin composition according to the embodiment of the present invention is preferably mentioned. The curable resin composition of the present invention that is used for forming the first cured film and the curable resin composition according to the embodiment of the present invention that is used for forming the second cured film may have the same composition or may have compositions different from each other; however, the compositions preferably have the same composition from the viewpoint of manufacturing suitability. Such a metal layer is preferably used as the metal wire of the re-distribution layer or the like.

As a field to which the cured film according to the embodiment of the present invention can be applied, an insulating film of a semiconductor device, an interlayer insulating film for a re-distribution layer, a stress buffer film, and the like are mentioned. In addition, a sealing film, a substrate material (a base film or cover lay of a flexible print substrate, an interlayer insulating film), or an insulating film applicable for mounting as described above, which is patterned by etching is mentioned. For these use applications, for example, Science & Technology Co., Ltd., "High functionality and applied technology of polyimide" April 2008, CMC Technical library "Basics and development of polyimide materials" supervised by Masaaki Kakimoto, published in November 2011, "Latest Polyimide Basics and Applications" edited by Japan Polyimide & Aromatic Polymers Study Group, NTS Inc, August 2010, or the like can be referred to.

In addition, the cured film according to the embodiment of the present invention can also be used for the production of board surfaces such as an offset board surface or a screen board surface, for etching of molded parts, for the production of protective lacquers and dielectric layers in electronics, in particular, microelectronics, and the like.

The method for manufacturing a cured film according to the embodiment of the present invention (hereinafter, also simply referred to as a "manufacturing method according to the embodiment of the present invention") preferably includes a film forming step of applying the curable resin composition according to the embodiment of the present invention onto a base material to form a film.

Further, it is more preferable that the method for manufacturing a cured film according to the embodiment of the present invention includes the film forming step and further includes an exposure step of exposing the film and a development step of developing the film (subjecting the film to the development treatment).

Further, it is more preferable that the method for manufacturing a cured film according to the embodiment of the present invention includes the film forming step (and the development step as necessary) and further includes a heating step of heating the film at 50° C. to 450° C.

Specifically, it is also preferable to include the following steps (a) to (d).

(a) A film forming step of applying a curable resin composition to a base material to form a film (a curable resin composition layer).

(b) An exposure step of exposing the film after the film forming step.

(c) A development step of developing the exposed film.

(d) A heating step of heating the developed film at 50° C. to 450° C.

In a case where heating is carried out in the heating step, the resin layer cured by exposure can be further cured. In this heating step, for example, the above-described thermal-base generator is decomposed and sufficient curability is obtained.

The method for manufacturing a laminate according to the preferred embodiment of the present invention includes a method for manufacturing a cured film according to the embodiment of the present invention. In the method for manufacturing a laminate of the present embodiment, the step (a), the steps (a) to (c), or the steps (a) to (d) are further carried out again after forming the cured film according to the above-described method for manufacturing a cured film. In particular, it is preferable to carry out each of the above steps a plurality of times, for example, 2 to 5 times (that is, 3 to 6 times in total) in order. By laminating the cured film in this manner, a laminate can be obtained. In the present invention, it is preferable to provide a metal layer particularly on the portion in which a cured film is provided, between the cured films, or both thereon and therebetween. In manufacturing a laminate, it is not necessary to repeat all the steps (a) to (d), and as described above, at least the step (a), preferably the steps (a) to (c) or the steps (a) to (d) can be carried out a plurality of times to obtain a laminate of the cured film.

<Film Forming Step (Layer Forming Step)>

The manufacturing method according to the preferred embodiment of the present invention includes the film forming step (layer forming step) of applying the curable resin composition to a base material to form a film (having a layer shape).

The kind of base material can be appropriately determined depending on the use application, and examples thereof are a base material for semiconductor manufacturing, such as silicon, silicon nitride, polysilicon, silicon oxide, or amorphous silicon, quartz, glass, an optical film, a ceramic material, a vapor-deposited film, a magnetic film, a reflective film, metal base materials such as Ni, Cu, Cr, and Fe, paper, spin-on-glass (SOG), a thin film transistor (TFT) array base material, and an electrode plate of a plasma display panel (PDP), and are not particularly limited thereto. In the present invention, in particular, a base material for semiconductor manufacturing is preferable, and a silicon base material is more preferable.

Further, as the base material, for example, a plate-shaped base material (substrate) is used.

In a case where the curable resin composition layer is formed on a surface of a resin layer or on a surface of the metal layer, the resin layer or the metal layer is the base material.

The means for applying a curable resin composition to a base material is preferably coating.

Specifically, as means for application, a dip coating method, an air knife coating method, a curtain coating method, a wire bar coating method, a gravure coating method, an extrusion coating method, a spray coating method, a spin coating method, a slit coating method, and an inkjet method are exemplified. From the viewpoint of uniformity of the thickness of the curable resin composition layer, the spin coating method, the slit coating method, the spray coating method, or the inkjet method is more preferable. A resin layer having a desired thickness can be obtained by appropriately adjusting the solid content concentration and application conditions according to the method. In addition, the coating method can be appropriately selected depending on the shape of the base material. In a case where a circular base material such as a wafer is used, the spin coating method, the spray coating method, the inkjet method, and the like are preferable, and in a case where a rectangular base material is used, the slit coating method, the spray coating method, the inkjet method, and the like are preferable. In the case of the spin coating method, for example, it can be applied at a rotation speed of 500 to 2,000 revolutions per minute (rpm) for about 10 seconds to 1 minute.

In addition, it is also possible to apply a method of transferring a coating film formed in advance on a temporary support by the above-described coating method, onto a base material.

Regarding the transfer method, the manufacturing methods disclosed in paragraphs 0023, and 0036 to 0051 of JP2006-023696A and paragraphs 0096 to 0108 of JP2006-047592A can be also suitably used in the present invention.

<<Drying Step>>

The manufacturing method according to the embodiment of the present invention may include, after forming the above film (the curable resin composition layer), a step of drying to remove the solvent after the film forming step (the layer forming step). The preferred drying temperature is 50° C. to 150° C., more preferably 70° C. to 130° C., and still more preferably 90° C. to 110° C. Examples of the drying time include 30 seconds to 20 minutes, and the drying time is preferably 1 minute to 10 minutes and more preferably 3 minutes to 7 minutes.

<<Exposure Step>>

The manufacturing method according to the embodiment of the present invention may include an exposure step of exposing the above film (the curable resin composition layer). The exposure dose is not particularly specified as long as the curable resin composition can be cured, and for example, irradiation with 100 to 10,000 mJ/cm$^2$ is preferable, and irradiation with 200 to 8,000 mJ/cm$^2$ is more preferable, in terms of conversion of exposure energy at a wavelength of 365 nm.

The exposure wavelength can be appropriately determined in a range of 190 to 1,000 nm and preferably in a range of 240 to 550 nm.

Examples of the light source which are mentioned in relation to the wavelength, include (1) a semiconductor laser (wavelength: 830 nm, 532 nm, 488 nm, 405 nm, or the like); (2) a metal halide lamp; (3) a high-pressure mercury lamp, a g-ray (wavelength: 436 nm), an h-ray (wavelength: 405 nm), an i-ray (wavelength: 365 nm), or Broad (three wavelengths of the g, h, and i-rays); (4) an excimer laser, a KrF excimer laser (wavelength: 248 nm), an ArF excimer laser (wavelength: 193 nm), or an $F_2$ excimer laser (wavelength: 157 nm); (5) an extreme ultraviolet (EUV) ray (wavelength: 13.6 nm); and (6) an electron beam. Regarding the curable resin composition according to the embodiment of the present invention, the exposure with a high-pressure mercury lamp is particularly preferable, and the exposure with an i-ray is particularly preferable. In this case, particularly high exposure sensitivity can be obtained.

<Development Step>

The manufacturing method according to the embodiment of the present invention may include a development step of carrying out development treatment on the exposed film (the exposed curable resin composition layer). By carrying out development, an unexposed portion (non-exposed portion) is removed. The development method is not particularly limited as long as the development method can form the desired pattern, and, for example, a development method such as paddle, spray, immersion, and ultrasonic waves can be employed.

Development is carried out using a developer. The developer can be used without particular limitation as long as it can remove the unexposed portion (the non-exposed portion). The developer preferably contains an organic solvent, and the developer more preferably contains 90% or more of the organic solvent. In the present invention, the developer preferably contains an organic solvent having a C log P value of −1 to 5 and more preferably an organic solvent having a C log P value of 0 to 3. The C log P value can be determined as a calculated value by inputting a structural formula in ChemBioDraw.

Suitable examples of the organic solvent include esters such as ethyl acetate, n-butyl acetate, amyl formate, isoamyl acetate, isobutyl acetate, butyl propionate, isopropyl butyrate, ethyl butyrate, butyl butyrate, methyl lactate, ethyl lactate, γ-butyrolactone, ε-caprolactone, δ-valerolactone, an alkyl alkyloxyacetate (example: a methyl alkyloxyacetate, an ethyl alkyloxyacetate, and a butyl alkyloxyacetate (for example, methyl methoxyacetate, ethyl methoxyacetate, butyl methoxyacetate, methyl ethoxyacetate, and ethyl ethoxyacetate)), 3-alkyloxypropionic acid alkyl esters (example: a methyl 3-alkyloxypropionate and an ethyl 3-alkyloxypropionate (for example, methyl 3-methoxypropionate, ethyl 3-methoxypropionate, methyl 3-ethoxypropionate, and ethyl 3-ethoxypropionate)), 2-alkyloxypropionic acid alkyl esters (example: a methyl 2-alkyloxypropionate, an ethyl 2-alkyloxypropionate, and a propyl 2-alkyl oxypropionate (for example, methyl 2-methoxypropionate, ethyl 2-methoxypropionate, propyl 2-methoxypropionate, methyl 2-ethoxypropionate, and ethyl 2-ethoxypropionate)), a methyl 2-alkyloxy-2-methylpropionate and an ethyl 2-alkyloxy-2-methylpropionate (for example, methyl 2-methoxy-2-methylpropionate and ethyl 2-ethoxy-2-methylpropionate), methyl pyruvate, ethyl pyruvate, propyl pyruvate, methyl acetoacetate, ethyl acetoacetate, methyl 2-oxobutanoate, and ethyl 2-oxobutanoate; ethers such as diethylene glycol dimethyl ether, tetrahydrofuran, ethylene glycol monomethyl ether, ethylene glycol monoethyl ether, methyl cellosolve acetate, ethyl cellosolve acetate, diethylene glycol monomethyl ether, diethylene glycol monoethyl ether, diethylene glycol monobutyl ether, propylene glycol monomethyl ether, propylene glycol monomethyl ether acetate, propylene glycol monoethyl ether acetate, and propylene glycol monopropyl ether acetate; ketones such as methyl ethyl ketone, cyclohexanone, cyclopentanone, 2-heptanone, 3-heptanone, and N-methyl-2-pyrrolidone; aromatic hydrocarbons such as toluene, xylene, anisole, and limonene; and sulfoxides such as dimethyl sulfoxide.

In the present invention, cyclopentanone or γ-butyrolactone is particularly preferable, and cyclopentanone is more preferable.

The developer is preferably 50% by mass or more of an organic solvent, more preferably 70% by mass or more of an organic solvent, and still more preferably 90% by mass or more of an organic solvent. In addition, in the developer, the content of the organic solvent may be 100% by mass.

The development time is preferably 10 seconds to 5 minutes. The temperature of the developer at the time of development is not particularly limited, and the development can usually be carried out at 20° C. to 40° C.

After treating with the developer, rinsing may be further carried out. The rinsing is preferably carried out with a solvent different from the developer. For example, the rinsing can be carried out using a solvent contained in the curable resin composition. The rinsing time is preferably 5 seconds to 1 minute.

<Heating Step>

The manufacturing method according to the embodiment of the present invention preferably includes a step (a heating step) of heating the above developed film at 50° C. to 450° C.

The heating step is preferably provided after the film forming step (the layer forming step), the drying step, and the development step. In the heating step, for example, the above-described thermal-base generator decomposes to generate a base, and the cyclization reaction of the heterocyclic ring-containing polymer precursor proceeds. In addition, the curable resin composition according to the embodiment of the present invention may contain a radically polymerizable compound other than the heterocyclic ring-containing polymer precursor, and the curing of the radically polymerizable compound other than the heterocyclic ring-containing polymer precursor, which is not reacted, can also be allowed to proceed in this step. The heating temperature (the maximum heating temperature) of the layer in the heating step is preferably 50° C. or higher, more preferably 80° C. or higher, still more preferably 140° C. or higher, particularly preferably 150° C. or higher, even more preferably 160° C. or higher, and even still more preferably 170° C. or higher. The upper limit is preferably 450° C. or lower, more preferably 350° C. or lower, still more preferably 250° C. or lower, and particularly preferably 220° C. or lower.

The heating is preferably carried out at a temperature elevation rate of 1° C. to 12° C./min from the temperature at the start of heating to the maximum heating temperature, more preferably 2° C. to 10° C./min, and still more preferably 3° C. to 10° C./min. In a case where the above temperature elevation rate is set to 1° C./min or higher, excessive volatilization of the amine can be prevented while securing productivity, and in a case where the above temperature elevation rate is to 12° C./min or lower, residual stress of the cured film can be relieved.

The temperature at the start of heating is preferably 20° C. to 150° C., more preferably 20° C. to 130° C., and still more preferably 25° C. to 120° C. The temperature at the start of heating refers to a temperature at which the step of heating to the maximum heating temperature is started. For example, in a case where the curable resin composition is applied on a base material and then dried, the temperature at the start of heating is the temperature of the film (the layer) after drying, and for example, it is preferable to gradually raise the temperature from a temperature lower by 30° C. to 200° C. than the boiling point of the solvent contained in the curable resin composition.

The heating time (the heating time at the maximum heating temperature) is preferably 10 to 360 minutes, more preferably 20 to 300 minutes, and still more preferably 30 to 240 minutes.

Particularly, in the case of forming a multilayer laminate, the heating is preferably carried out at a heating temperature of 180° C. to 320° C. and more preferably 180° C. to 260° C., from the viewpoint of the adhesiveness between layers of the cured film. Although the reason is not clear, it is conceived that, at this temperature, the ethynyl groups of the heterocyclic ring-containing polymer precursor between layers mutually undergo a crosslinking reaction.

The heating may be carried out stepwise. For example, a pretreatment step in which the temperature is raised from 25° C. to 180° C. at 3° C./min, held at 180° C. for 60 minutes, raised from 180° C. to 200° C. at 2° C./min, and held at 200° C. for 120 minutes, may be carried out. The heating temperature as the pretreatment step is preferably 100° C. to 200° C., more preferably 110° C. to 190° C., and still more preferably 120° C. to 185° C. In the pretreatment step, it is also preferable to carry out the treatment while irradiating with ultraviolet rays as described in U.S. Pat. No. 9,159,547B. By such a pretreatment step, it is possible to improve the properties of the film. The pretreatment step may be carried out for a short time of about 10 seconds to two hours and more preferably 15 seconds to 30 minutes. The pretreatment may be carried out in two or more steps, for example, a pretreatment step 1 may be carried out in a range of 100° C. to 150° C., and then a pretreatment step 2 may be carried out in a range of 150° C. to 200° C.

Further, cooling may be carried out after heating, and the cooling rate, in this case, is preferably 1 to 5° C./min.

It is preferable that the heating step is carried out in an atmosphere of low oxygen concentration by causing an inert gas such as nitrogen, helium, argon, or the like to flow, from the viewpoint of preventing the decomposition of the heterocyclic ring-containing polymer precursor. The oxygen concentration is preferably 50 ppm (volume ratio) or lower, and more preferably 20 ppm (volume ratio) or lower.

<Metal Layer Forming Step>

It is preferable that the manufacturing method according to the embodiment of the present invention includes a metal layer forming step of forming a metal layer on the surface of the film (the curable resin composition layer) after development treatment.

As the metal layer, while existing metal kinds can be used without particular limitation, copper, aluminum, nickel, vanadium, titanium, chromium, cobalt, gold, and tungsten are exemplified, copper and aluminum are more preferable, and copper is still more preferable.

The method of forming the metal layer is not particularly limited, and the existing method can be applied. For example, the methods disclosed in JP2007-157879A, JP2001-521288A, JP2004-214501A, and JP2004-101850A can be used. For example, photolithography, lift-off, electrolytic plating, electroless plating, etching, printing, and a method obtained by combining these may be conceivable. More specific examples of the method of forming the metal layer include a patterning method obtained by combining sputtering, photolithography, and etching, and a patterning method combining photolithography and electrolytic plating.

The thickness of the metal layer at the thickest part is preferably 0.1 to 50 µm and more preferably 1 to 10 µm.

<Laminating Step>

The production method according to the embodiment of the present invention preferably further includes a laminating step.

The laminating step is a series of steps including carrying out the following steps in order on the surface of the cured film (the resin layer) or the metal layer; (a) film forming step (layer forming step), (b) exposure step, (c) development step, and (d) heating step again on the surface of the cured film (the resin layer) or the metal layer. However, the aspect may be such that only the (a) film forming step is repeated. In addition, the aspect may be such that the (d) heating step is carried out at one time at the end or in the middle of the lamination. That is, the aspect may be such that the steps (a) to (c) are repeated a predetermined number of times, and then the heating of the step (d) is carried out to cure the laminated curable resin composition layers at one time. In addition, the (c) development step may be followed by the (e) metal layer forming step, and even in this case, the heating of the step (d) may be carried out each time, or the heating of the step (d) may be carried out at one time after lamination is carried out a predetermined number of times. Further, the laminating step may appropriately include the above-described drying step, heating step, and the like.

In a case where another laminating step is further carried out after the laminating step, a surface activation treatment step may be further carried out after the heating step, the exposure step, or the metal layer forming step. Examples of the surface activation treatment include plasma treatment.

The laminating step is preferably carried out 2 to 5 times and more preferably 3 to 5 times.

For example, a configuration having resin layers of 3 or more and 7 or less, such as a resin layer/a metal layer/a resin layer/a metal layer/a resin layer/a metal layer, is preferable, and a configuration having resin layers of 3 or more and 5 or less is more preferable.

In the present invention, an aspect in which after a metal layer is provided, further a cured film (a resin layer) of the curable resin composition is formed to cover the metal layer is particularly preferable. Specifically, an aspect in which (a) film forming step, (b) exposure step, (c) development step, (e) metal layer forming step, and (d) heating step are repeated in order, or an aspect in which (a) film forming step, (b) exposure step, (c) development step, and (e) metal layer forming step are repeated in order, and then (d) heating step is carried out at one time at the end or in the middle thereof. By alternately carrying out the laminating step of laminating the curable resin composition layer (the resin layer) and the metal layer forming step, the curable resin composition layer (resin layer) and the metal layer can be alternately laminated.

In the present invention, a semiconductor device having the cured film or the laminate according to the embodiment of the present invention is also disclosed. As the specific example of the semiconductor device using the curable resin composition according to the embodiment of the present invention for forming an interlayer insulating film for a re-distribution layer, the description in paragraphs 0213 to 0218 and the description of FIG. 1 of JP2016-027357A can be referred to, the content of which is incorporated in the present specification.

(Polymer Precursor)

The polymer precursor according to the embodiment of the present invention is at least one polymer precursor selected from the group consisting of a polyimide precursor and a polybenzoxazole precursor, which includes;

a repeating unit represented by Formula (PI-B1) or a repeating unit represented by Formula (PB-B1),
where the acid value is 1 mmol/g or less.

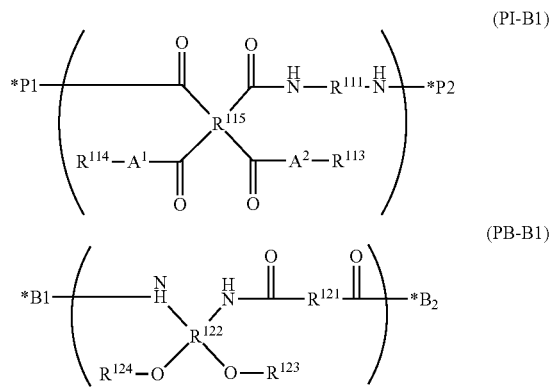

in Formulae (PI-B1) or (PB-B1), $A^1$ and $A^2$ each independently represent an oxygen atom or —NH—, $R^{111}$ represents a divalent organic group, $R^{115}$ represents a tetravalent organic group, $R^{113}$ and $R^{114}$ each independently represent a hydrogen atom or a monovalent organic group, and $*^{P1}$ and $*^{P2}$ each independently represent a bonding site to another structure, where at least one of $R^{113}$ or $R^{114}$ has a heterocyclic ring structure containing two or more nitrogen atoms, $*^{P1}$ is bonded to a structure containing a heterocyclic ring structure containing two or more nitrogen atoms, or at least one of $R^{113}$ or $R^{114}$ has a heterocyclic ring structure containing two or more nitrogen atoms and $*^{P1}$ is bonded to a structure containing a heterocyclic ring structure containing two or more nitrogen atoms, and $R^{121}$ represents a divalent organic group, $R^{122}$ represents a tetravalent organic group, $R^{123}$ and $R^{124}$ each independently represent a hydrogen atom or a monovalent organic group, and $*^{B1}$ and $*^{B2}$ each independently represent a bonding site to another structure, where at least one of $R^{124}$ or $R^{123}$ has a heterocyclic ring structure containing two or more nitrogen atoms, $*^{B2}$ is bonded to a structure containing a heterocyclic ring structure containing two or more nitrogen atoms, or at least one of $R^{124}$ or $R^{123}$ has a heterocyclic ring structure containing two or more nitrogen atoms and $*^{B2}$ is bonded to a structure containing a heterocyclic ring structure containing two or more nitrogen atoms.

In Formulae (PI-B1) or (PB-B1), $A^1$, $A^2$, $R^{111}$, $R^{115}$, $R^{113}$, $R^{114}$, $*^{P1}$, $*^{P2}$, $R^{121}$, $R^{122}$, $R^{123}$, $R^{124}$, $*^{B1}$, and $*^{B2}$ are respectively synonymous with $A^1$, $A^2$, $R^{111}$, $R^{115}$, $R^{113}$, $R^{114}$, $*^{P1}$, $*^{P2}$, $R^{121}$, $R^{122}$, $R^{123}$, $R^{124}$, $*^{B1}$ and $*^{B2}$ in Formulae (PI-A1) or (PB-A1), and the same applies to the preferred aspect.

The heterocyclic ring structure containing two or more nitrogen atoms is preferably bonded to a repeating unit containing a terminal of the specific polymer precursor.

Use Application

The polymer precursor according to the embodiment of the present invention is preferably used as a polymer precursor in a curable resin composition.

In addition, in a case where a composition in which a polyimide precursor in the related art or a polybenzoxazole precursor in the related art is used for, for example, a composition for an interlayer insulating film, a part or all of the polyimide precursor in the related art or the polybenzoxazole precursor in the related art can be replaced with the polymer precursor according to the embodiment of the present invention and used without particular limitation.

Since the cured product of the composition containing the polymer precursor according to the embodiment of the present invention is excellent metal adhesiveness, it is conceived that the polymer precursor according to the embodiment of the present invention is suitably used as a component in the composition for forming a cured product that is in contact with a metal, such as an insulating film.

EXAMPLES

Hereinafter, the present invention will be described more specifically with reference to Examples. Materials, amounts used, proportions, treatment details, treatment procedures, and the like shown in the following examples can be appropriately changed without departing from the gist of the present invention. Accordingly, a scope of the present invention is not limited to the following specific examples. "Parts" and "%" are on the mass basis unless otherwise described.

(Synthesis of Specific Polymer Precursor)

Synthesis Example 1: Synthesis of PI-1

While removing moisture in a drying reactor having a flat bottom joint equipped with a stirrer, a condenser, and an internal thermometer, 21.2 g (68.1 mmol) of oxydiphthalic acid dianhydride was suspended in 100 mL of diethylene glycol dimethyl ether. 18.2 g (139 mmol) of 2-hydroxyethyl methacrylate, 0.05 g of hydroquinone, and 24.0 g (303 mmol) of pyridine were subsequently added and stirred at a temperature of 60° C. for 4 hours. Next, the mixture was then cooled to −10° C., and then 16.6 g (138 mmol) of thionyl chloride was added thereto dropwise over 90 minutes. A white precipitate of pyridinium hydrochloride was obtained. The temperature of the mixture was then raised to 0° C., stirring was carried out for 2 hours, and then 9.7 g (123 mmol) of pyridine and 25 mL of N-methylpyrrolidone (NMP) were added thereto, whereby a transparent solution was obtained. Then, a solution obtained by dissolving 12.3 g (612 mmol) of 4,4'-diaminodiphenyl ether in 100 mL of NMP was dropwise added to the obtained transparent solution over 1 hour. Viscosity increased while adding 4,4'-diaminodiphenyl ether. Next, 1.74 g (10 mmol) of 1-(4-aminobenzyl)-1,2,4-triazole was added, the mixture was stirred for 2 hours, 20 mL of ethanol was added dropwise over 30 minutes, and the temperature was raised to room temperature. Next, the polyimide precursor resin was precipitated in 4 liters of water and the water-polyimide precursor resin mixture was stirred for 15 minutes at a speed of 500 rpm. The polyimide precursor resin was filtered off, stirred again in 4 liters of water for 30 minutes, and filtered again. Then, the obtained polyimide precursor resin was dried under reduced pressure at 40° C. for 2 days to obtain PI-1. The weight-average molecular weight (Mw) of PI-1 was 21,500, and the number-average molecular weight (Mn) thereof was 10,500.

The acid value of PI-1 was 0.08 mmol/g.

The structure of PI-1 is presumed to be the structure represented by Formula (PI-1).

In Formula (PI-1), the square brackets indicate that the structure inside the square brackets is a repeating unit, where it is indicated that * at one of the terminals of the above repeating unit is directly bonded to * in the structure represented by Formula (PI-1-T).

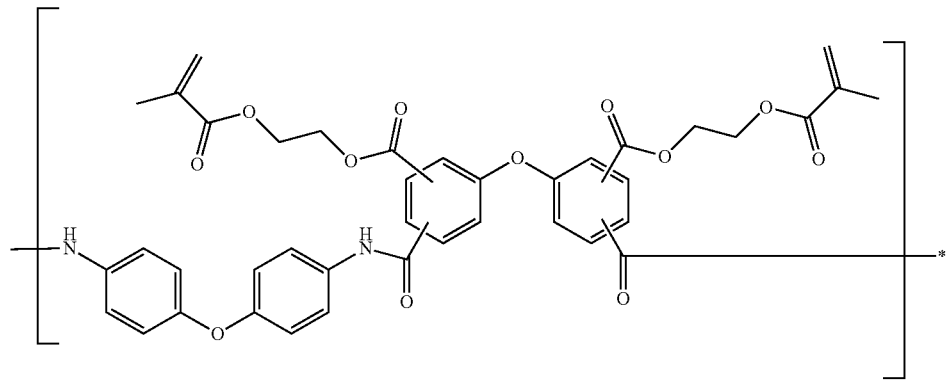

(PI-1)

(PI-1-T)

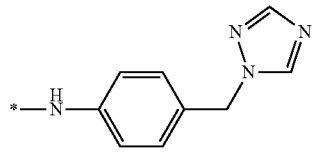

Synthesis Example 2: Synthesis of PI-2

While removing moisture in a drying reactor having a flat bottom joint equipped with a stirrer, a condenser, and an internal thermometer, 21.2 g (68.1 mmol) of oxydiphthalic acid dianhydride was suspended in 100 mL of diethylene glycol dimethyl ether. 18.2 g (139 mmol) of 2-hydroxyethyl methacrylate, 0.05 g of hydroquinone, and 24.0 g (303 mmol) of pyridine were subsequently added and stirred at a temperature of 60° C. for 4 hours. Next, the mixture was then cooled to −10° C., and then 16.6 g (138 mmol) of thionyl chloride was added thereto dropwise over 90 minutes. A white precipitate of pyridinium hydrochloride was obtained. The temperature of the mixture was then raised to 0° C., stirring was carried out for 2 hours, and then 9.7 g (123 mmol) of pyridine and 25 mL of N-methylpyrrolidone (NMP) were added thereto, whereby a transparent solution was obtained. Then, a solution obtained by dissolving 12.3 g (612 mmol) of 4,4'-diaminodiphenyl ether in 100 mL of NMP was dropwise added to the obtained transparent solution over 1 hour. Viscosity increased while adding 4,4'-diaminodiphenyl ether. Next, 0.99 g (10 mmol) of (1H-tetrazole-5-ylmethyl)amine was added, the mixture was stirred for 2 hours, 20 mL of ethanol was added dropwise over 30 minutes, and the temperature was raised to room temperature. Next, the polyimide precursor resin was precipitated in 4 liters of water and the water-polyimide precursor resin mixture was stirred for 15 minutes at a speed of 500 rpm. The polyimide precursor resin was filtered off, stirred again in 4 liters of water for 30 minutes, and filtered again. Then, the obtained polyimide precursor resin was dried under reduced pressure at 40° C. for 2 days to obtain PI-2. The weight-average molecular weight (Mw) of PI-2 was 22,500, and the number-average molecular weight (Mn) thereof was 11,200.

The acid value of PI-2 was 0.07 mmol/g.

The structure of PI-2 is presumed to be the structure represented by Formula (PI-2).

In Formula (PI-2), the square brackets indicate that the structure inside the square brackets is a repeating unit, where it is indicated that * at one of the terminals of the above repeating unit is directly bonded to * in the structure represented by Formula (PI-2-T).

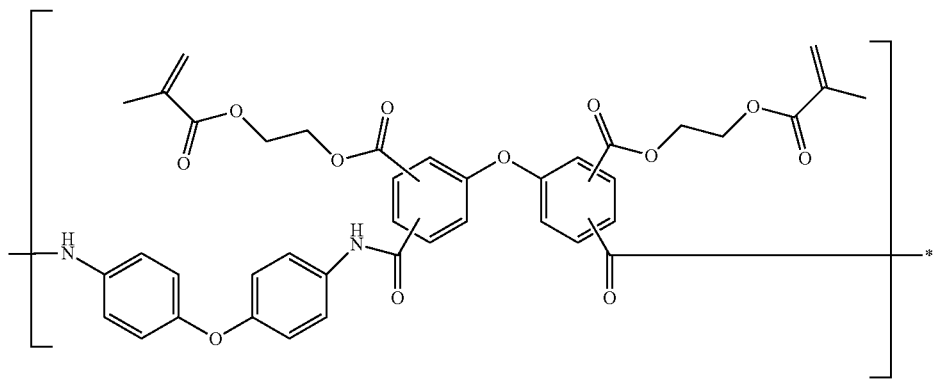

(PI-2)

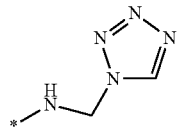

(PI-2-T)

Synthesis Example 3: Synthesis of PI-3

While removing moisture in a drying reactor having a flat bottom joint equipped with a stirrer, a condenser, and an internal thermometer, 21.2 g (68.1 mmol) of oxydiphthalic acid dianhydride was suspended in 100 mL of diethylene glycol dimethyl ether. 18.2 g (139 mmol) of 2-hydroxyethyl methacrylate, 0.05 g of hydroquinone, and 24.0 g (303 mmol) of pyridine were subsequently added and stirred at a temperature of 60° C. for 4 hours. Next, the mixture was then cooled to −10° C., and then 16.6 g (138 mmol) of thionyl chloride was added thereto dropwise over 90 minutes. A white precipitate of pyridinium hydrochloride was obtained. The temperature of the mixture was then raised to 0° C., stirring was carried out for 2 hours, and then 9.7 g (123 mmol) of pyridine and 25 mL of N-methylpyrrolidone (NMP) were added thereto, whereby a transparent solution was obtained. Then, a solution obtained by dissolving 12.3 g (612 mmol) of 4,4'-diaminodiphenyl ether in 100 mL of NMP was dropwise added to the obtained transparent solution over 1 hour. Viscosity increased while adding 4,4'- diaminodiphenyl ether. Next, 0.95 g (10 mmol) of 2-aminopyrimidine was added, the mixture was stirred for 2 hours, 20 mL of ethanol was added dropwise over 30 minutes, and the temperature was raised to room temperature. Next, the polyimide precursor resin was precipitated in 4 liters of water and the water-polyimide precursor resin mixture was stirred for 15 minutes at a speed of 500 rpm. The polyimide precursor resin was filtered off, stirred again in 4 liters of water for 30 minutes, and filtered again. Then, the obtained polyimide precursor resin was dried under reduced pressure at 40° C. for 2 days to obtain PI-3. The weight-average molecular weight (Mw) of PI-3 was 22,500, and the number-average molecular weight (Mn) thereof was 11,200.

The acid value of PI-3 was 0.08 mmol/g.

The structure of PI-3 is presumed to be the structure represented by Formula (PI-3).

In Formula (PI-3), the square brackets indicate that the structure inside the square brackets is a repeating unit, where it is indicated that * at one of the terminals of the above repeating unit is directly bonded to * in the structure represented by Formula (PI-3-T).

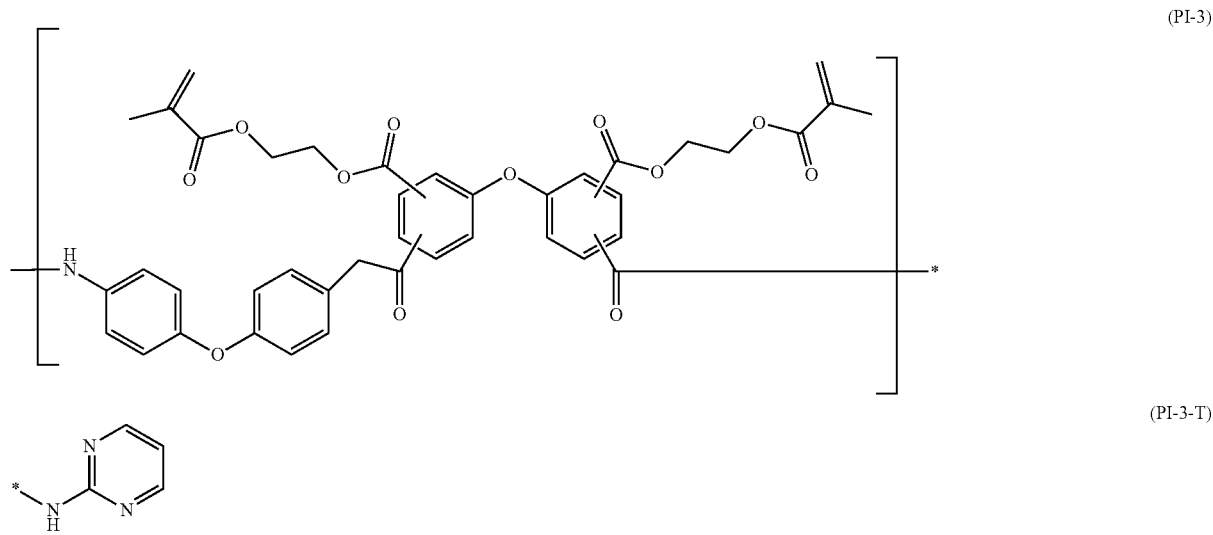

Synthesis Example 4: Synthesis of PI-4

While removing moisture in a drying reactor having a flat bottom joint equipped with a stirrer, a condenser, and an internal thermometer, 14.06 g (64.5 mmol) of pyromellitic acid dianhydride (dried at 140° C. for 12 hours), 16.8 g (129 mmol) of 2-hydroxyethyl methacrylate, 0.05 g of hydroquinone, 20.4 g (258 mmol) of pyridine, and 100 g of diethylene glycol dimethyl ether were mixed and stirred at a temperature of 60° C. for 6 hours. Next, the obtained mixture was cooled to −10° C., and then 16.1 g (135.5 mmol) of thionyl chloride was added thereto dropwise over 90 minutes. A white precipitate of pyridinium hydrochloride was obtained. The temperature of the mixture was then raised to 0° C., stirring was carried out for 2 hours, and then 9.7 g (123 mmol) of pyridine and 25 mL of N-methylpyrrolidone (NMP) were added thereto, whereby a transparent solution was obtained. Then, a solution obtained by dissolving 12.5 g (58.7 mmol) of 4,4'-diamino-2,2'-dimethylbiphenyl in 100 mL of NMP was dropwise added to the obtained transparent solution over 1 hour. Viscosity increased while adding 4,4'-diaminodiphenyl ether. Next, 0.85 g (8.6 mmol) of (1H-tetrazole-5-ylmethyl)amine was added, the mixture was stirred for 2 hours, 20 mL of ethanol was added dropwise over 30 minutes, and the temperature was raised to room temperature. Next, the polyimide precursor resin was precipitated in 4 liters of water and the water-polyimide precursor resin mixture was stirred for 15 minutes at a speed of 500 rpm. The polyimide precursor resin was filtered off, stirred again in 4 liters of water for 30 minutes, and filtered again. Then, the obtained polyimide precursor resin was dried under reduced pressure at 40° C. for 2 days to obtain PI-4. The weight-average molecular weight (Mw) of PI-4 was 23,700, and the number-average molecular weight (Mn) thereof was 12,100.

The acid value of PI-4 was 0.09 mmol/g.

The structure of PI-4 is presumed to be the structure represented by Formula (PI-4).

In Formula (PI-4), the square brackets indicate that the structure inside the square brackets is a repeating unit, where it is indicated that * at one of the terminals of the above repeating unit is directly bonded to * in the structure represented by Formula (PI-4-T).

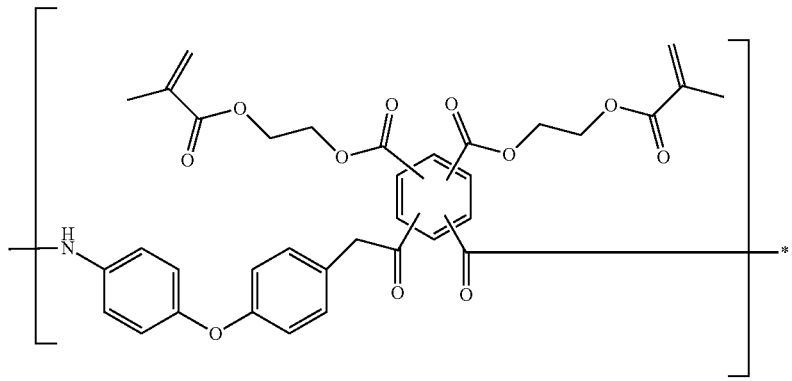

(PI-4)

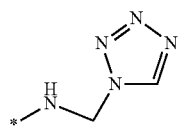

(PI-4-T)

Synthesis Example 5: Synthesis of PI-5

While removing moisture in a drying reactor having a flat bottom joint equipped with a stirrer, a condenser, and an internal thermometer, 9.49 g (32.25 mmol) of diphenyl-3,3',4,4'-tetracarboxylic acid dianhydride, 10.1 g (32.25 mmol) of oxydiphthalic acid dianhydride, 16.8 g (129 mmol) of 2-hydroxyethyl methacrylate, 0.05 g of hydroquinone, 20.4 g (258 mmol) of pyridine, and 100 g of diethylene glycol dimethyl ether were mixed and stirred at a temperature of 60° C. for 6 hours. Next, the obtained mixture was cooled to −10° C., and then 16.1 g (135.5 mmol) of thionyl chloride was added thereto dropwise over 90 minutes. A white precipitate of pyridinium hydrochloride was obtained. The temperature of the mixture was then raised to 0° C., stirring was carried out for 2 hours, and then 9.7 g (123 mmol) of pyridine and 25 mL of N-methylpyrrolidone (NMP) were added thereto, whereby a transparent solution was obtained. Then, a solution obtained by dissolving 12.5 g (58.7 mmol) of 4,4'-diamino-2,2'-dimethylbiphenyl in 100 mL of NMP was dropwise added to the obtained transparent solution over 1 hour. Viscosity increased while adding 4,4'-diaminodiphenyl ether. Next, 0.85 g (8.6 mmol) of (1H-tetrazole-5-ylmethyl)amine was added, the mixture was stirred for 2 hours, 20 mL of ethanol was added dropwise over 30 minutes, and the temperature was raised to room temperature. Next, the polyimide precursor resin was precipitated in 4 liters of water and the water-polyimide precursor resin mixture was stirred for 15 minutes at a speed of 500 rpm. The polyimide precursor resin was filtered off, stirred again in 4 liters of water for 30 minutes, and filtered again. Then, the obtained polyimide precursor resin was dried under reduced pressure at 40° C. for 2 days to obtain PI-5. The weight-average molecular weight (Mw) of PI-5 was 21,700, and the number-average molecular weight (Mn) thereof was 11,100.

The acid value of PI-5 was 0.08 mmol/g.

The structure of PI-5 is presumed to be the structure represented by Formula (PI-5).

In Formula (PI-5), the square brackets indicate that the structure inside the square brackets is a repeating unit, where it is indicated that * at one of the terminals of the above repeating unit is directly bonded to * in the structure represented by Formula (PI-5-T).

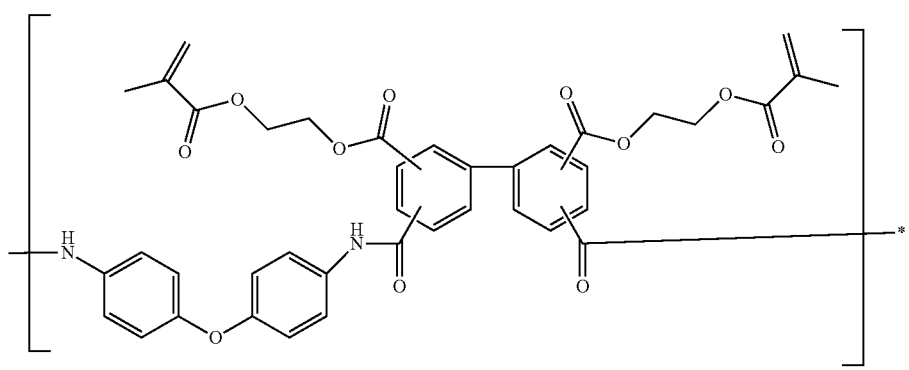

(PI-5)

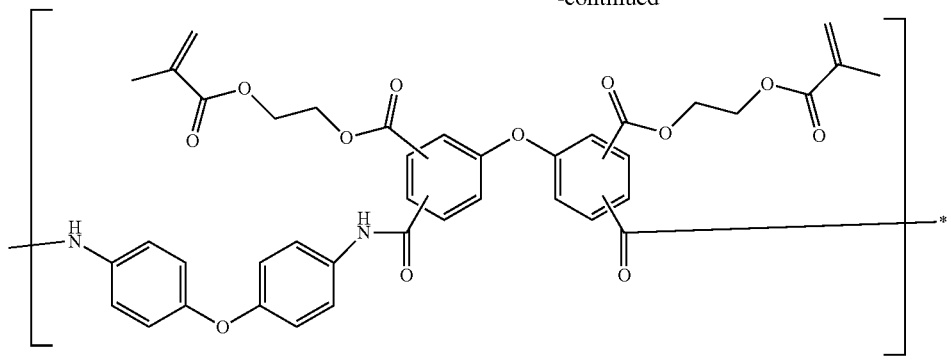

(PI-5-T)

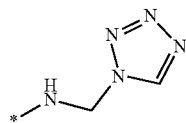

Synthesis Example 6: Synthesis of PI-6

While removing moisture in a drying reactor having a flat bottom joint equipped with a stirrer, a condenser, and an internal thermometer, 21.2 g (68.1 mmol) of oxydiphthalic dianhydride and 1.74 g (10 mmol) of 1-(4-aminobenzyl)-1,2,4-triazole were suspended in 120 mL of diethylene glycol dimethyl ether. 18.2 g (139 mmol) of 2-hydroxyethyl methacrylate, 0.05 g of hydroquinone, and 24.0 g (303 mmol) of pyridine were subsequently added and stirred at a temperature of 60° C. for 4 hours. Next, the mixture was then cooled to −10° C., and then 16.6 g (138 mmol) of thionyl chloride was added thereto dropwise over 90 minutes. A white precipitate of pyridinium hydrochloride was obtained. The temperature of the mixture was then raised to 0° C., stirring was carried out for 2 hours, and then 9.7 g (123 mmol) of pyridine and 25 mL of N-methylpyrrolidone (NMP) were added thereto, whereby a transparent solution was obtained. Then, a solution obtained by dissolving 12.3 g (612 mmol) of 4,4'-diaminodiphenyl ether in 100 mL of NMP was dropwise added to the obtained transparent solution over 1 hour. Viscosity increased while adding 4,4'-diaminodiphenyl ether. Next, 30 mL of ethanol was added dropwise over 30 minutes, and the temperature was raised to room temperature. Next, the polyimide precursor resin was precipitated in 4 liters of water and the water-polyimide precursor resin mixture was stirred for 15 minutes at a speed of 500 rpm. The polyimide precursor resin was filtered off, stirred again in 4 liters of water for 30 minutes, and filtered again. Then, the obtained polyimide precursor resin was dried under reduced pressure at 40° C. for 2 days to obtain PI-6. The weight-average molecular weight (Mw) of PI-6 was 20,500, and the number-average molecular weight (Mn) thereof was 10,100.

The acid value of PI-6 was 0.15 mmol/g.

The structure of PI-6 is presumed to be the structure represented by Formula (PI-6). The square brackets indicate that the structure inside the square brackets is a repeating unit, and PI-6 is conceived to be a structure in which the two repeating units represented in Formula (PI-6) are randomly bonded.

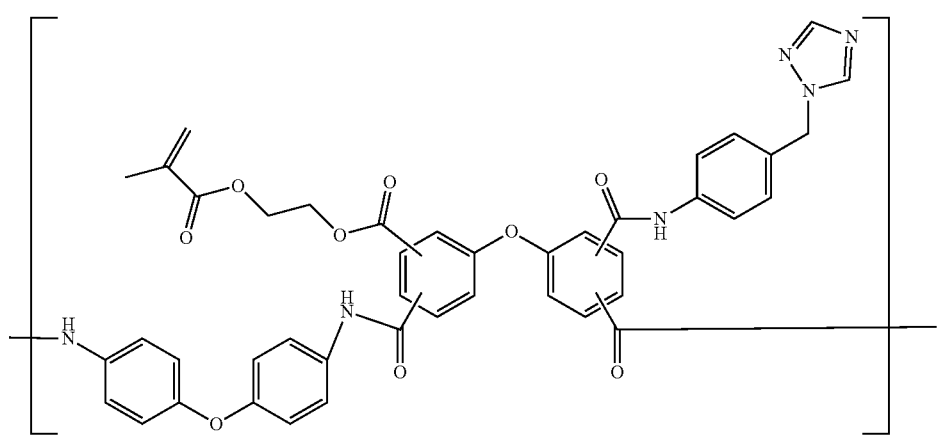

(PI-6)

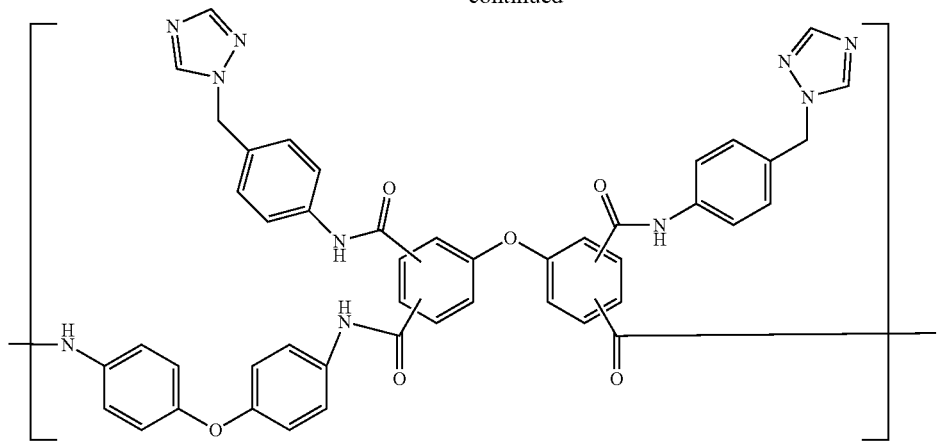

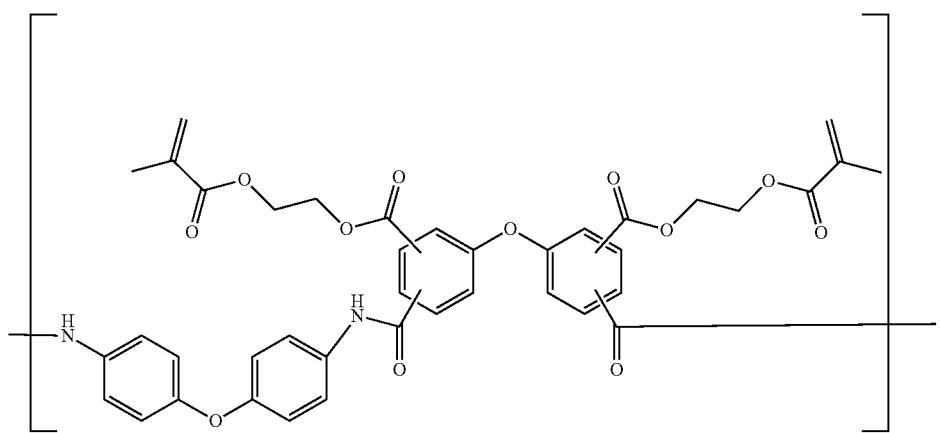

<Synthesis of Comparative Polymer CA-1>

While removing moisture in a drying reactor having a flat bottom joint equipped with a stirrer, a condenser, and an internal thermometer, 21.2 g (68.1 mmol) of oxydiphthalic acid dianhydride was suspended in 100 mL of diethylene glycol dimethyl ether. 18.2 g (139 mmol) of 2-hydroxyethyl methacrylate, 0.05 g of hydroquinone, and 24.0 g (303 mmol) of pyridine were subsequently added and stirred at a temperature of 60° C. for 4 hours. Next, the mixture was then cooled to −10° C., and then 16.6 g (138 mmol) of thionyl chloride was added thereto dropwise over 90 minutes. A white precipitate of pyridinium hydrochloride was obtained. The temperature of the mixture was then raised to 0° C., stirring was carried out for 2 hours, and then 9.7 g (123 mmol) of pyridine and 25 mL of N-methylpyrrolidone (NMP) were added thereto, whereby a transparent solution was obtained. Then, a solution obtained by dissolving 12.3 g (612 mmol) of 4,4′-diaminodiphenyl ether in 100 mL of NMP was dropwise added to the obtained transparent solution over 1 hour. Viscosity increased while adding 4,4′-diaminodiphenyl ether. Next, 0.97 g (8.6 mmol) of 3-pyridinemethanol was added, the mixture was stirred for 2 hours, 20 mL of ethanol was added dropwise over 30 minutes, and the temperature was raised to room temperature. Next, the polyimide precursor resin was precipitated in 4 liters of water and the water-polyimide precursor resin mixture was stirred for 15 minutes at a speed of 500 rpm. The polyimide precursor resin was filtered off, stirred again in 4 liters of water for 30 minutes, and filtered again. Then, the obtained polyimide precursor resin was dried under reduced pressure at 40° C. for 2 days to obtain CA-1. The weight-average molecular weight (Mw) of CA-1 was 23,200, and the number-average molecular weight (Mn) thereof was 11,900.

The structure of CA-1 is presumed to be the structure represented by Formula (CA-1).

In Formula (CA-1), the square brackets indicate that the structure inside the square brackets is a repeating unit, where it is indicated that * at one of the terminals of the above repeating unit is directly bonded to * in the structure represented by Formula (CA-1-T).

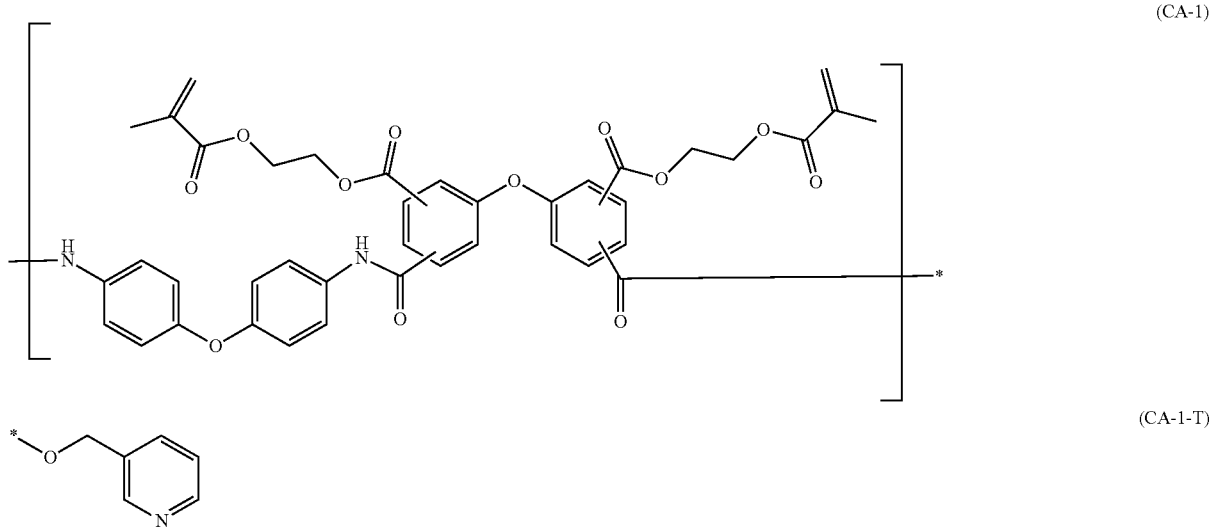

(CA-1)

(CA-1-T)

<Synthesis of Comparative Polymer CA-2>

While removing moisture in a drying reactor having a flat bottom joint equipped with a stirrer, a condenser, and an internal thermometer, 20.0 g (64.5 mmol) of oxydiphthalic dianhydride was suspended in 140 mL of diglyme. 16.8 g (129 mmol) of 2-hydroxyethyl methacrylate, 0.05 g of hydroquinone, and 10.7 g (135 mmol) of pyridine were subsequently added and stirred at a temperature of 60° C. for 18 hours. Next, the mixture was then cooled to −20° C., and then 16.1 g (135.5 mmol) of thionyl chloride was added thereto dropwise over 90 minutes. A white precipitate of pyridinium hydrochloride was obtained. The mixture was then warmed to room temperature, stirring was carried out for 2 hours, and then 9.7 g (123 mmol) of pyridine and 25 mL of N-methylpyrrolidone (NMP) were added thereto, whereby a transparent solution was obtained. Then, a solution obtained by dissolving 11.8 g (58.7 mmol) of 4,4'-diaminodiphenyl ether in 100 mL of NMP was dropwise added to the obtained transparent solution over 1 hour. Viscosity increased while adding 4,4'-diaminodiphenyl ether. Next, 5.6 g (17.5 mmol) of methanol and 0.05 g of 3,5-di-tert-butyl-4-hydroxytoluene were added, and the mixture was stirred for 2 hours. Next, the polyimide precursor resin was precipitated in 4 liters of water and the water-polyimide precursor resin mixture was stirred for 15 minutes at a speed of 500 rpm. The polyimide precursor resin was filtered off, stirred again in 4 liters of water for 30 minutes, and filtered again. Next, the obtained polyimide precursor resin was dried under reduced pressure at 45° C. for 3 days. The molecular weights of this polyimide precursor CA-2 were Mw=23,500 and Mn=8,800.

The comparative polymer CA-2 does not have a heterocyclic ring structure containing two or more nitrogen atoms and does not correspond to the specific polymer precursor.

EXAMPLES AND COMPARATIVE EXAMPLES

In each of Examples, components shown in Table 1 below were mixed to obtain each of the curable resin compositions. Further, in each of Comparative Examples, components shown in Table 1 below were mixed to obtain each of the comparative compositions. The obtained curable resin composition and the comparative composition were pressure-filtered through a filter made of polytetrafluoroethylene, having a pore width of 0.8 μm.

In Table 1, the numerical value in the column of "Parts by mass" indicates the content (in terms of the parts by mass) of each of the components.

In addition, in Table 1, the description of "-" indicates that the corresponding component is not contained.

In Table 1, in the column of "Content of group containing two or more nitrogen atoms (mmol)", the value of the "content of the heterocyclic ring structure containing two or more nitrogen atoms, contained in the polymer precursor, with respect to the total solid content of the composition" is described.

TABLE 11

| | | Specific polymer precursor | | | Solvent | | Polymerization initiator | | Polymerizable compound | | Polymerization inhibitor | |
|---|---|---|---|---|---|---|---|---|---|---|---|---|
| | | Kind | Parts by mass | Content of group containing two or more nitrogen atoms (mmol) | Kind | Parts by mass | Kind | Parts by mass | Kind | Parts by mass | Kind | Parts by mass |
| Example | 1 | PI-1 | 32 | 0.2 | DMSO/GBL | 60 | OXE-1 | 1.2 | SR209 | 6.0 | F-2 | 0.08 |
| | 2 | PI-2 | 32 | 0.2 | DMSO/GBL | 60 | OXE-1 | 1.2 | SR209 | 6.0 | F-3 | 0.08 |
| | 3 | PI-3 | 32 | 0.2 | DMSO/GBL | 60 | OXE-1 | 1.2 | SR209 | 6.0 | F-1 | 0.08 |
| | 4 | PI-4 | 32 | 0.2 | DMSO/GBL | 60 | OXE-1 | 1.2 | SR209 | 6.0 | F-2 | 0.08 |
| | 5 | PI-5 | 32 | 0.2 | DMSO/GBL | 60 | OXE-1 | 1.2 | SR209 | 6.0 | F-2 | 0.08 |
| | 6 | PI-6 | 32 | 0.2 | DMSO/GBL | 60 | OXE-1 | 1.2 | SR209 | 6.0 | F-2 | 0.08 |

TABLE 11-continued

| | | | | | | | | | | | | | |
|---|---|---|---|---|---|---|---|---|---|---|---|---|---|
| | 7 | PI-1 | 32 | 0.2 | DMSO/GBL | 60 | OXE-2 | 1.2 | SR209 | 6.0 | F-1 | 0.08 |
| | 8 | PI-1 | 32 | 0.2 | DMSO/GBL | 60 | OXE-2 | 1.2 | SR-231 | 6.0 | F-2 | 0.08 |
| | 9 | PI-1 | 32 | 0.2 | DMSO/GBL | 60 | OXE-1 | 1.2 | SR-239 | 6.0 | F-3 | 0.08 |
| | 10 | PI-2 | 32 | 0.2 | DMSO/GBL | 60 | OXE-1 | 1.2 | SR209 | 6.0 | F-1 | 0.08 |
| | 11 | PI-2 | 32 | 0.2 | DMSO/GBL | 60 | OXE-1 | 1.2 | SR231 | 6.0 | F-2 | 0.08 |
| | 12 | PI-2 | 32 | 0.2 | NMP | 60 | OXE-1 | 1.2 | SR239 | 6.0 | F-3 | 0.08 |
| | 13 | PI-2/ PI-5 | 16/ 16 | 0.2 | NMP/Ethyl lactate | 60 | OXE-1 | 1.2 | SR268 | 6.0 | F-1 | 0.08 |
| | 14 | PI-2 | 32 | 0.2 | DMSO/GBL | 60 | OXE-1 | 1.2 | SR239 | 6.0 | F-3 | 0.08 |
| | 15 | PI-2 | 32 | 0.2 | DMSO/GBL | 60 | OXE-1 | 1.2 | SR209 | 6.0 | F-1 | 0.08 |
| | 16 | PI-2/ PI-5 | 17.2/ 17.2 | 0.2 0.2 | NMP/Ethyl lactate | 60 | OXE-1 | 0.7 | SR209 | 2.7 | F-4 | 0.02 |
| | 17 | PI-2 | 32 | 0.2 | DMSO/GBL | 60 | OXE-1 | 1.2 | SR209 | 6.0 | F-1 | 0.08 |
| Comparative Example | 1 | CA-2 | 32 | 0 | DMSO/GBL | 60 | OXE-1 | 1.2 | SR209 | 6.0 | F-2 | 0.08 |
| | 2 | CA-2 | 32 | 0 | DMSO/GBL | 60 | OXE-1 | 1.2 | SR209 | 6.0 | F-2 | 0.08 |
| | 3 | CA-1 | 32 | 0 | DMSO/GBL | 60 | OXE-2 | 1.2 | SR209 | 6.0 | F-1 | 1.08 |
| | 4 | CA-2 | 32 | 0 | DMSO/GBL | 60 | OXE-2 | 1.2 | SR209 | 6.0 | F-1 | 1.08 |

| | | Metal adhesiveness improving agent | | Migration suppressing agent | | Onium salt | | Other additives | | Curing condition |
|---|---|---|---|---|---|---|---|---|---|---|
| | | Kind | Parts by mass | Kind | Parts by mass | Kind | Parts by mass | Kind | Parts by mass | Temperature |
| Example | 1 | G-2 | 0.7 | H-1 | 0.12 | I-1 | 2 | — | — | 230° C. |
| | 2 | G-3 | 0.7 | H-1 | 0.12 | I-1 | 2 | — | — | 230° C. |
| | 3 | G-1 | 0.7 | H-1 | 0.12 | I-1 | 2 | — | — | 230° C. |
| | 4 | G-2 | 0.7 | H-1 | 0.12 | I-1 | 2 | — | — | 230° C. |
| | 5 | G-2 | 0.7 | H-1 | 0.12 | I-1 | 2 | — | — | 230° C. |
| | 6 | G-2 | 0.7 | H-1 | 0.12 | I-1 | 2 | — | — | 230° C. |
| | 7 | G-1 | 0.7 | H-1 | 0.12 | I-1 | 2 | — | — | 230° C. |
| | 8 | G-2 | 0.7 | H-2 | 0.12 | I-1 | 2 | — | — | 230° C. |
| | 9 | G-3 | 0.7 | H-3 | 0.12 | I-1 | 2 | — | — | 230° C. |
| | 10 | G-1 | 0.7 | H-1 | 0.12 | I-1 | 2 | — | — | 230° C. |
| | 11 | G-2 | 0.7 | H-2 | 0.12 | I-1 | 2 | — | — | 230° C. |
| | 12 | G-3 | 0.7 | H-3 | 0.12 | I-1 | 2 | — | — | 230° C. |
| | 13 | G-1 | 0.7 | H-2 | 0.12 | I-1 | 2 | — | — | 230° C. |
| | 14 | G-3 | 0.7 | H-3 | 0.12 | I-1 | 2 | — | — | 230° C. |
| | 15 | G-1 | 0.7 | H-1 | 0.12 | I-1 | 4 | — | — | 230° C. |
| | 16 | G-2/ G-4 | 0.2/ 0.2 | — | — | — | — | J-1 | 1.4 | 200° C. |
| | 17 | G-1 | 0.7 | H-1 | 0.12 | I-1 | 10 | — | — | 180° C. |
| Comparative Example | 1 | G-2 | 0.7 | H-2 | 0.12 | I-1 | 2 | — | — | 230° C. |
| | 2 | G-2 | 0.7 | H-2 | 0.12 | I-1 | 6 | — | — | 230° C. |
| | 3 | G-1 | 0.7 | H-1 | 0.12 | I-1 | 2 | — | — | 230° C. |
| | 4 | G-1 | 0.7 | H-1 | 0.12 | I-1 | 10 | — | — | 180° C. |

Details of each of the components listed in Table 1 are as follows.

[Specific Polymer Precursor]
PI-1 to PI-6: PI-1 to PI-6 synthesized as described above
PB-1: PB-1 synthesized as described above
CA-1: CA-1 synthesized as described above

[Solvent]
DMSO: dimethyl sulfoxide
GBL: γ-butyrolactone
ethyl lactate
NMP: N-methylpyrrolidone In Table 1, the description of DMSO/GBL indicates that DMSO and GBL were mixed in a ratio of DMSO:GBL=20:80 (mass ratio).

In Table 1, the description of NMP/ethyl lactate indicates that NMP and ethyl lactate were mixed in a ratio of NMP:ethyl lactate=80:20 (mass ratio).

[Polymerization Initiator]
OXE-1: IRGACURE OXE 01 (manufactured by BASF SE)
OXE-2: IRGACURE OXE 02 (manufactured by BASF SE)

[Polymerizable Compound]
SR-209: SR-209 (manufactured by Sartomer USA, LLC)
SR-231: SR-231 (manufactured by Sartomer USA, LLC)
SR-239: SR-239 (manufactured by Sartomer USA, LLC)
SR-268: SR-268 (manufactured by Sartomer USA, LLC)

[Polymerization Inhibitor]
F-1: 1,4-benzoquinone
F-2: 4-methoxyphenol
F-3: 1,4-dihydroxybenzene
F-4: 2-nitroso-1-naphthol (manufactured by Tokyo Chemical Industry Co., Ltd.)

[Metal Adhesiveness Improving Agent]
G-1 to G-4: compounds having the following structures. In the following structural formulae, Et represents an ethyl group.

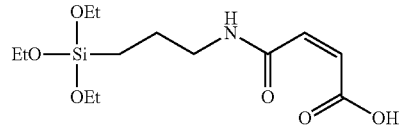

(G-1)

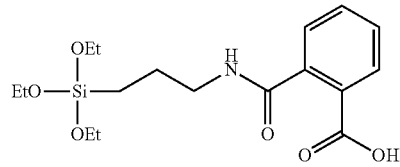

(G-2)

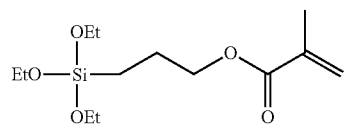

(G-3)

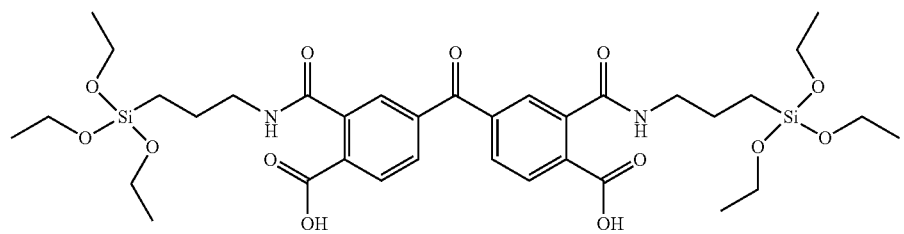

(G-4)

[Migration Suppressing Agent]
- H-1: 1H-tetrazole
- H-2: 1,2,4-triazole
- H-3: 5-phenyltetrazole

[Onium Salt]
- I-1: a compound having the following structure

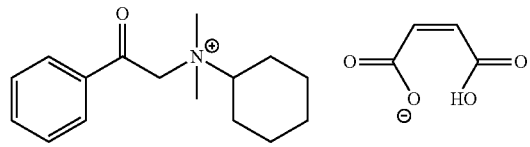

(I-1)

[Other Additives]
- J-1: N-phenyldiethanolamine (manufactured by Tokyo Chemical Industry Co., Ltd.)

Evaluation

In each of Examples and Comparative Examples, the prepared curable resin composition or comparative composition was used to evaluate the metal adhesiveness, the chemical resistance, and the storage stability.

Details of the evaluation method in each evaluation are described below.

[Metal Adhesiveness (Copper Adhesiveness)]

The curable resin composition and the comparative composition prepared in each of Examples and Comparative Examples were each applied in a layer shape onto a copper substrate by a spin coating method to obtain a curable resin composition layer or a comparative composition layer. The obtained copper substrate on which the curable resin composition layer or the comparative composition layer was formed was dried on a hot plate at 100° C. for 5 minutes, whereby a uniform curable resin composition layer or comparative composition layer having a thickness of 20 μm, formed on the copper substrate, was obtained. The curable resin composition layer or the comparative composition layer on the copper substrate was exposed to i-rays with an exposure energy of 500 mJ/cm$^2$ using a stepper (NSR 2005 i9C, manufactured by Nikon Corporation) and a photo mask on which a non-masked portion of 100 μm square was formed and then developed with cyclopentanone for 60 seconds to obtain a resin layer of 100 μm square. Further, the temperature was raised at a temperature elevation rate of 10° C./min in a nitrogen atmosphere, and after reaching the temperature described in the "Temperature" column of "Curing condition" in Table 1, this temperature was maintained for 3 hours to obtain a resin film 2.

The resin film 2 of 100 μm square on a copper substrate was subjected to the shearing force measurement in an environment of 25° C. and 65% relative humidity (RH) using a bond tester (Condor Sigma, manufactured by XYZ-TEC), and the results were evaluated according to the following evaluation standard. The evaluation results are shown in Table 2. It can be said that the larger the shearing force, the better the metal adhesiveness (the copper adhesiveness) of the cured film.

Evaluation Standard

A: The shearing force was more than 40 gf.
B: The shearing force was more than 35 gf and 40 gf or less.
C: The shearing force was more than 30 gf and 35 gf or less.
D: The shearing force was more than 25 gf and 30 gf or less.
E: The shearing force was 25 gf or less.
Here, 1 gf is 0.00980665 N.

[Metal Adhesiveness after Heating (Copper Adhesiveness)]

The metal adhesiveness after heating was evaluated according to the same evaluation method and evaluation standard as those in the evaluation of the metal adhesiveness described above, except that after maintaining the temperature indicated in the "Temperature" column of "Curing condition" for 3 hours, 1,000 hours were allowed to elapse in a constant-temperature tank at 60° C. The evaluation results are shown in Table 2. It can be said that the larger the shearing force, the better the metal adhesiveness (the copper adhesiveness) of the cured film.

[Storage Stability (Change in Film Thickness)]

—Measurement of Pre-Aging Film Thickness—

The curable resin composition or the comparative composition prepared in each of Examples and Comparative Examples were each applied onto a silicon wafer by a spin coating method to form a curable resin composition layer or a comparative composition layer. The obtained silicon wafer onto which the curable resin composition layer or the comparative composition layer was applied was dried on a hot plate at 100° C. for 5 minutes, whereby a curable resin composition layer or comparative composition layer having a uniform thickness of 15 μm on the silicon wafer was obtained. This value (15 μm) was set as the pre-aging film thickness.

—Measurement of Post-Aging Film Thickness—

The composition was put into a glass container, sealed, and allowed to stand in a light-shielded environment at 25° C. for 14 days, and then applied onto a silicon wafer by the spin coating method using the same rotation speed as that in the case where the pre-aging film thickness was determined, whereby a curable resin composition layer or a comparative composition layer was formed. The obtained silicon wafer onto which the curable resin composition layer or the comparative composition layer was applied was dried on a hot plate at 100° C. for 5 minutes, whereby a curable resin composition layer or comparative composition layer having a uniform thickness on the silicon wafer was obtained. The film thickness of the obtained curable resin composition layer or comparative composition was measured in the same manner as described above, and the obtained value was taken as the post-aging film thickness.

—Film Thickness Change Rate—

The film thickness change rate was calculated according to the following expression and evaluated according to the following evaluation standard. The evaluation results are shown in Table 2. It can be said that the smaller the film thickness change rate, the better the storage stability.

Film thickness change rate (%)=(pre-aging film thickness−post-aging film thickness)/pre-aging film thickness×100

Evaluation Standard

A: The film thickness change rate was less than 10%.
B: The film thickness change rate was 10% or more and less than 15%.

C: The film thickness change rate was 15% or more and less than 20%.

D: The film thickness change rate was 20% or more.

<Evaluation of Chemical Resistance>

The curable resin composition or the comparative composition prepared in each of Examples and Comparative Examples were each applied onto a silicon wafer by a spin coating method to form a curable resin composition layer. The obtained silicon wafer onto which the curable resin composition layer was applied was dried on a hot plate at 100° C. for 5 minutes, whereby a curable resin composition layer having a uniform thickness of 15 µm on the silicon wafer was formed. The curable resin composition layer on the silicon wafer was exposed with an exposure energy of 500 mJ/cm² using a stepper (NSR 2005 i9C, manufactured by Nikon Corporation), the temperature of the exposed curable resin composition layer (the resin layer) was raised at a temperature elevation rate of 10° C./min under a nitrogen atmosphere and then heated at the temperature and time indicated in Table 1 to obtain a cured layer (a resin layer) of the curable resin composition layer.

The obtained resin layer was immersed in the following chemical liquid under the following conditions, and the dissolution rate was calculated.

Chemical liquid: a 90:10 (mass ratio) mixture of dimethyl sulfoxide (DMSO) and an aqueous solution containing 25% by mass of tetramethylammonium hydroxide (TMAH).

Evaluation conditions: The resin layer was immersed in the chemical at 75° C. for 15 minutes, the film thicknesses before and after immersion were compared, and then the dissolution rate (nm/min) was calculated.

The evaluation was carried out according to the following evaluation standard, and the evaluation results are shown in Table 2.

Evaluation Standard

A: The dissolution rate was less than 200 nm/min.

B: The dissolution rate was 200 nm/min or more and less than 300 nm/min.

C: The dissolution rate was 300 nm/min or more and less than 400 nm/min.

D: The dissolution rate was 400 nm/min or more.

TABLE 2

|  |  | Metal adhesiveness (copper adhesiveness) | Metal adhesiveness after heating (copper adhesiveness) | Chemical resistance | Storage stability (film thickness change rate) |
|---|---|---|---|---|---|
| Example | 1 | B | B | A | B |
|  | 2 | A | A | B | A |
|  | 3 | B | B | A | B |
|  | 4 | A | A | B | A |
|  | 5 | A | A | B | B |
|  | 6 | A | A | A | B |
|  | 7 | A | A | A | B |
|  | 8 | B | B | A | B |
|  | 9 | B | B | A | B |
|  | 10 | A | A | B | A |
|  | 11 | A | A | B | A |
|  | 12 | A | A | B | A |
|  | 13 | A | A | B | A |
|  | 14 | A | A | B | A |
|  | 15 | A | A | A | A |
|  | 16 | A | A | A | B |
|  | 17 | A | A | B | B |

TABLE 2-continued

|  |  | Metal adhesiveness (copper adhesiveness) | Metal adhesiveness after heating (copper adhesiveness) | Chemical resistance | Storage stability (film thickness change rate) |
|---|---|---|---|---|---|
| Comparative Example | 1 | C | C | C | C |
|  | 2 | C | C | B | D |
|  | 3 | C | C | B | D |
|  | 4 | C | C | D | D |

From the above results, it can be seen that the curable resin composition containing the specific polymer precursor according to the present invention is excellent in the metal adhesiveness (the copper adhesiveness) of the cured film to be obtained.

The comparative compositions according to Comparative Examples 1 to 3 do not contain a specific polymer precursor. It can be seen that the comparative compositions according to Comparative Examples 1 to 3 are inferior in the metal adhesiveness (the copper adhesiveness).

Example 101

The curable resin composition according to Example 1 was applied by spinning onto a surface of a resin base material on which a thin copper layer was formed so that the film thickness was 20 µm. The curable resin composition applied onto the resin base material was dried at 100° C. for 2 minutes and then exposed using a stepper (NSR 1505 i6, manufactured by Nikon Corporation). The exposure was carried out through a mask of a square pattern (the square pattern: a length of 100 µm and a width of 100 µm, the number of repetitions: 10) at a wavelength of 365 nm and an exposure dose of 400 mJ/cm² to create a square remaining pattern. After exposure, development with cyclopentanone was carried out for 30 seconds, and rinsing with PGMEA was carried out for 20 seconds to obtain a pattern.

Then, heating was carried out at 230° C. for 3 hours to form an interlayer insulating film for a re-distribution layer. This interlayer insulating film for a re-distribution layer was excellent in adhesiveness between the thin copper layer and the layer of the curable resin composition after curing and was also excellent in insulation properties. Further, in a case where a semiconductor device was manufactured using this interlayer insulating film for a re-distribution layer, it has been confirmed that the semiconductor device operates without any problem.

What is claimed is:

1. A curable resin composition comprising:
    at least one polymer precursor selected from the group consisting of a polyimide precursor and a polybenzoxazole precursor,
    wherein the polymer precursor has a heterocyclic ring structure containing two or more nitrogen atoms, and an acid value of the polymer precursor is 1 mmol/g or less,
    wherein the polymer precursor has a repeating unit represented by formula (PI-A1) or formula (PB-A1),

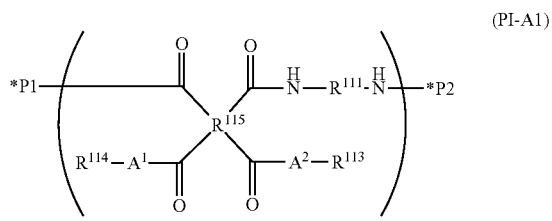

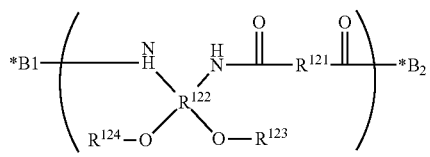

(PB-A1)

in formula (PI-A1) and (PB-A1), $A^1$ and $A^2$ each independently represent an oxygen atom or —NH—, $R^{111}$ represents a divalent organic group, $R^{115}$ represents a tetravalent organic group, $R^{113}$ and $R^{114}$ each independently represent a hydrogen atom or a monovalent organic group, and $*^{P1}$ and $*^{P2}$ each independently represent a bonding site to another structure, where at least one of $R^{113}$ or $R^{114}$ has a heterocyclic ring structure containing two or more nitrogen atoms and $*^{P1}$ is bonded to a structure containing a heterocyclic ring structure containing two or more nitrogen atoms, and $R^{121}$ represents a divalent organic group, $R^{122}$ represents a tetravalent organic group, $R^{123}$ and $R^{124}$ each independently represent a hydrogen atom or a monovalent organic group, and $*^{B1}$ and $*^{B2}$ each independently represent a bonding site to another structure, where at least one of $R^{124}$ or $R^{123}$ has a heterocyclic ring structure containing two or more nitrogen atoms and $*^{B2}$ is bonded to a structure containing a heterocyclic ring structure containing two or more nitrogen atoms.

2. The curable resin composition according to claim 1, wherein a content of the heterocyclic ring structure containing two or more nitrogen atoms, which is contained in the polymer precursor, is 0.01 to 1 mmol/g with respect to a total solid content of the composition.

3. The curable resin composition according to claim 1, wherein the repeating unit represented by Formula (PI-A1) or the repeating unit represented by Formula (PB-A1) is bonded to a repeating unit containing a terminal of the polymer precursor.

4. The curable resin composition according to claim 1, further comprising:
a photopolymerization initiator; and
at least one compound selected from the group consisting of an onium salt and a thermal-base generator.

5. The curable resin composition according to claim 1, wherein the curable resin composition is used for forming an interlayer insulating film for a re-distribution layer.

6. A cured film obtained by curing the curable resin composition according to claim 1.

7. A laminate comprising:
two or more layers of the cured films according to claim 6; and
a metal layer between any cured films.

8. A semiconductor device comprising the cured film according to claim 6.

9. A method for manufacturing a cured film, comprising a film forming step of applying the curable resin composition according to claim 1 onto a base material to form a film.

10. The method for manufacturing a cured film according to claim 9, further comprising:
an exposure step of exposing the film; and
a development step of developing the film.

11. The method for manufacturing a cured film according to claim 9, further comprising a heating step of heating the film at 50° to 450° C.

12. A polymer precursor that is at least one polymer precursor selected from the group consisting of a polyimide precursor and a polybenzoxazole precursor, the polymer precursor comprising:
a repeating unit represented by Formula (PI-B1) or a repeating unit represented by Formula (PB-B1),
wherein an acid value of the polymer precursor is 1 mmol/g or less

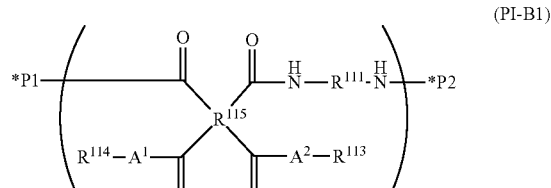

(PI-B1)

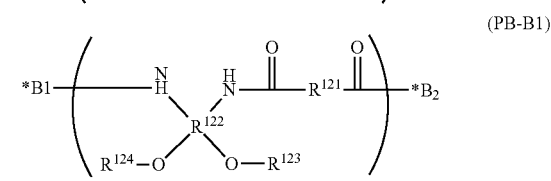

(PB-B1)

in Formulae (PI-B1) or (PB-B1), $A^1$ and $A^2$ each independently represent an oxygen atom or —NH—, $R^{111}$ represents a divalent organic group, $R^{115}$ represents a tetravalent organic group, $R^{113}$ and $R^{114}$ each independently represent a hydrogen atom or a monovalent organic group, and $*^{P1}$ and $*^{P2}$ each independently represent a bonding site to another structure, where at least one of $R^{113}$ or $R^{114}$ has a heterocyclic ring structure containing two or more nitrogen atoms and $*^{P1}$ is bonded to a structure containing a heterocyclic ring structure containing two or more nitrogen atoms, and $R^{121}$ represents a divalent organic group, $R^{122}$ represents a tetravalent organic group, $R^{123}$ and $R^{124}$ each independently represent a hydrogen atom or a monovalent organic group, and $*^{B1}$ and $*^{B2}$ each independently represent a bonding site to another structure, where at least one of $R^{124}$ or $R^{123}$ has a heterocyclic ring structure containing two or more nitrogen atoms and $*^{B2}$ is bonded to a structure containing a heterocyclic ring structure containing two or more nitrogen atoms.

13. The polymer precursor according to claim 12, wherein the structure containing a heterocyclic ring structure containing two or more nitrogen atoms is bonded to a repeating unit containing a terminal of the polymer precursor.

* * * * *